United States Patent
Trikha et al.

(10) Patent No.: US 11,300,849 B2
(45) Date of Patent: Apr. 12, 2022

(54) TINTABLE WINDOW SYSTEM COMPUTING PLATFORM USED FOR PERSONAL COMPUTING

(71) Applicant: View, Inc., Milpitas, CA (US)

(72) Inventors: Nitesh Trikha, Pleasanton, CA (US); Stephen Clark Brown, San Mateo, CA (US); Dhairya Shrivastava, Los Altos, CA (US); Robert T. Rozbicki, Los Gatos, CA (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 16/608,159

(22) PCT Filed: Apr. 25, 2018

(86) PCT No.: PCT/US2018/029406
§ 371 (c)(1),
(2) Date: Oct. 24, 2019

(87) PCT Pub. No.: WO2018/200702
PCT Pub. Date: Nov. 1, 2018

(65) Prior Publication Data
US 2020/0057421 A1    Feb. 20, 2020

Related U.S. Application Data

(60) Provisional application No. 62/607,618, filed on Dec. 19, 2017, provisional application No. 62/523,606, (Continued)

(51) Int. Cl.
*G01M 1/38* (2006.01)
*G02F 1/163* (2006.01)
(Continued)

(52) U.S. Cl.
CPC ........ *G02F 1/163* (2013.01); *B32B 17/10513* (2013.01); *E06B 9/24* (2013.01);
(Continued)

(58) Field of Classification Search
CPC .......... G02F 1/163; G02F 1/15; G02F 1/1347; G05B 15/02; G05B 19/0426;
(Continued)

(56) References Cited

U.S. PATENT DOCUMENTS

| | | | |
|---|---|---|---|
| 4,129,861 A | 12/1978 | Giglia | |
| 4,553,085 A | 11/1985 | Canzano | |

(Continued)

FOREIGN PATENT DOCUMENTS

| | | | |
|---|---|---|---|
| CN | 103649826 A | 3/2014 | |
| CN | 207409225 U | 5/2018 | |

(Continued)

OTHER PUBLICATIONS

U.S. Final Office Action dated Jan. 27, 2014 in U.S. Appl. No. 13/479,137.

(Continued)

*Primary Examiner* — Caleb E Henry
(74) *Attorney, Agent, or Firm* — Weaver Austin Villeneuve & Sampson LLP; Ryan Otis

(57) ABSTRACT

Resources of a system for controlling optically switchable windows may be used for a personal computing unit. The window system resources may include (i) a display associated with an optically switchable window, (ii) one or more processors of one or more controllers on a window network connected to a plurality of optically switchable windows in a building, wherein the one or more controllers are configured to vary tint states of the plurality of optically switchable windows in the building, (iii) memory of one or more controllers on the window network connected to the plural- (Continued)

ity of optically switchable windows in the building, and/or (iv) at least a part of the window network.

42 Claims, 26 Drawing Sheets

Related U.S. Application Data filed on Jun. 22, 2017, provisional application No. 62/507,704, filed on May 17, 2017, provisional application No. 62/506,514, filed on May 15, 2017, provisional application No. 62/490,457, filed on Apr. 26, 2017.

(51) Int. Cl.
| | |
|---|---|
| *G05B 19/042* | (2006.01) |
| *G06F 3/044* | (2006.01) |
| *G05B 15/02* | (2006.01) |
| *H01L 27/32* | (2006.01) |
| *G02F 1/15* | (2019.01) |
| *B32B 17/10* | (2006.01) |
| *E06B 9/24* | (2006.01) |
| *G02F 1/155* | (2006.01) |
| *G06F 3/041* | (2006.01) |
| *H01L 51/52* | (2006.01) |
| *H04K 3/00* | (2006.01) |

(52) U.S. Cl.
CPC .............. *G02F 1/15* (2013.01); *G02F 1/155* (2013.01); *G05B 15/02* (2013.01); *G05B 19/0426* (2013.01); *G06F 3/044* (2013.01); *G06F 3/0412* (2013.01); *H01L 27/3234* (2013.01); *H01L 51/52* (2013.01); *B32B 2419/00* (2013.01); *E06B 2009/2464* (2013.01); *G05B 2219/2628* (2013.01); *G05B 2219/2642* (2013.01); *H04K 3/45* (2013.01)

(58) Field of Classification Search
CPC .... G05B 2219/2628; G05B 2219/2642; H01L 27/3234; G06F 3/044; H04K 3/45; B32B 17/10513; B32B 17/10302; B32B 17/10055; B32B 17/10036; B32B 2419/00; B32B 2307/402; B32B 2250/02; B32B 27/365; B32B 2307/712; B32B 2255/20; B32B 2250/03; B32B 2307/732; B32B 2457/00; B32B 27/06; B32B 27/08; B32B 7/05; B32B 2457/202; B32B 27/34; B32B 3/08; B32B 27/302; B32B 7/022; B32B 7/12; B32B 2307/546; B32B 2307/414; B32B 2307/102; B32B 2307/412; B32B 2307/518; B32B 2307/754; B32B 2307/304; B32B 2307/206; B32B 2255/10; B32B 2255/28; B32B 2307/516; B32B 27/36
See application file for complete search history.

(56) References Cited

U.S. PATENT DOCUMENTS

| | | | |
|---|---|---|---|
| 5,384,653 A | 1/1995 | Benson et al. | |
| 5,416,617 A | 5/1995 | Loiseaux et al. | |
| 5,477,152 A | 12/1995 | Hayhurst | |
| 5,579,149 A | 11/1996 | Moret et al. | |
| 5,754,329 A | 5/1998 | Coleman | |
| 5,847,858 A | 12/1998 | Krings et al. | |
| 6,039,390 A | 3/2000 | Agrawal et al. | |
| 6,055,089 A | 4/2000 | Schulz et al. | |
| 6,262,831 B1 | 7/2001 | Bauer et al. | |
| 6,344,748 B1 | 2/2002 | Gannon | |
| 6,407,847 B1 | 6/2002 | Poll et al. | |
| 6,567,708 B1 | 5/2003 | Bechtel et al. | |
| 6,588,250 B2 | 7/2003 | Schell | |
| 6,707,590 B1 | 3/2004 | Bartsch | |
| 6,795,226 B2 | 9/2004 | Agrawal et al. | |
| 6,897,936 B1 | 5/2005 | Li et al. | |
| 6,965,813 B2 | 11/2005 | Granqvist et al. | |
| 7,133,181 B2 | 11/2006 | Greer | |
| 7,347,608 B2 | 3/2008 | Emde | |
| 7,554,437 B2 | 6/2009 | Axelsen | |
| 7,684,105 B2 | 3/2010 | Lamontagne et al. | |
| 7,800,812 B2 | 9/2010 | Moskowitz | |
| 7,941,245 B1 | 5/2011 | Popat | |
| 8,149,756 B2 | 4/2012 | Hottinen | |
| 8,213,074 B1 | 7/2012 | Shrivastava et al. | |
| 8,254,013 B2 | 8/2012 | Mehtani et al. | |
| 8,363,178 B2* | 1/2013 | Chung .................. G09F 13/04 |
| | | | 349/58 |
| 8,686,984 B2 | 4/2014 | Hummel et al. | |
| 8,705,162 B2 | 4/2014 | Brown et al. | |
| 8,843,238 B2 | 9/2014 | Wenzel et al. | |
| 8,976,440 B2 | 3/2015 | Berland et al. | |
| 9,081,246 B2 | 7/2015 | Rozbicki | |
| 9,128,346 B2 | 9/2015 | Shrivastava et al. | |
| 9,170,008 B2 | 10/2015 | Reul et al. | |
| 9,300,581 B1 | 3/2016 | Hui et al. | |
| 9,341,912 B2* | 5/2016 | Shrivastava ............ G09F 23/02 |
| 9,412,290 B2 | 8/2016 | Jack et al. | |
| 9,442,338 B2 | 9/2016 | Uhm et al. | |
| 9,442,341 B2 | 9/2016 | Shrivastava et al. | |
| 9,454,055 B2 | 9/2016 | Brown et al. | |
| 9,470,947 B2 | 10/2016 | Nagel et al. | |
| 9,551,913 B2 | 1/2017 | Kim et al. | |
| 9,677,327 B2 | 6/2017 | Nagel et al. | |
| 9,690,174 B2 | 6/2017 | Wang | |
| 9,709,869 B2 | 7/2017 | Baumann et al. | |
| 9,740,074 B2 | 8/2017 | Agrawal et al. | |
| 9,778,533 B2 | 10/2017 | Bertolini | |
| 9,791,701 B2 | 10/2017 | Ato et al. | |
| 9,898,912 B1 | 2/2018 | Jordan, II et al. | |
| 9,917,867 B2 | 3/2018 | Sallam | |
| 9,946,138 B2 | 4/2018 | Shrivastava et al. | |
| 9,965,865 B2 | 5/2018 | Agrawal et al. | |
| 10,001,691 B2 | 6/2018 | Shrivastava et al. | |
| 10,048,561 B2* | 8/2018 | Brown .................. G02F 1/163 |
| 10,049,402 B1 | 8/2018 | Miranda | |
| 10,067,344 B2 | 9/2018 | Kilcher et al. | |
| 10,137,764 B2 | 11/2018 | Driscoll et al. | |
| 10,191,318 B2* | 1/2019 | Park .................. G02F 1/133377 |
| 10,268,098 B2 | 4/2019 | Shrivastava et al. | |
| 10,288,971 B2* | 5/2019 | Phillips .................. G02F 1/163 |
| 10,303,035 B2 | 5/2019 | Brown et al. | |
| 10,379,265 B2 | 8/2019 | Brown | |
| 10,387,221 B2 | 8/2019 | Shrivastava et al. | |
| 10,394,070 B2 | 8/2019 | Park et al. | |
| 10,400,509 B2* | 9/2019 | Fasi .................. E05F 15/70 |
| 10,409,652 B2 | 9/2019 | Shrivastava et al. | |
| 10,416,520 B2 | 9/2019 | Jovanovic | |
| 10,460,636 B2 | 10/2019 | Salmimaa et al. | |
| 10,481,459 B2 | 11/2019 | Shrivastava et al. | |
| 10,488,837 B2 | 11/2019 | Cirino | |
| 10,514,963 B2 | 12/2019 | Shrivastava et al. | |
| 10,591,798 B1* | 3/2020 | Nagel .................. G05B 15/02 |
| 10,699,604 B2 | 6/2020 | Hicks et al. | |
| 10,917,259 B1 | 2/2021 | Chein et al. | |
| 10,921,675 B2 | 2/2021 | Barnum et al. | |
| 10,923,226 B2 | 2/2021 | Macary et al. | |
| 10,954,677 B1 | 3/2021 | Scanlin | |
| 2002/0027504 A1 | 3/2002 | Davis et al. | |
| 2002/0149829 A1 | 10/2002 | Mochizuka et al. | |
| 2003/0169574 A1 | 9/2003 | Maruyama et al. | |
| 2003/0191546 A1 | 10/2003 | Bechtel et al. | |
| 2003/0227663 A1 | 12/2003 | Agrawal et al. | |
| 2004/0215520 A1 | 10/2004 | Butler et al. | |
| 2005/0270620 A1 | 12/2005 | Bauer et al. | |
| 2005/0270621 A1 | 12/2005 | Bauer et al. | |
| 2006/0018000 A1 | 1/2006 | Greer | |
| 2006/0107616 A1 | 5/2006 | Rath et al. | |

(56) References Cited

U.S. PATENT DOCUMENTS

| | | |
|---|---|---|
| 2006/0277202 A1 | 12/2006 | Dempsey |
| 2006/0279527 A1 | 12/2006 | Zehner et al. |
| 2007/0053053 A1 | 3/2007 | Moskowitz |
| 2007/0067048 A1 | 3/2007 | Bechtel et al. |
| 2007/0188676 A1 | 8/2007 | Choi et al. |
| 2007/0285759 A1 | 12/2007 | Ash et al. |
| 2008/0043316 A2 | 2/2008 | Moskowitz |
| 2008/0186562 A2 | 8/2008 | Moskowitz |
| 2008/0198584 A1 | 8/2008 | Fouraux et al. |
| 2008/0211682 A1 | 9/2008 | Hyland et al. |
| 2009/0271042 A1 | 10/2009 | Voysey |
| 2009/0323160 A1 | 12/2009 | Egerton et al. |
| 2010/0039410 A1 | 2/2010 | Becker et al. |
| 2010/0188057 A1 | 7/2010 | Tarng |
| 2010/0228854 A1 | 9/2010 | Morrison et al. |
| 2010/0243427 A1 | 9/2010 | Kozlowski et al. |
| 2010/0245973 A1 | 9/2010 | Wang et al. |
| 2010/0274366 A1 | 10/2010 | Fata et al. |
| 2010/0315693 A1 | 12/2010 | Lam et al. |
| 2011/0071685 A1 | 3/2011 | Huneycutt et al. |
| 2011/0097081 A1 | 4/2011 | Gupta et al. |
| 2011/0148218 A1 | 6/2011 | Rozbicki |
| 2011/0164317 A1 | 7/2011 | Verghol et al. |
| 2012/0026573 A1 | 2/2012 | Collins et al. |
| 2012/0033287 A1 | 2/2012 | Friedman et al. |
| 2012/0062975 A1 | 3/2012 | Mehtani et al. |
| 2012/0086363 A1 | 4/2012 | Golding et al. |
| 2012/0112883 A1 | 5/2012 | Wallace et al. |
| 2012/0140492 A1 | 6/2012 | Alvarez |
| 2012/0188627 A1 | 7/2012 | Chen et al. |
| 2012/0190386 A1 | 7/2012 | Anderson |
| 2012/0194895 A1 | 8/2012 | Podbelski et al. |
| 2012/0235493 A1 | 9/2012 | Kiuchi et al. |
| 2012/0239209 A1 | 9/2012 | Brown et al. |
| 2012/0259583 A1 | 10/2012 | Noboa et al. |
| 2012/0275008 A1 | 11/2012 | Pradhan et al. |
| 2012/0293855 A1 | 11/2012 | Shrivastava et al. |
| 2013/0060357 A1 | 3/2013 | Li et al. |
| 2013/0085614 A1 | 4/2013 | Wenzel et al. |
| 2013/0085615 A1 | 4/2013 | Barker |
| 2013/0085616 A1 | 4/2013 | Wenzel et al. |
| 2013/0131869 A1 | 5/2013 | Majewski et al. |
| 2013/0157493 A1 | 6/2013 | Brown |
| 2013/0196600 A1 | 8/2013 | Capers et al. |
| 2013/0241299 A1 | 9/2013 | Snyker et al. |
| 2013/0242370 A1* | 9/2013 | Wang .................. G02F 1/1533 359/275 |
| 2013/0271812 A1 | 10/2013 | Brown et al. |
| 2013/0271813 A1 | 10/2013 | Brown |
| 2013/0271814 A1* | 10/2013 | Brown .................. G02F 1/163 359/275 |
| 2013/0278989 A1* | 10/2013 | Lam .................. G02F 1/163 359/275 |
| 2014/0098007 A1* | 4/2014 | Delpier .................. G06F 1/1637 345/2.1 |
| 2014/0156097 A1 | 6/2014 | Nesler et al. |
| 2014/0160550 A1 | 6/2014 | Brown et al. |
| 2014/0170863 A1 | 6/2014 | Brown |
| 2014/0236323 A1* | 8/2014 | Brown .................. E06B 9/24 700/90 |
| 2014/0300945 A1* | 10/2014 | Parker .................. E06B 7/28 359/275 |
| 2014/0303788 A1 | 10/2014 | Sanders et al. |
| 2014/0330538 A1 | 11/2014 | Conklin et al. |
| 2014/0347190 A1 | 11/2014 | Grimm |
| 2014/0349497 A1 | 11/2014 | Brown et al. |
| 2014/0368899 A1 | 12/2014 | Greer |
| 2014/0375454 A1 | 12/2014 | Konrad et al. |
| 2015/0023661 A1 | 1/2015 | Borkenhagen et al. |
| 2015/0092259 A1* | 4/2015 | Greer .................. G02F 1/163 359/275 |
| 2015/0116811 A1 | 4/2015 | Shrivastava et al. |
| 2015/0120297 A1 | 4/2015 | Meruva |
| 2015/0003822 A1 | 6/2015 | Fukada et al. |
| 2015/0160525 A1 | 6/2015 | Shi |
| 2015/0338713 A1 | 11/2015 | Brown |
| 2015/0368967 A1* | 12/2015 | Lundy .................. E06B 9/68 160/5 |
| 2015/0378230 A1 | 12/2015 | Gudmunson et al. |
| 2015/0378231 A1 | 12/2015 | Greer et al. |
| 2016/0054633 A1* | 2/2016 | Brown .................. G01N 21/59 359/275 |
| 2016/0070151 A1 | 3/2016 | Shrivastava et al. |
| 2016/0109778 A1 | 4/2016 | Shrivastava et al. |
| 2016/0154290 A1 | 6/2016 | Brown et al. |
| 2016/0202589 A1 | 7/2016 | Nagel et al. |
| 2016/0203403 A1* | 7/2016 | Nagel .................. H04L 51/32 706/61 |
| 2016/0225832 A1 | 8/2016 | Kwon et al. |
| 2016/0372083 A1* | 12/2016 | Taite .................. G06F 1/1652 |
| 2017/0044057 A1 | 2/2017 | Rozbicki et al. |
| 2017/0052289 A1* | 2/2017 | Boissevain .................. H05B 47/11 |
| 2017/0075323 A1 | 3/2017 | Shrivastava et al. |
| 2017/0082903 A1 | 3/2017 | Vigano et al. |
| 2017/0097259 A1 | 4/2017 | Brown et al. |
| 2017/0139301 A1 | 5/2017 | Messere et al. |
| 2017/0146884 A1 | 5/2017 | Vigano et al. |
| 2017/0197494 A1 | 7/2017 | Li |
| 2017/0200424 A1 | 7/2017 | Xu et al. |
| 2017/0212400 A1 | 7/2017 | Shrivastava et al. |
| 2017/0234067 A1* | 8/2017 | Fasi .................. G05B 13/041 700/275 |
| 2017/0248564 A1 | 8/2017 | Miyajima |
| 2017/0253801 A1 | 9/2017 | Bae et al. |
| 2017/0277342 A1 | 9/2017 | Hong et al. |
| 2017/0279930 A1 | 9/2017 | Zhang |
| 2017/0285432 A1 | 10/2017 | Shrivastava et al. |
| 2017/0285433 A1 | 10/2017 | Shrivastava et al. |
| 2017/0347129 A1 | 11/2017 | Levi et al. |
| 2017/0364395 A1 | 12/2017 | Shrivastava et al. |
| 2018/0090992 A1 | 3/2018 | Shrivastava et al. |
| 2018/0129172 A1* | 5/2018 | Shrivastava .................. G02F 1/163 |
| 2018/0144712 A1 | 5/2018 | Threlkel et al. |
| 2018/0157147 A1* | 6/2018 | Brown .................. G02F 1/13318 |
| 2018/0188627 A1 | 7/2018 | Vigano et al. |
| 2018/0189117 A1 | 7/2018 | Shrivastava et al. |
| 2018/0259804 A1 | 9/2018 | Bae et al. |
| 2018/0267380 A1 | 9/2018 | Shrivastava et al. |
| 2018/0270542 A1* | 9/2018 | Ramalingam .................. G02B 27/0101 |
| 2018/0284555 A1* | 10/2018 | Klawuhn .................. E06B 9/24 |
| 2019/0011798 A9 | 1/2019 | Brown et al. |
| 2019/0025661 A9 | 1/2019 | Brown et al. |
| 2019/0155122 A1 | 5/2019 | Brown et al. |
| 2019/0235451 A1 | 8/2019 | Shrivastava et al. |
| 2019/0271895 A1 | 9/2019 | Shrivastava et al. |
| 2019/0331978 A1 | 10/2019 | Shrivastava et al. |
| 2019/0347141 A1 | 11/2019 | Shrivastava et al. |
| 2019/0353972 A1 | 11/2019 | Shrivastava et al. |
| 2019/0356508 A1* | 11/2019 | Trikha .................. E06B 7/28 |
| 2019/0384652 A1 | 12/2019 | Shrivastava et al. |
| 2020/0057421 A1* | 2/2020 | Trikha .................. G02F 1/163 |
| 2020/0103841 A1 | 4/2020 | Pillai et al. |
| 2020/0150508 A1* | 5/2020 | Patterson .................. E06B 9/24 |
| 2020/0150602 A1 | 5/2020 | Trikha et al. |
| 2020/0260556 A1* | 8/2020 | Rozbicki .................. H05B 47/115 |
| 2021/0041759 A1* | 2/2021 | Trikha .................. G02F 1/163 |
| 2021/0063836 A1 | 3/2021 | Patterson et al. |

FOREIGN PATENT DOCUMENTS

| | | |
|---|---|---|
| EP | 2357544 | 8/2011 |
| EP | 2648086 A2 | 10/2013 |
| EP | 2764998 A1 | 8/2014 |
| EP | 2837205 A1 | 2/2015 |
| EP | 3015915 A1 | 5/2016 |
| EP | 2837205 B1 | 2/2017 |
| EP | 3293941 A1 | 3/2018 |
| EP | 3352053 A1 | 7/2018 |
| JP | H0611477 A | 1/1994 |
| JP | H06308073 A | 11/1994 |
| JP | H10-215492 A | 8/1998 |
| JP | 2003-284160 A | 10/2003 |

(56) References Cited

FOREIGN PATENT DOCUMENTS

| | | | |
|---|---|---|---|
| JP | 2007-156909 A | 6/2007 | |
| JP | 2008-293024 A | 12/2008 | |
| KR | 10-2011-0003698 A | 1/2011 | |
| KR | 10-2012-0045915 | 5/2012 | |
| KR | 10-2014-0004175 A | 1/2014 | |
| KR | 10-1346862 B | 1/2014 | |
| KR | 10-1471443 B1 | 12/2014 | |
| KR | 10-2015-0060051 A | 6/2015 | |
| KR | 10-2016-0012564 A | 2/2016 | |
| KR | 10-2016-0105005 A | 9/2016 | |
| KR | 20170021692 A | 2/2017 | |
| KR | 10-2017-0022132 A | 3/2017 | |
| KR | 10-1799323 B1 | 11/2017 | |
| KR | 20180012615 A | 2/2018 | |
| RU | 104808 U1 | 5/2011 | |
| RU | 2012107324 A | 9/2013 | |
| TW | 200532346 A | 10/2005 | |
| WO | WO-02054086 A1 | 7/2002 | |
| WO | WO2012/079159 | 6/2012 | |
| WO | WO2013/155467 A1 | 10/2013 | |
| WO | WO2013/159778 A1 | 10/2013 | |
| WO | WO2013/177575 A1 | 11/2013 | |
| WO | WO2014/082092 | 5/2014 | |
| WO | WO2014/121809 | 8/2014 | |
| WO | WO2014/130471 | 8/2014 | |
| WO | WO2015/051262 A1 | 4/2015 | |
| WO | WO2015/134789 | 9/2015 | |
| WO | WO2016/004109 | 1/2016 | |
| WO | WO2016/085964 | 6/2016 | |
| WO | WO2016/094139 A1 | 6/2016 | |
| WO | WO2016/094445 | 6/2016 | |
| WO | WO-2016086017 A1 | 6/2016 | |
| WO | WO2016/183059 A1 | 11/2016 | |
| WO | WO2017/007841 A1 | 1/2017 | |
| WO | WO2017/035650 A1 | 3/2017 | |
| WO | WO2017/062592 | 4/2017 | |
| WO | WO2017/075059 | 5/2017 | |
| WO | WO2017/137904 A1 | 8/2017 | |
| WO | WO2017/155833 | 9/2017 | |
| WO | WO2017/180734 A1 | 10/2017 | |
| WO | WO2017/189618 A1 | 11/2017 | |
| WO | WO2017/192881 | 11/2017 | |
| WO | WO2018/063919 | 4/2018 | |
| WO | WO2018/098089 | 5/2018 | |
| WO | WO2018/102103 | 6/2018 | |
| WO | WO2018/200702 A1 | 11/2018 | |
| WO | WO2018/200740 A1 | 11/2018 | |
| WO | WO2018/200752 A1 | 11/2018 | |
| WO | WO2019/040809 A1 | 2/2019 | |
| WO | WO2019/203931 | 10/2019 | |
| WO | WO-2021154915 A1 | 8/2021 | |

OTHER PUBLICATIONS

U.S. Final Office Action dated Feb. 26, 2015 in U.S. Appl. No. 13/479,137.
U.S. Notice of Allowance dated May 14, 2015 in U.S. Appl. No. 13/479,137.
U.S. Notice of Allowance (supplemental) dated Jun. 12, 2015 in U.S. Appl. No. 13/479,137.
U.S. Office Action dated Sep. 23, 2013 in U.S. Appl. No. 13/479,137.
U.S. Office Action dated Jul. 3, 2014 in U.S. Appl. No. 13/479,137.
U.S. Final Office Action dated Sep. 19, 2016 in U.S. Appl. No. 14/887,178.
U.S. Final Office Action dated Mar. 17, 2017 in U.S. Appl. No. 14/887,178.
U.S. Notice of Allowance dated Mar. 9, 2018 in U.S. Appl. No. 14/887,178.
U.S. Office Action dated Mar. 25, 2016 in U.S. Appl. No. 14/887,178.
U.S. Office Action dated Oct. 23, 2017 in U.S. Appl. No. 14/887,178.
U.S. Notice of Allowance dated Dec. 13, 2018 in U.S. Appl. No. 15/978,029.
U.S. Office Action dated Jul. 24, 2018 in U.S. Appl. No. 15/978,029.
U.S. Office Action dated Aug. 22, 2019 in U.S. Appl. No. 16/298,776.
U.S. Office Action dated Aug. 21, 2019 in U.S. Appl. No. 16/508,099.
U.S. Final Office Action dated Mar. 15, 2018 in U.S. Appl. No. 14/951,410.
U.S. Notice of Allowance dated Oct. 22, 2018 in U.S. Appl. No. 14/951,410.
U.S. Office Action dated Sep. 11, 2017 in U.S. Appl. No. 14/951,410.
U.S. Office Action dated Jul. 25, 2019 in U.S. Appl. No. 16/253,971.
U.S. Notice of Allowance dated Nov. 28, 2018 in U.S. Appl. No. 15/123,069.
U.S. Notice of Allowance dated Jul. 17, 2019 in U.S. Appl. No. 15/123,069.
U.S. Office Action dated Apr. 27, 2018 in U.S. Appl. No. 15/123,069.
Preliminary Amendment dated Jan. 18, 2017 in U.S. Appl. No. 15/123,069.
U.S. Office Action dated Feb. 7, 2019 in U.S. Appl. No. 15/623,237.
U.S. Final Office Action dated Jul. 3, 2019 in U.S. Appl. No. 15/623,237.
U.S. Office Action dated Feb. 7, 2019 in U.S. Appl. No. 15/691,468.
U.S. Final Office Action dated Jul. 2, 2019 in U.S. Appl. No. 15/691,468.
U.S. Notice of Allowance dated Mar. 20, 2019 in U.S. Appl. No. 15/320,725.
U.S. Notice of Allowance (corrected) dated Apr. 18, 2019 in U.S. Appl. No. 15/320,725.
U.S. Office Action dated Sep. 4, 2018 in U.S. Appl. No. 15/320,725.
U.S. Notice of Allowance dated Jul. 17, 2019 in U.S. Appl. No. 15/320,725.
U.S. Final Office Action dated Jan. 31, 2019 in U.S. Appl. No. 15/534,175.
U.S. Notice of Allowance dated Apr. 17, 2019 in U.S. Appl. No. 15/534,175.
U.S. Notice of Allowance dated Jul. 25, 2019 in U.S. Appl. No. 15/534,175.
U.S. Office Action dated Jul. 6, 2018 in U.S. Appl. No. 15/534,175.
U.S. Office Action dated Feb. 4, 2019 in U.S. Appl. No. 15/623,235.
U.S. Notice of Allowance dated May 14, 2019 in U.S. Appl. No. 15/623,235.
U.S. Notice of Allowance dated Dec. 14, 2018 in U.S. Appl. No. 15/910,936.
U.S. Notice of Allowance dated Apr. 17, 2019 in U.S. Appl. No. 15/910,936.
U.S. Office Action dated Aug. 7, 2018 in U.S. Appl. No. 15/910,936.
Taiwanese Office Action dated Dec. 12, 2018 in TW Application No. 10712915.
CN Office Action dated Aug. 28, 2018 in CN Application No. 201580070776.3.
CN Office Action dated Mar. 19, 2019 in CN Application No. 201580070776.3.
CN Office Action dated Oct. 9, 2019 in CN Application No. 201580070776.3.
EP Extended Search Report dated Nov. 8, 2018 in EP Application No. 15863112.7.
EP Extended Search Report dated Nov. 28, 2019 in EP Application No. 19188907.0.
International Preliminary Report on Patentability dated Jun. 8, 2017 in PCT/US2015/062480.
International Search Report and Written Opinion dated Feb. 15, 2016 in PCT/US2015/062480.
International Search Report and Written Opinion (ISA/KR) dated Jun. 14, 2019 in PCT/US2019/019455.
CN Office Action dated Feb. 2, 2019 in CN Application No. 201580015979.2.
CN Office Action dated Aug. 16, 2019 in CN Application No. 201580015979.2.
EP Extended Search Report dated Jun. 19, 2017 in EP Application No. 15758538.1.
EP Office Action dated Aug. 21, 2018 in EP Application No. 15758538.1.
RU Office Action dated Sep. 24, 2018 in RU Application No. 2016139012.

(56) References Cited

OTHER PUBLICATIONS

International Preliminary Report on Patentability dated Sep. 15, 2016 in PCT/US2015/019031.
International Search Report and Written Opinion dated May 29, 2015 in Application No. PCT/US2015/019031.
EP Extended Search Report dated Feb. 15, 2018 in EP Application No. 15814233.1.
EP Examination Report dated Mar. 4, 2019 in EP Application No. 15814233.1.
International Preliminary Report on Patentability dated Jan. 12, 2017 in PCT Application No. PCT/US15/38667.
International Search Report and Written Opinion dated Oct. 16, 2015 in PCT Application No. PCT/US15/38667.
EP Extended Search Report dated Jun. 5, 2018 in EP Application No. 15868003.3.
JP Office Action dated Nov. 19, 2019 in JP Application No. 2017-549175.
International Preliminary Report on Patentability dated Jun. 22, 2017 in PCT Application No. PCT/US15/64555.
International Search Report and Written Opinion dated Oct. 16, 2015 in PCT Application No. PCT/US15/64555.
Russian Office Action dated Jul. 10, 20019 in RU Application No. 2017123902.
International Preliminary Report on Patentability dated Apr. 18, 2019 in PCT Application No. PCT/US17/54120.
International Search Report and Written Opinion (ISA/KR) dated Jan. 9, 2018 in PCT Application No. PCT/US17/54120.
International Search Report and Written Opinion dated Nov. 16, 2018 in PCT Application No. PCT/US2018/029460.
International Search Report and Written Opinion dated Oct. 15, 2018 in PCT Application No. PCT/US2018/029406.
International Preliminary Report on Patentability dated Nov. 7, 2019 in PCT Application No. PCT/US2018/029460.
International Preliminary Report on Patentability dated Nov. 7, 2019 in PCT Application No. PCT/US2018/029406.
Taiwanese Office Action dated May 13, 2019 in TW Application No. 104139217.
APC by Schneider Electric, Smart-UPS 120V Product Brochure, 2013, 8 pp.
National Aeronautics & Space Administration, "Cloud Remote Sensing and Modeling," (unated) [http://atmospheres.gsfc.nasa.gov/climate/index.php?section=134].
Kipp & Zonen, "Solar Radiation" (undated) [http://www.kippzonen.com/Knowledge-Center/Theoretical-info/Solar-Radiation].
Duchon, Claude E. et al., "Estimating Cloud Type from Pyranometer Observations," Journal of applied Meteorology, vol. 38, Jan. 1999, pp. 132-141.
"SageGlass Unplugged™—wireless dynamic glass", 2014, 2 pages.
"Ossia Wireless Charging", screenshot and picture of Cota device, accessed Apr. 20, 2015, 1 page.
"SageGlass Mobile App" screenshot, accessed Aug. 28, 2015, 1 page.
"Sage Product Highlights" screenshot, accessed Aug. 28, 2015, 1 page.
"SageGlass Unplugged" screenshot, accessed Aug. 28, 2015, 1 page.
U.S. Appl. No. 16/338,403, filed Mar. 29, 2019, Shrivastava et al.
U.S. Appl. No. 16/655,032, filed Oct. 16, 2019, Shrivastava et al.
U.S. Appl. No. 16/664,089, filed Oct. 25, 2019, Patterson et al.
International Search Report and Written Opinion dated Jul. 11, 2019 in PCT Application No. PCT/US2019/030467.
U.S. Preliminary Amendment dated Mar. 31, 2020 in U.S. Appl. No. 16/608,157.
PCT International Search Report and Written Opinion (ISA:KIPO) dated Aug. 13, 2018 for PCT Application No. PCT/US2018/029476.
International Preliminary Report on Patentability dated Nov. 7, 2019 in PCT Application No. PCT/US2018/029476.
Science News, "New technique could help spot snooping drones", Jan. 23, 2018, 2 pages [https://www.sciencenews.org/article/new-technique-could-help-spot-snooping-drones] retrieved Jan. 24, 2018.
U.S. Appl. No. 63/085,254, filed Sep. 30, 2020, Young et al.
U.S. Appl. No. 63/057,120, filed Jul. 27, 2020, Gupta et al.
U.S. Appl. No. 63/078,805, filed Sep. 15, 2020, Gupta et al.
PCT Application No. PCT/US2020/053641 filed Sep. 30, 2020.
European Extended Search Report dated Nov. 12, 2020 in EP Application No. 18791669.7.
European Extended Search Report dated Nov. 11, 2020 in EP Application No. 18791268.8.
"Halio Rooftop Sensor Kit (Model SR500)," Product Data Sheet, Kinestral Technologies, 2020, 4 pp.
"Remote Radio Head for CPRI and 4G, 5G & LTE Networks," CableFree by Wireless Excellence Limited, 2020, 8 pp., <<https://www.cablefree.net/wirelesstechnology/4glte/remote-radio-head/>> Accessed May 19, 2021.
Rajiv, "How does Cloud Radio Access Network (C-RAN) works," RF Page, Apr. 16, 2018, 5 pp. <<https://www.rfpage.com/how-cloud-radio-access-network-works/>> Accessed May 19, 2021.
U.S. Appl. No. 63/115,842, filed Nov. 19, 2020, Martinson et al.
U.S. Appl. No. 63/135,021, filed Jan. 8, 2021, Martinson et al.
U.S. Appl. No. 63/154,352, filed Feb. 26, 2021, Martinson et al.
U.S. Appl. No. 63/170,245, filed Apr. 2, 2021, Martinson et al.
U.S. Appl. No. 63/181,648, filed Apr. 29, 2021, Makker et al.
U.S. Appl. No. 63/115,886, filed Nov. 19, 2020, Gupta et al.
U.S. Appl. No. 63/159,814, filed Mar. 11, 2021, Gupta et al.
U.S. Appl. No. 63/163,305, filed Mar. 19, 2021, Trikha et al.
U.S. Appl. No. 63/171,871, filed Apr. 7, 2021, Gomez-Martinez et al.
U.S. Appl. No. 63/187,632, filed May 12, 2021, Hur et al.
PCT Application No. PCT/US2021/015378 filed Jan. 28, 2021.
PCT Application No. PCT/US2021/023433 filed Mar. 23, 2021.
IN Office action dated Sep. 28, 2021, in IN Application No. IN201937045203.
International Search Report and Written Opinion dated Aug. 17, 2021 in PCT Application No. PCT/US2021/023433.
International Search Report and Written Opinion dated Jun. 23, 2021 in PCT Application No. PCT/US2021/015378.
International Search Report and Written Opinion dated Mar. 15, 2021 in PCT Application No. PCT/US2020/053641.
PCT Application No. PCT/US2021/052587 filed Sep. 29, 2021.
PCT Application No. PCT/US2021/052595 filed Sep. 29, 2021.
PCT Application No. PCT/US2021/052597 filed Sep. 29, 2021.
U.S. Appl. No. 63/209,362, Inventors Gomez-Martinez et al., filed Jun. 10, 2021.
U.S. Appl. No. 63/211,400, inventors Martinson et al., filed Jun. 16, 2021.
U.S. Appl. No. 63/226,127, inventors Lee et al., filed Jul. 21, 2021.
U.S. Appl. No. 63/212,483, inventors Martinson et al., filed Jun. 18, 2021.
U.S. Appl. No. 63/246,770, Inventors Martinson et al., filed Sep. 21, 2021.
U.S. Appl. No. 63/247,684, Inventors Martinson et al., filed Sep. 23, 2021.
U.S. Appl. No. 63/214,741, inventors Marquez et al., filed Jun. 24, 2021.
IN Office Action dated Jan. 24, 2022 in Application No. IN201937044699.

* cited by examiner

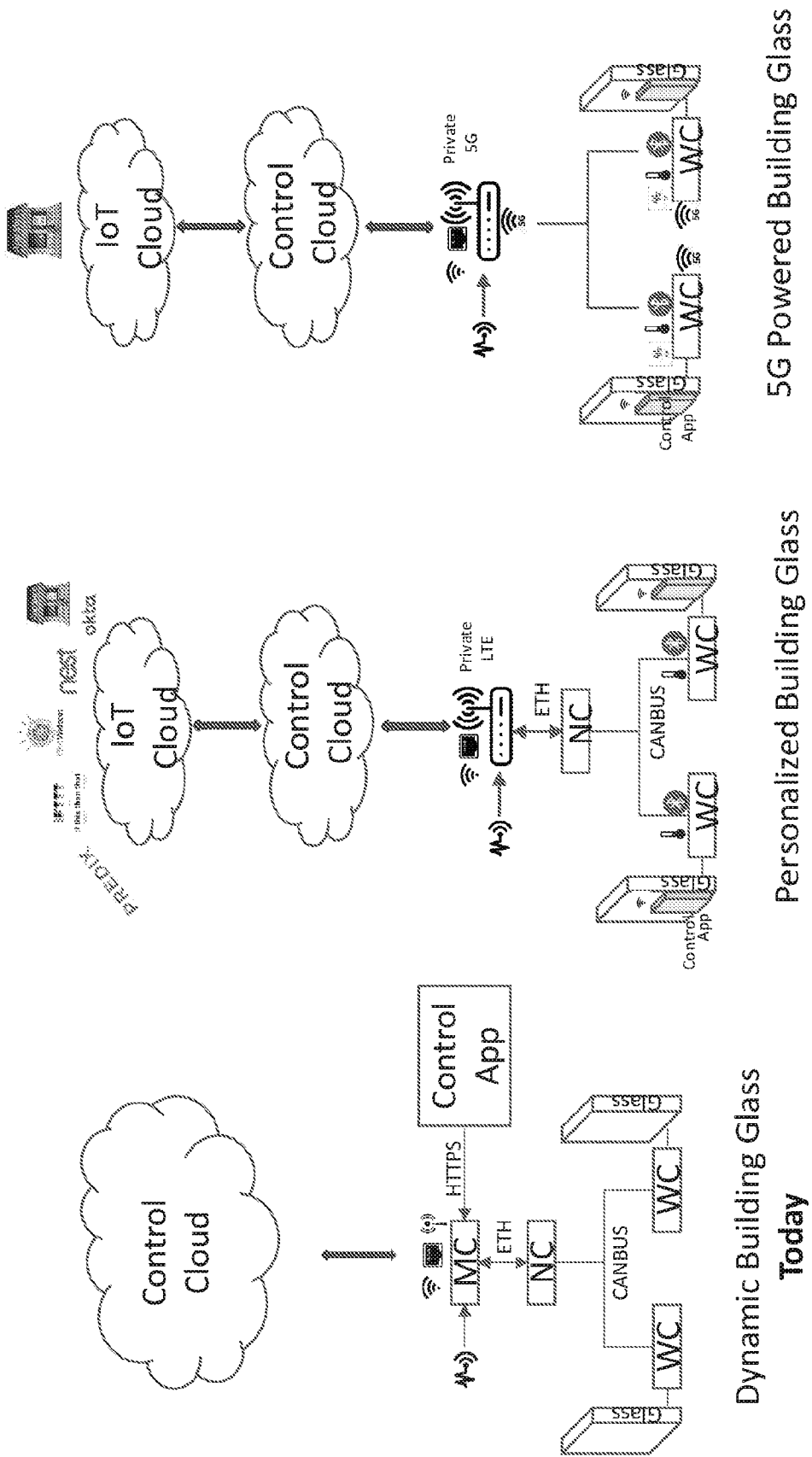
FIGURE 11c 5G Powered Building Glass
FIGURE 11b Personalized Building Glass
FIGURE 11a Dynamic Building Glass Today Sensor Glass Building Security Glass Display Building Glass

| Function | Outer Lite | | Inner Lite | | Window Controller | Mullion [Window Frame] | Implementation |
| --- | --- | --- | --- | --- | --- | --- | --- |
| | S1 | S2 | S3 | S4 | | | |
| Anti Jammer | GP* | EC | GP | GP* | | RF gasket from the frame to the IGU to complete the shield | RF blocking transparent film deposited on S1, S3, or S4 of an IGU. One embodiment is S3. Another embodiment is a film on both S3 and S4 (two films for higher performance). |
| Wi-Fi Repeater | | EC | Antenna | | X | | Omni directional antenna (for interior and exterior coverage) patterned on S3, with Wi-Fi signal processing on window controller. |
| | | EC | Antenna | GP | X | | Exterior radiating antenna patterned on S3, with Wi-Fi signal processing on window controller. |
| | | EC | GP | Antenna | X | | Interior radiating antenna patterned on S4, with Wi-Fi signal processing on window controller. |
| | Antenna | EC | GP | Antenna | X | | Selective exterior and interior radiating antennas patterned on S1 and S4, with Wi-Fi signal processing on window controller. |
| | | EC | | | X | Antenna | Omni directional Wi-Fi embedded antenna(s) on mullions' inside surface, Wi-Fi signal processing on window controller. |
| | Antenna | EC | | | X | | Omni directional embedded antenna on S1 wired through the pigtail wire, Wi-Fi signal processing on Window Controller. |

FIGURE 19

TINTABLE WINDOW SYSTEM COMPUTING PLATFORM USED FOR PERSONAL COMPUTING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance.

Electrochromic materials may be incorporated into, for example, windows for home, commercial and other uses as thin film coatings on the window glass. The color, transmittance, absorbance, and/or reflectance of such windows may be changed by inducing a change in the electrochromic material, for example, electrochromic windows are windows that can be darkened or lightened electronically. A small voltage applied to an electrochromic device of the window will cause them to darken; reversing the voltage polarity causes them to lighten. This capability allows control of the amount of light that passes through the windows, and presents an opportunity for electrochromic windows to be used as energy-saving devices.

While electrochromic devices, and particularly electrochromic windows, are finding acceptance in building designs and construction, they have not begun to realize their full commercial potential.

SUMMARY

Certain aspects of this disclosure pertain to personal computing units that may be characterized by the following elements: (a) a window system resource; and (b) logic configured to allocate and control the window system resource in the personal computing unit made available to a user in the building. In some embodiments, the window system resource is (i) a display associated with an optically switchable window, (ii) one or more processors of one or more controllers on a window network connected to a plurality of optically switchable windows in a building, wherein the one or more controllers are configured to vary tint states of the plurality of optically switchable windows in the building, (iii) memory of one or more controllers on the window network connected to the plurality of optically switchable windows in the building, or (iv) at least a part of the window network. A personal computing unit may employ combinations of these resources. The window system resource may be connected to other window systems resources by the window network.

In certain embodiments, the one or more controllers include at least one window controller. In certain embodiments, the personal computing unit additionally includes a touch sensitive interface.

In certain embodiments, the at least two window system resources include: the display associated with an optically switchable window and the one or more processors of the one or more controllers on the window network. In such embodiments, the at least two window system resources may additionally include: the memory of one or more controllers on the window network. Further, the at least two window system resources may additionally include: the at least part of the window network.

In certain embodiments, the logic is further configured to allocate and control window system resources in the personal computing unit for only a defined period of time or until an event is detected. In certain embodiments, the logic is further configured to allocate and control at least two window system resources in the personal computing unit. In certain embodiments, the logic is further configured to coordinate or trigger coordinating the use of multiple physical memories or storage devices for the personal computing unit. In certain embodiments, the logic is further configured to coordinate or trigger coordinating the use of multiple processors for the personal computing unit. In certain embodiments, the logic is further configured to temporarily provide an operating system for running on the personal computing unit.

In certain embodiments, the logic is further configured to permit the personal computing unit to access one or more software applications. In certain embodiments, the logic is further configured to permit the personal computing unit to access one or more internet sites.

Another aspect of the disclosure pertains to methods of configuring window system resources to provide a personal computing unit for a user. Such methods may be characterized by the following operations: (a) selecting window system resources to serve as components of the personal computing unit for the user; (b) allocating some or all of the window system resources selected in (a) as at least a portion of the personal computing unit for a defined period of time; and (c) configuring the window system resources allocated in (b) to coordinate effort as the personal computing unit.

In certain embodiments, configuring the windows systems resources allocated in (b) includes running an instance of an operating system on the personal computing unit. In certain embodiments, configuring the windows systems resources allocated in (b) includes applying computer security based on information about the user.

In some cases, a method may additionally include identifying, authenticating, and/or authorizing the user prior to permitting the user to access the personal computing unit. In some cases, a method may additionally include monitoring operation of the window system resources configured in (c) during their use in the personal computing unit. In some cases, a method may additionally include, upon detecting a defined event, terminating use or deallocating the window system resources configured in (c).

These and other features of the disclosure will be described in more detail below.

BRIEF DESCRIPTION OF THE DRAWINGS

FIGS. 11a-11g depict network architectures that may be used by the window control system.

FIG. 19 provides a table showing a number of configurations where an electrochromic window can enable RF communications and/or serve as a signal blocking device.

DETAILED DESCRIPTION

Figure 1:
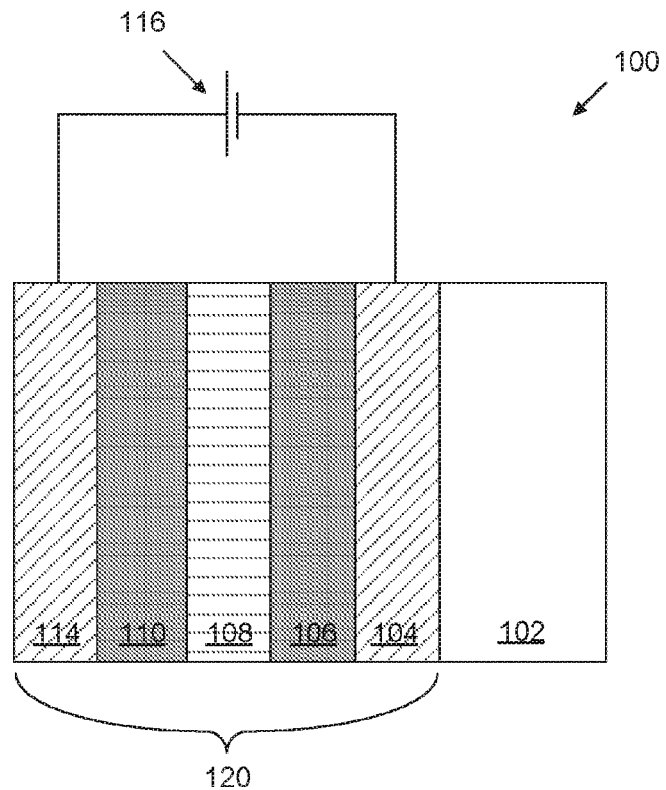
FIG. 1 shows a cross-sectional view of an electrochromic device coating that may be used in a tintable window

Introduction:

The following detailed description is directed to certain embodiments or implementations for the purposes of describing the disclosed aspects. However, the teachings herein can be applied and implemented in a multitude of different ways. In the following detailed description, references are made to the accompanying drawings. Although the disclosed implementations are described in sufficient detail to enable one skilled in the art to practice the implementations, it is to be understood that these examples are not limiting; other implementations may be used and changes may be made to the disclosed implementations without departing from their spirit and scope. Furthermore, while the disclosed embodiments focus on electrochromic windows (also referred to as optically switchable windows, tintable and smart windows), the concepts disclosed herein may apply to other types of switchable optical devices including, for example, liquid crystal devices and suspended particle devices, among others. For example, a liquid crystal device or a suspended particle device, rather than an electrochromic device, could be incorporated into some or all of the disclosed implementations. Additionally, the conjunction "or" is intended herein in the inclusive sense where appropriate unless otherwise indicated; for example, the phrase "A, B or C" is intended to include the possibilities of "A," "B," "C," "A and B," "B and C," "A and C" and "A, B, and C."

Tintable Windows—

A tintable window (sometimes referred to as an optically switchable window) is a window that exhibits a controllable and reversible change in an optical property when a stimulus is applied, e.g., an applied voltage. Tintable windows can be used to control lighting conditions and the temperature within a building by regulating the transmission of solar energy and thus heat load imposed on the interior of the building. The control may be manual or automatic and may be used for maintaining occupant comfort while reducing the energy consumption of heating, air conditioning and/or lighting systems. In some cases, tintable windows may be responsive to environmental sensors and user control. In this application, tintable windows are most frequently described with reference to electrochromic windows located between the interior and the exterior of a building or structure. However, this need not be the case. Tintable windows may operate using liquid crystal devices, suspended particle devices, microelectromechanical systems (MEMS) devices (such as microshutters), or any technology known now, or later developed, that is configured to control light transmission through a window. Windows with MEMS devices for tinting are further described in U.S. patent application Ser. No. 14/443,353, filed May 15, 2015, and titled "MULTI-PANE WINDOWS INCLUDING FT ELECTROCHROMIC DEVICES AND ELECTROMECHANICAL SYSTEMS DEVICES," which is herein incorporated by reference in its entirety. In some cases, tintable windows can be located within the interior of a building, e.g., between a conference room and a hallway. In some cases, tintable windows can be used in automobiles, trains, aircraft, and other vehicles in lieu of a passive or non-tinting window.

Electrochromic (EC) device coatings—An EC device coating (sometimes referred to as an EC device (ECD)) is a coating comprising at least one layer of electrochromic material that exhibits a change from one optical state to another when an electric potential is applied across the EC device. The transition of the electrochromic layer from one optical state to another optical state can be caused by reversible ion insertion into the electrochromic material (for example, by way of intercalation) and a corresponding injection of charge-balancing electrons. In some instances, some fraction of the ions responsible for the optical transition is irreversibly bound up in the electrochromic material. In many EC devices, some or all of the irreversibly bound ions can be used to compensate for "blind charge" in the material. In some implementations, suitable ions include lithium ions (Li+) and hydrogen ions (H+) (i.e., protons). In some other implementations, other ions can be suitable. Intercalation of lithium ions, for example, into tungsten oxide ($WO_{3-y}$ ($0<y\leq\sim0.3$)) causes the tungsten oxide to change from a transparent state to a blue state. EC device coatings as described herein are located within the viewable portion of the tintable window such that the tinting of the EC device coating can be used to control the optical state of the tintable window.

A schematic cross-section of an electrochromic device 100 in accordance with some embodiments is shown in FIG. 1. The EC device coating is attached to a substrate 102, a transparent conductive layer (TCL) 104, an electrochromic layer (EC) 106 (sometimes also referred to as a cathodically coloring layer or a cathodically tinting layer), an ion conducting layer or region (IC) 108, a counter electrode layer (CE) 110 (sometimes also referred to as an anodically coloring layer or anodically tinting layer), and a second TCL 114. Elements 104, 106, 108, 110, and 114 are collectively referred to as an electrochromic stack 120. A voltage source 116 operable to apply an electric potential across the electrochromic stack 120 effects the transition of the electrochromic coating from, e.g., a clear state to a tinted state. In other embodiments, the order of layers is reversed with respect to the substrate. That is, the layers are in the following order: substrate, TCL, counter electrode layer, ion conducting layer, electrochromic material layer, TCL.

In various embodiments, the ion conductor region 108 may form from a portion of the EC layer 106 and/or from a portion of the CE layer 110. In such embodiments, the electrochromic stack 120 may be deposited to include cathodically coloring electrochromic material (the EC layer) in direct physical contact with an anodically coloring counter electrode material (the CE layer). The ion conductor region 108 (sometimes referred to as an interfacial region, or as an ion conducting substantially electronically insulating layer or region) may then form where the EC layer 106 and the CE layer 110 meet, for example through heating and/or other processing steps. Electrochromic devices fabricated without depositing a distinct ion conductor material are further discussed in U.S. patent application Ser. No. 13/462,725, filed May 2, 2012, and titled "ELECTROCHROMIC DEVICES," which is herein incorporated by reference in its entirety. In some embodiments, an EC device coating may also include one or more additional layers such as one or more passive layers. For example, passive layers can be used to improve certain optical properties, to provide moisture or to provide scratch resistance. These or other passive layers also can serve to hermetically seal the EC stack 120. Additionally, various layers, including transparent conducting layers (such as 104 and 114), can be treated with anti-reflective or protective oxide or nitride layers.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential applied to the electrochromic stack is reversed, the ions are transported across the ion conducting layer 108 to the electrochromic material 106 and cause the material to enter the tinted state.

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, transparent-opaque, etc. Further, the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition.

In certain embodiments, all of the materials making up electrochromic stack 120 are inorganic, solid (i.e., in the solid state), or both inorganic and solid. Because organic materials tend to degrade over time, particularly when exposed to heat and UV light as tinted building windows are, inorganic materials offer the advantage of a reliable electrochromic stack that can function for extended periods of time. Materials in the solid state also offer the advantage of not having containment and leakage issues, as materials in the liquid state often do. It should be understood that any one or more of the layers in the stack may contain some amount of organic material, but in many implementations, one or more of the layers contain little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Figure 2:
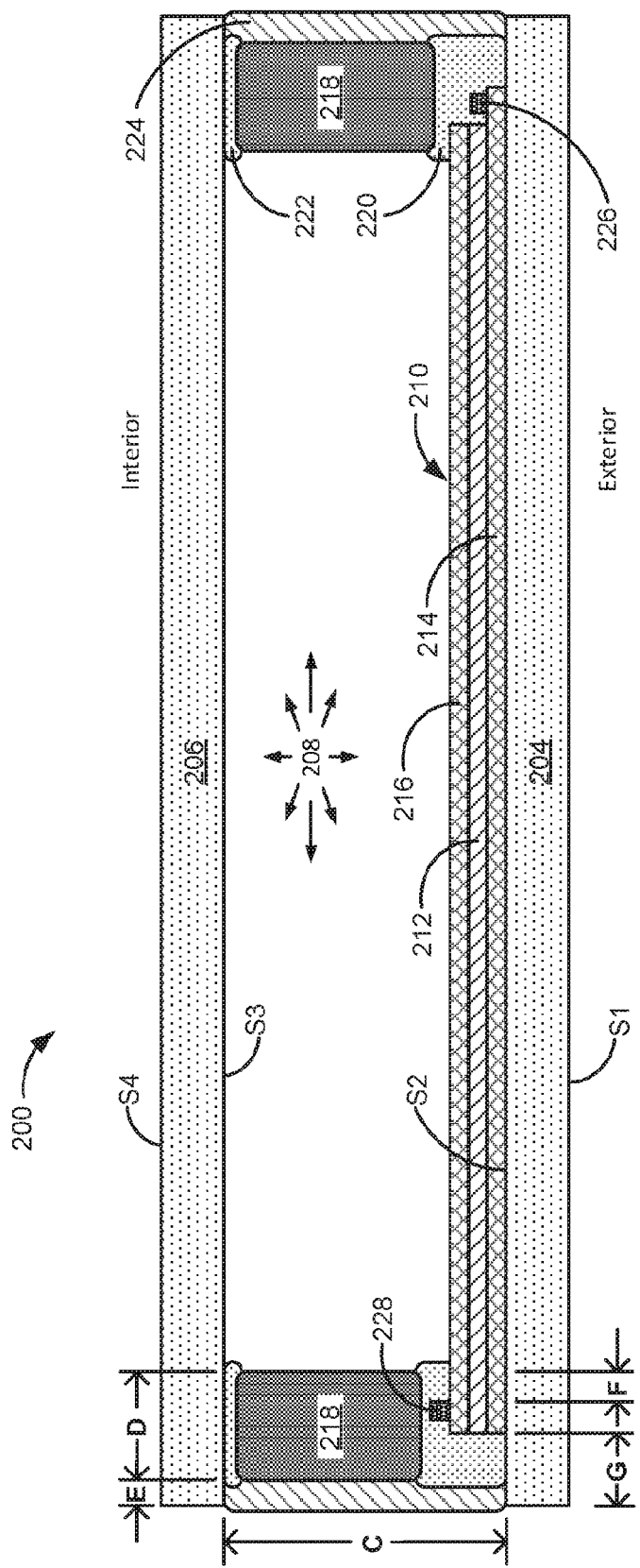
FIG. 2 shows a cross-sectional side view of a tintable window constructed as an IGU.

FIG. 2 shows a cross-sectional view of an example tintable window taking the form of an insulated glass unit ("IGU") 200 in accordance with some implementations. Generally speaking, unless stated otherwise, the terms "IGU," "tintable window," and "optically switchable window" are used interchangeably. This depicted convention is generally used, for example, because it is common and because it can be desirable to have IGUs serve as the fundamental constructs for holding electrochromic panes (also referred to as "lites") when provided for installation in a building. An IGU lite or pane may be a single substrate or a multi-substrate construct, such as a laminate of two substrates. IGUs, especially those having double- or triple-pane configurations, can provide a number of advantages over single pane configurations; for example, multi-pane configurations can provide enhanced thermal insulation, noise insulation, environmental protection and/or durability when compared with single-pane configurations. A multi-pane configuration also can provide increased protection for an ECD, for example, because the electrochromic films, as well as associated layers and conductive interconnects, can be formed on an interior surface of the multi-pane IGU and be protected by an inert gas fill in the interior volume, 208, of the IGU. The inert gas fill provides at least some of the (heat) insulating function of an IGU. Electrochromic IGU's have added heat blocking capability by virtue of a tintable coating that absorbs (or reflects) heat and light.

FIG. 2 more particularly shows an example implementation of an IGU 200 that includes a first pane 204 having a first surface S1 and a second surface S2. In some implementations, the first surface S1 of the first pane 204 faces an exterior environment, such as an outdoors or outside environment. The IGU 200 also includes a second pane 206 having a first surface S3 and a second surface S4. In some implementations, the second surface S4 of the second pane 206 faces an interior environment, such as an inside environment of a home, building or vehicle, or a room or compartment within a home, building or vehicle.

In some implementations, each of the first and the second panes 204 and 206 are transparent or translucent—at least to light in the visible spectrum. For example, each of the panes 204 and 206 can be formed of a glass material and especially an architectural glass or other shatter-resistant glass material such as, for example, a silicon oxide ($SO_x$)-based glass material. As a more specific example, each of the first and the second panes 204 and 206 can be a soda-lime glass substrate or float glass substrate. Such glass substrates can be composed of, for example, approximately 75% silica (SiO$_2$) as well as Na$_2$O, CaO, and several minor additives. However, each of the first and the second panes 204 and 206 can be formed of any material having suitable optical, electrical, thermal, and mechanical properties. For example, other suitable substrates that can be used as one or both of the first and the second panes 204 and 206 can include other glass materials as well as plastic, semi-plastic and thermoplastic materials (for example, poly(methyl methacrylate), polystyrene, polycarbonate, allyl diglycol carbonate, SAN (styrene acrylonitrile copolymer), poly(4-methyl-1-pentene), polyester, polyamide), or mirror materials. In some implementations, each of the first and the second panes 204 and 206 can be strengthened, for example, by tempering, heating, or chemically strengthening.

Generally, each of the first and the second panes 204 and 206, as well as the IGU 200 as a whole, is a rectangular solid. However, in some other implementations other shapes are possible and may be desired (for example, circular, elliptical, triangular, curvilinear, convex or concave shapes). In some specific implementations, a length "L" of each of the first and the second panes 204 and 206 can be in the range of approximately 20 inches (in.) to approximately 10 feet (ft.), a width "W" of each of the first and the second panes 204 and 206 can be in the range of approximately 20 in. to approximately 10 ft., and a thickness "T" of each of the first and the second panes 204 and 206 can be in the range of approximately 0.3 millimeters (mm) to approximately 10 mm (although other lengths, widths or thicknesses, both smaller and larger, are possible and may be desirable based on the needs of a particular user, manager, administrator, builder, architect or owner). In examples where thickness T of substrate 204 is less than 3 mm, typically the substrate is laminated to an additional substrate which is thicker and thus protects the thin substrate 204. Additionally, while the IGU 200 includes two panes (204 and 206), in some other implementations, an IGU can include three or more panes. Furthermore, in some implementations, one or more of the panes can itself be a laminate structure of two, three, or more layers or sub-panes.

The first and second panes 204 and 206 are spaced apart from one another by a spacer 218, which is typically a frame structure, to form an interior volume 208. In some implementations, the interior volume is filled with Argon (Ar), although in some other implementations, the interior volume 108 can be filled with another gas, such as another noble gas (for example, krypton (Kr) or xenon (Xn)), another (non-noble) gas, or a mixture of gases (for example, air). Filling the interior volume 208 with a gas such as Ar, Kr, or Xn can reduce conductive heat transfer through the IGU 200 because of the low thermal conductivity of these gases as well as improve acoustic insulation due to their increased atomic weights. In some other implementations, the interior volume 208 can be evacuated of air or other gas. Spacer 218 generally determines the height "C" of the interior volume 208; that is, the spacing between the first and the second panes 204 and 206. In FIG. 2, the thickness of the ECD, sealant 220/222 and bus bars 226/228 is not to scale; these components are generally very thin but are exaggerated here for ease of illustration only. In some implementations, the spacing "C" between the first and the second panes 204 and 206 is in the range of approximately 6 mm to approximately 30 mm. The width "D" of spacer 218 can be in the range of approximately 5 mm to approximately 25 mm (although other widths are possible and may be desirable).

Although not shown in the cross-sectional view, spacer 218 is generally a frame structure formed around all sides of the IGU 200 (for example, top, bottom, left and right sides of the IGU 200). For example, spacer 218 can be formed of a foam or plastic material. However, in some other implementations, spacers can be formed of metal or other conductive material, for example, a metal tube or channel structure having at least 3 sides, two sides for sealing to each of the substrates and one side to support and separate the lites and as a surface on which to apply a sealant, 224. A first primary seal 220 adheres and hermetically seals spacer 218 and the second surface S2 of the first pane 204. A second primary seal 222 adheres and hermetically seals spacer 218 and the first surface S3 of the second pane 206. In some implementations, each of the primary seals 220 and 222 can be formed of an adhesive sealant such as, for example, polyisobutylene (PIB). In some implementations, IGU 200 further includes secondary seal 224 that hermetically seals a border around the entire IGU 200 outside of spacer 218. To this end, spacer 218 can be inset from the edges of the first and the second panes 204 and 206 by a distance "E." The distance "E" can be in the range of approximately 4 mm to approximately 8 mm (although other distances are possible and may be desirable). In some implementations, secondary seal 224 can be formed of an adhesive sealant such as, for example, a polymeric material that resists water and that adds structural support to the assembly, such as silicone, polyurethane and similar structural sealants that form a watertight seal.

In the implementation shown in FIG. 2, an ECD 210 is formed on the second surface S2 of the first pane 204. In some other implementations, ECD 210 can be formed on another suitable surface, for example, the first surface S1 of the first pane 204, the first surface S3 of the second pane 206 or the second surface S4 of the second pane 206. The ECD 210 includes an electrochromic ("EC") stack 212, which itself may include one or more layers as described with reference to FIG. 1.

Window Controllers—Window controllers are associated with one or more tintable windows and are configured to control a window's optical state by applying a stimulus to the window—e.g., by applying a voltage or a current to an EC device coating. Window controllers as described herein may have many sizes, formats, and locations with respect to the optically switchable windows they control. Typically, the controller will be attached to a lite of an IGU or laminate but it can also be in a frame that houses the IGU or laminate or even in a separate location. As previously mentioned, a tintable window may include one, two, three or more individual electrochromic panes (an electrochromic device on a transparent substrate). Also, an individual pane of an electrochromic window may have an electrochromic coating that has independently tintable zones. A controller as described herein can control all electrochromic coatings associated with such windows, whether the electrochromic coating is monolithic or zoned.

If not directly, attached to a tintable window, IGU, or frame, the window controller is generally located in proximity to the tintable window. For example, a window controller may be adjacent to the window, on the surface of one of the window's lites, within a wall next to a window, or within a frame of a self-contained window assembly. In some embodiments, the window controller is an "in situ" controller; that is, the controller is part of a window assembly, an IGU or a laminate, and may not have to be matched with the electrochromic window, and installed, in the field, e.g., the controller travels with the window as part of the assembly from the factory. The controller may be installed in the window frame of a window assembly, or be part of an IGU or laminate assembly, for example, mounted on or between panes of the IGU or on a pane of a laminate. In cases where a controller is located on the visible portion of an IGU, at least a portion of the controller may be substantially transparent. Further examples of on glass controllers are provided in U.S. patent application Ser. No. 14/951,410, filed Nov. 14, 2015, and titled "SELF CONTAINED EC IGU," which is herein incorporated by reference in its entirety. In some embodiments, a localized controller may be provided as more than one part, with at least one part (e.g., including a memory component storing information about the associated electrochromic window) being provided as a part of the window assembly and at least one other part being separate and configured to mate with the at least one part that is part of the window assembly, IGU or laminate. In certain embodiments, a controller may be an assembly of interconnected parts that are not in a single housing, but rather spaced apart, e.g., in the secondary seal of an IGU. In other embodiments the controller is a compact unit, e.g., in a single housing or in two or more components that combine, e.g., a dock and housing assembly, that is proximate the glass, not in the viewable area, or mounted on the glass in the viewable area.

In one embodiment, the window controller is incorporated into or onto the IGU and/or the window frame prior to installation of the tintable window, or at least in the same building as the window. In one embodiment, the controller is incorporated into or onto the IGU and/or the window frame prior to leaving the manufacturing facility. In one embodiment, the controller is incorporated into the IGU, substantially within the secondary seal. In another embodiment, the controller is incorporated into or onto the IGU, partially, substantially, or wholly within a perimeter defined by the primary seal between the sealing separator and the substrate.

Having the controller as part of an IGU and/or a window assembly, the IGU can possess logic and features of the controller that, e.g., travels with the IGU or window unit. For example, when a controller is part of the IGU assembly, in the event the characteristics of the electrochromic device(s) change over time (e.g., through degradation), a characterization function can be used, for example, to update control parameters used to drive tint state transitions. In another example, if already installed in an electrochromic window unit, the logic and features of the controller can be used to calibrate the control parameters to match the intended installation, and for example if already installed, the control parameters can be recalibrated to match the performance characteristics of the electrochromic pane(s).

In other embodiments, a controller is not pre-associated with a window, but rather a dock component, e.g., having parts generic to any electrochromic window, is associated with each window at the factory. After window installation, or otherwise in the field, a second component of the controller is combined with the dock component to complete the electrochromic window controller assembly. The dock component may include a chip which is programmed at the factory with the physical characteristics and parameters of the particular window to which the dock is attached (e.g., on the surface which will face the building's interior after installation, sometimes referred to as surface 4 or "S4"). The second component (sometimes called a "carrier," "casing," "housing," or "controller") is mated with the dock, and when powered, the second component can read the chip and configure itself to power the window according to the particular characteristics and parameters stored on the chip. In this way, the shipped window need only have its associated parameters stored on a chip, which is integral with the window, while the more sophisticated circuitry and components can be combined later (e.g., shipped separately and installed by the window manufacturer after the glazier has installed the windows, followed by commissioning by the window manufacturer). Various embodiments will be described in more detail below. In some embodiments, the chip is included in a wire or wire connector attached to the window controller. Such wires with connectors are sometimes referred to as pigtails.

As discussed, an "IGU" includes two (or more) substantially transparent substrates, for example, two panes of glass, where at least one substrate includes an electrochromic device disposed thereon, and the panes have a separator disposed between them. An IGU is typically hermetically sealed, having an interior region that is isolated from the ambient environment. A "window assembly" may include an IGU or for example a stand-alone laminate, and includes electrical leads for connecting the IGUs or laminates one or more electrochromic devices to a voltage source, switches and the like, and may include a frame that supports the IGU or laminate. A window assembly may include a window controller as described herein, and/or components of a window controller (e.g., a dock).

As used herein, the term outboard means closer to the outside environment, while the term inboard means closer to the interior of a building. For example, in the case of an IGU having two panes, the pane located closer to the outside environment is referred to as the outboard pane or outer pane, while the pane located closer to the inside of the building is referred to as the inboard pane or inner pane. As labeled in FIG. 2, the different surfaces of the IGU may be referred to as S1, S2, S3, and S4 (assuming a two-pane IGU). S1 refers to the exterior-facing surface of the outboard lite (i.e., the surface that can be physically touched by someone standing outside). S2 refers to the interior-facing surface of the outboard lite. S3 refers to the exterior-facing surface of the inboard lite. S4 refers to the interior-facing surface of the inboard lite (i.e., the surface that can be physically touched by someone standing inside the building). In other words, the surfaces are labeled S1-S4, starting from the outermost surface of the IGU and counting inwards. In cases where an IGU includes three panes, this same trend holds (with S6 being the surface that can be physically touched by someone standing inside the building). In certain embodiments employing two panes, the electrochromic device (or other optically switchable device) is disposed on S3.

Further examples of window controllers and their features are presented in U.S. patent application Ser. No. 13/449,248, filed Apr. 17, 2012, and titled "CONTROLLER FOR OPTICALLY-SWITCHABLE WINDOWS"; U.S. patent application Ser. No. 13/449,251, filed Apr. 17, 2012, and titled "CONTROLLER FOR OPTICALLY-SWITCHABLE WINDOWS"; U.S. patent application Ser. No. 15/334,835, filed Oct. 26, 2016, and titled "CONTROLLERS FOR OPTICALLY-SWITCHABLE DEVICES"; and International Patent Application No. PCT/US17/20805, filed Mar. 3, 2017, and titled "METHOD OF COMMISSIONING ELECTROCHROMIC WINDOWS," each of which is herein incorporated by reference in its entirety Window Control System—When a building is outfitted with tintable windows, window controllers may be connected to one another and/or other entities via a communications network sometimes referred to as a window control network or a window network. The network and the various devices (e.g., controllers and sensors) that are connected via the network (e.g., wired or wireless power transfer and/or communication) are referred to herein as a window control system. Window control networks may provide tint instructions to window controllers, provide window information to master controllers or other network entities, and the like. Examples of window information include current tint state or other information collected by window controller. In some cases, a window controller has one or more associated sensors including, for example, a photosensor, a temperature sensor, an occupancy sensor, and/or gas sensors that provide sensed information over the network. In some cases, information transmitted over a window communication network need not impact window control. For example, information received at a first window configured to receive a WiFi or LiFi signal may be transmitted over the communication network to a second window configured to wirelessly broadcast the information as, e.g., a WiFi or LiFi signal. A window control network need not be limited to providing information for controlling tintable windows, but may also be able to communicate information for other devices interfacing with the communications network such as HVAC systems, lighting systems, security systems, personal computing devices, and the like.

Figure 3:
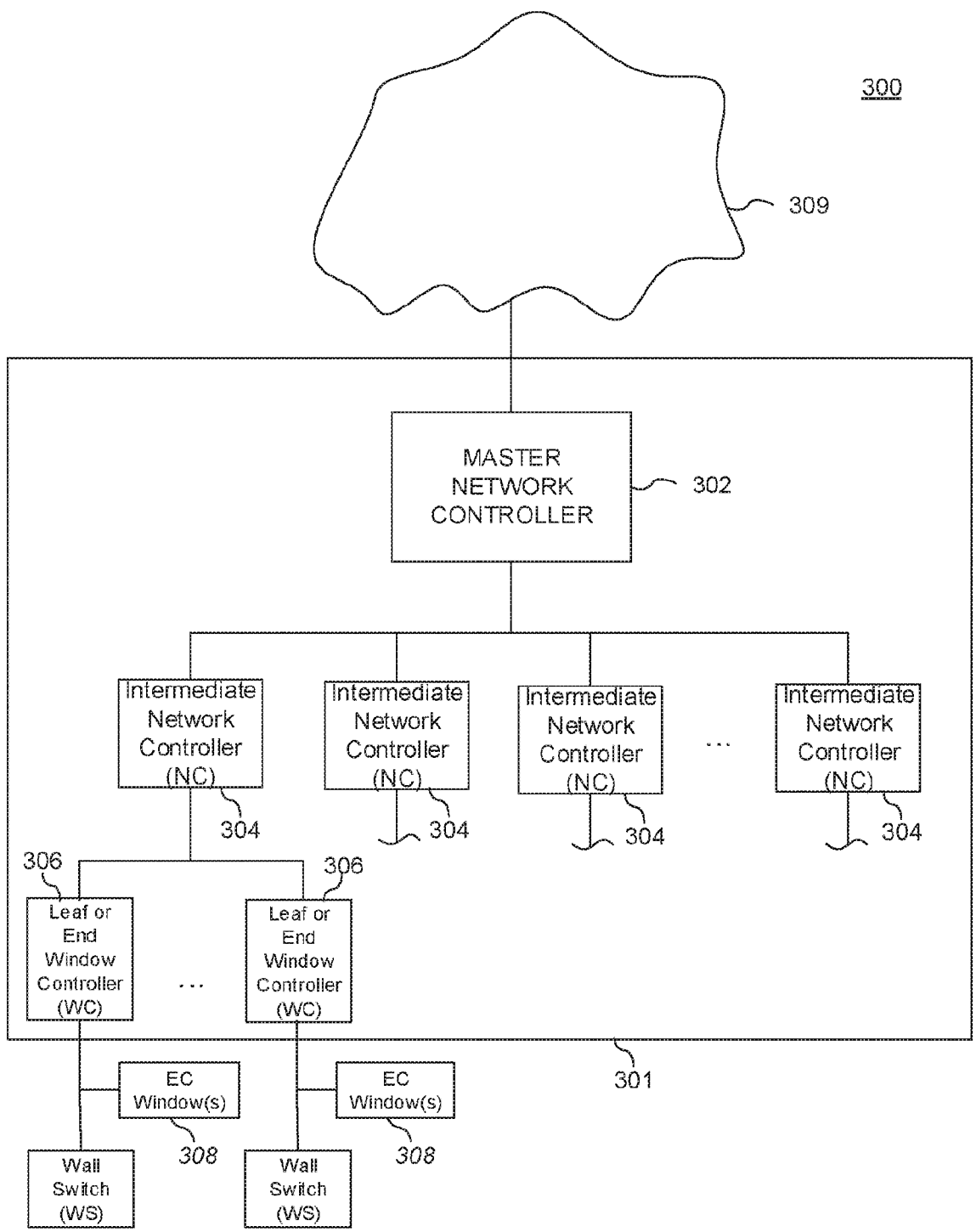
FIG. 3 depicts a window control network provided by of a window control system having one or more tintable windows.

FIG. 3 provides an example of a control network 301 of a window control system 300. The network may distribute both control instructions and feedback, as well as serving as a power distribution network. A master controller 302 communicates and functions in conjunction with multiple network controllers 304, each of which network controllers is capable of addressing a plurality of window controllers 306 (sometimes referred to herein as leaf controllers) that apply a voltage or current to control the tint state of one or more optically switchable windows 308. Communication controllers (304, 306, and 308) may occur via wired (e.g., Ethernet) or via a wireless (e.g., WiFi or LiFi) connection. In some implementations, the master controller issues the high-level instructions (such as the final tint states of the electrochromic windows) to the network controllers, and the network controllers then communicate the instructions to the corresponding window controllers. Typically a master controller is configured to communicate with one or more outward face networks 309. Window control network 301 can include any suitable number of distributed controllers having various capabilities or functions and need not be arranged in the hierarchical structure depicted in FIG. 3. As discussed elsewhere herein, network 301 may also be used as a communication network between distributed controllers (e.g., 302, 304, 306) that act as communication nodes to other devices or systems (e.g., 309).

In some embodiments, outward facing network 309 is part of or connected to a building management system (BMS). A BMS is a computer-based control system that can be installed in a building to monitor and control the building's mechanical and electrical equipment. A BMS may be configured to control the operation of HVAC systems, lighting systems, power systems, elevators, fire systems, security systems, and other safety systems. BMSs are frequently used in large buildings where they function to control the environment within the building. For example, a BMS may monitor and control the lighting, temperature, carbon dioxide levels, and humidity within the building. In doing so, a BMS may control the operation of furnaces, air conditioners, blowers, vents, gas lines, water lines, and the like. To control a building's environment, the BMS may turn on and off these various devices according to rules established by, for example, a building administrator. One function of a BMS is to maintain a comfortable environment for the occupants of a building. In some implementations, a BMS can be configured not only to monitor and control building conditions, but also to optimize the synergy between various systems—for example, to conserve energy and lower building operation costs. In some implementations, a BMS can be configured with a disaster response. For example, a BMS may initiate the use of backup generators and turn off water lines and gas lines. In some cases, a BMS has a more focused application—e.g., simply controlling the HVAC system—while parallel systems such as lighting, tintable window, and/or security systems stand alone or interact with the BMS.

In some embodiments, network 309 is a remote network. For example, network 309 may operate in the cloud or on a device remote from the building having the optically switchable windows. In some embodiments, network 309 is a network that provides information or allows control of optically switchable windows via a remote wireless device. In some cases, network 309 includes seismic event detection logic. Further examples of window control systems and their features are presented in U.S. patent application Ser. No. 15/334,832, filed Oct. 26, 2016, and titled "CONTROLLERS FOR OPTICALLY-SWITCHABLE DEVICES" and International Patent Application No. PCT/US17/62634, filed on Nov. 23, 2016, and titled "AUTOMATED COMMISSIONING OF CONTROLLERS IN A WINDOW NETWORK," both of which are herein incorporated by reference in its entirety.

Electrochromic Windows with Transparent Display Technology:

Applicant has previously developed IGUs with integrated photovoltaics, onboard storage, integrated antennas, integrated sensors, an API to serve up valuable data, etc. It has been found that electrochromic windows can be further improved in surprising ways, e.g., by combining with transparent display technology as well as augmenting sensor, onboard antenna, and software applications.

Figure 4:
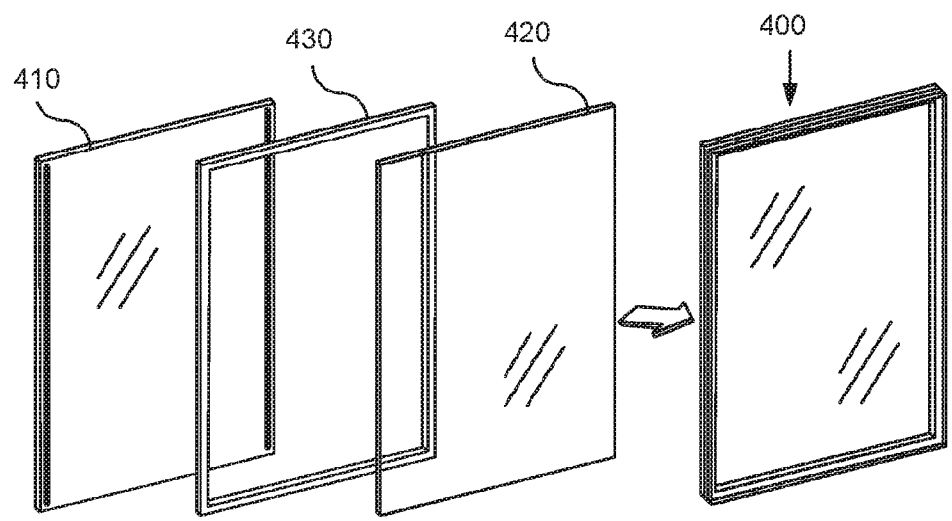
FIG. 4 depicts an electrochromic (EC) window lite, or IGU or laminate, with a transparent display.

One embodiment, depicted in FIG. 4, includes an electrochromic (EC) window lite, or IGU or laminate, combined with a transparent display. The transparent display area may be co-extensive with the EC window viewable area. An electrochromic lite, 410, including a transparent pane with an electrochromic device coating thereon and bus bars for applying driving voltage for tinting and bleaching, is combined with a transparent display panel, 420, in a tandem fashion. In this example, 410 and 420 are combined using a sealing spacer, 430, to form an IGU, 400. The transparent display may be a standalone lite for the IGU, or be e.g. a flexible panel laminated or otherwise attached to a glass lite, and that combination is the other lite of the IGU. In typical embodiments, the transparent display is the, or is on the, inboard lite of the IGU, for use by the building occupants. In other embodiments, an electrochromic device coating and transparent display mechanism are combined on a single substrate. In other embodiments, a laminate, rather than an IGU, are formed from 410 and 420, without a sealing spacer.

The transparent display can be used for many purposes. For example, the display can be used for conventional display or projection screen purposes, such as displaying video, presentations, digital media, teleconferencing, web-based meetings including video, security warnings to occupants and/or people outside the building (e.g., emergency response personnel) and the like. The transparent display can also be used for displaying controls for the display, the electrochromic window, an electrochromic window control system, an inventory management system, a security system, a building management system, and the like. In certain embodiments, the transparent display can be used as a physical alarm element. That is, the electrochromic lite of an IGU can be used as a breakage detector to indicate a security breach of the building's perimeter. The transparent display could also, alone or in combination with the electrochromic lite, serve this function. In one example, the electrochromic lite is used as a breakage detection sensor, i.e., breaking the EC pane triggers an alarm. The transparent display may also serve this function, and/or be used as a visual alarm indicator, e.g., displaying information to occupants and/or external emergency personnel. For example, in certain implementations, a transparent display may have a faster electrical response than the electrochromic lite, and thus could be used to indicate alarm status, for example, externally to firefighters, etc. or internally to occupants, e.g., to indicate the nature of the threat and/or escape routes. In one embodiment, breakage of the outboard electrochromic lite sends a signal to the transparent display, via the window controller, such that the transparent display conveys a security breach. In one embodiment, the transparent display flashes a warning message and/or flashes red, e.g., the entire transparent display pane may flash brightly in red to indicate trouble and be easily seen, e.g., a large window flashing in this manner would be easily noticeable to occupants and/or outside personnel. In another example, one or more neighboring windows may indicate damage to a window. For example, in a curtain wall where a first window has four adjacent windows, breakage to the first window triggers one or more of the four adjacent windows to flash red or display large arrows pointing to the first window, to make it easier for occupants or external personnel to know where the trouble is. In a large skyscraper, with many windows, it would be very easy for first responders to see four windows adjacent a central window flashing, i.e., forming a flashing cross to indicate where the trouble is located. If more than one window is broken, this method would allow instant visual confirmation of where the trouble lies. In certain embodiments, one or more transparent displays may be used to display a message to first responders, indicating both the location and nature of the emergency. It may be breakage of one or more windows or indicate, e.g., hotspots within the building for firefighters.

The electrochromic window can be used as a contrast element to aid visualization of the transparent display, e.g., by tinting the EC pane the transparent display will have higher contrast. In turn, the transparent display can be used to augment the color, hue, % T, switching speed, etc. of the electrochromic device. There are many novel symbiotic relationships that can be exploited by the combination of EC window and transparent display technology. When the EC pane and the transparent display are both in their clear state, IGU 400 appears and functions as a conventional window. Transparent display 420 may have some visually discernable conductive grid pattern but otherwise is transparent, and can be uni- or bidirectional in the display function. One of ordinary skill in the art would appreciate that as transparent display technology advances, the clarity and transparency of such devices will improve. Improvements in micro and nanostructured addressable grids, as well as transparent conductor technology, allow for transparent displays where there is no visually discernable conductive grid.

Figure 5:
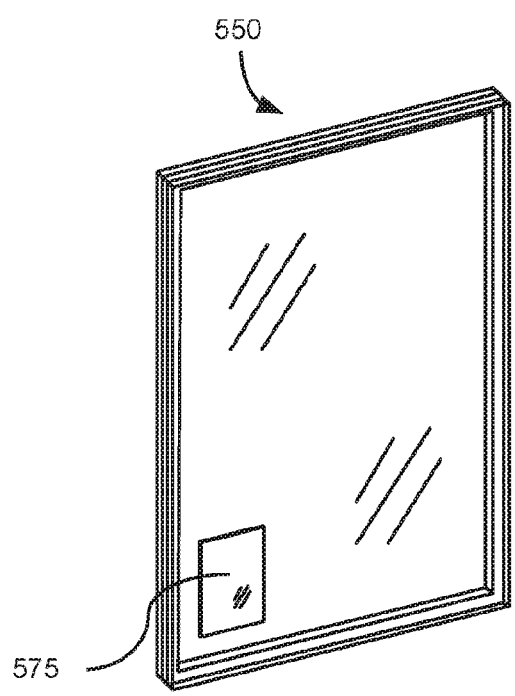
FIG. 5 depicts an electrochromic insulated glass unit with an on-glass transparent display.

FIG. 5 depicts an electrochromic insulated glass unit, 550, with an on-glass transparent display, 575, used as a control interface for IGU 550. Display 575 may be wired to an onboard controller which is, e.g., housed in the secondary sealing volume of the IGU. The wiring for the transparent display 575 may pass through the glass, around the edge of the glass, or may be wirelessly connected to the onboard (or offboard) controller (not shown). When the transparent display 575 is not in use, it is essentially transparent and colorless, so as not to detract from the aesthetics of the IGU's viewable area. Transparent display 575 may be adhesively attached to the glass of the IGU. Wiring to the control unit of the window may pass around or through the glass upon which the display is attached. The display may communicate with a window controller or control system wirelessly via one or more antenna, which may also be transparent.

A transparent display may be located within the viewable area of an optically switchable window. The transparent display may be configured to provide various types of information about windows or the building via, e.g., a graphical user interface. The display may also be used to convey information to the user, e.g., teleconferencing, weather data, financial reports, live streaming data, asset tracking and the like as described herein. In certain embodiments, the transparent display (and associated controller) is configured to show specific information about the window being used (the one displaying the information), information about a zone in which the window resides, and/or information about other particular windows in the building. Depending on user permissions, such information could include information in all windows of a building or even multiple buildings. The transparent displays (and associated controller) may be configured to allow monitoring and/or controlling optically switchable windows on a window network.

In certain embodiments, the graphical user interface may represent windows and/or other controllable systems and devices using smart objects. A "smart object," as described herein, is a representation of one or more material items that can be manipulated by a user (e.g., by contact with a touch-sensitive display) to gather and/or present information about the one or more physical devices the smart object represents. In some cases, a graphical user interface may display a three-dimensional building model with one or more smart objects thereon. By displaying smart objects on the building model according to their physical location, a user in may easily identify a smart object that represents a window of interest. Smart objects allow a user to receive information from, or control an aspect of, the window network and/or a system or electronic device in communication with the window network. For example, if a user has selected a smart object representing a window, information may be displayed such as a window ID, window type, window size, manufacturing date, current tint state, leakage current, usage history, inside temperature, outside temperature, and the like. Additionally, smart objects may present a user with options for controlling a window tint state, configuring a tint schedule, or tinting rules. In some cases, a window may have inboard lite with touch and gesture sensors that allow a user to interact with smart objects in the graphical user interface. In some cases, a user may interact with the smart objects displayed on the graphical user interface using a remote device that is configured to receive user input (e.g., a cell phone, a controller, a keyboard, and the like).

In one example, during the initial installation of a plurality of electrochromic windows, at least one window is installed with transparent display technology. This window may also be configured with power, internet connectivity, and at least one processor (e.g., a window controller, network controller, and/or master controller for the window installation). The at least one window, by virtue of its transparent display functionality, can serve as a GUI for further installation of the plurality of windows in the system to be installed. As the windows of the system are installed, this use may be translated to other windows of the system, and, additionally be used to commission windows of the system. This obviates the need for an installer to have a portable or other separate computing device for commissioning the windows; the window itself and its corresponding processing power can be used during installation to aid further installation and commissioning of the window system. Using, e.g., this at least one window with display technology tradespeople, engineers, and/or construction crews tasked with installing electrical wiring, plumbing, HVAC and other infrastructure may have the ability to pull up building drawings on large format displays, rather than carrying large paper drawings. Moreover, web-based video conferencing e.g., allows workers in disparate areas of the building to communicate with each other and discuss building plans displayed on their screens, manipulate the plans interactively via the touchscreen function of transparent displays described herein.

Figure 6:
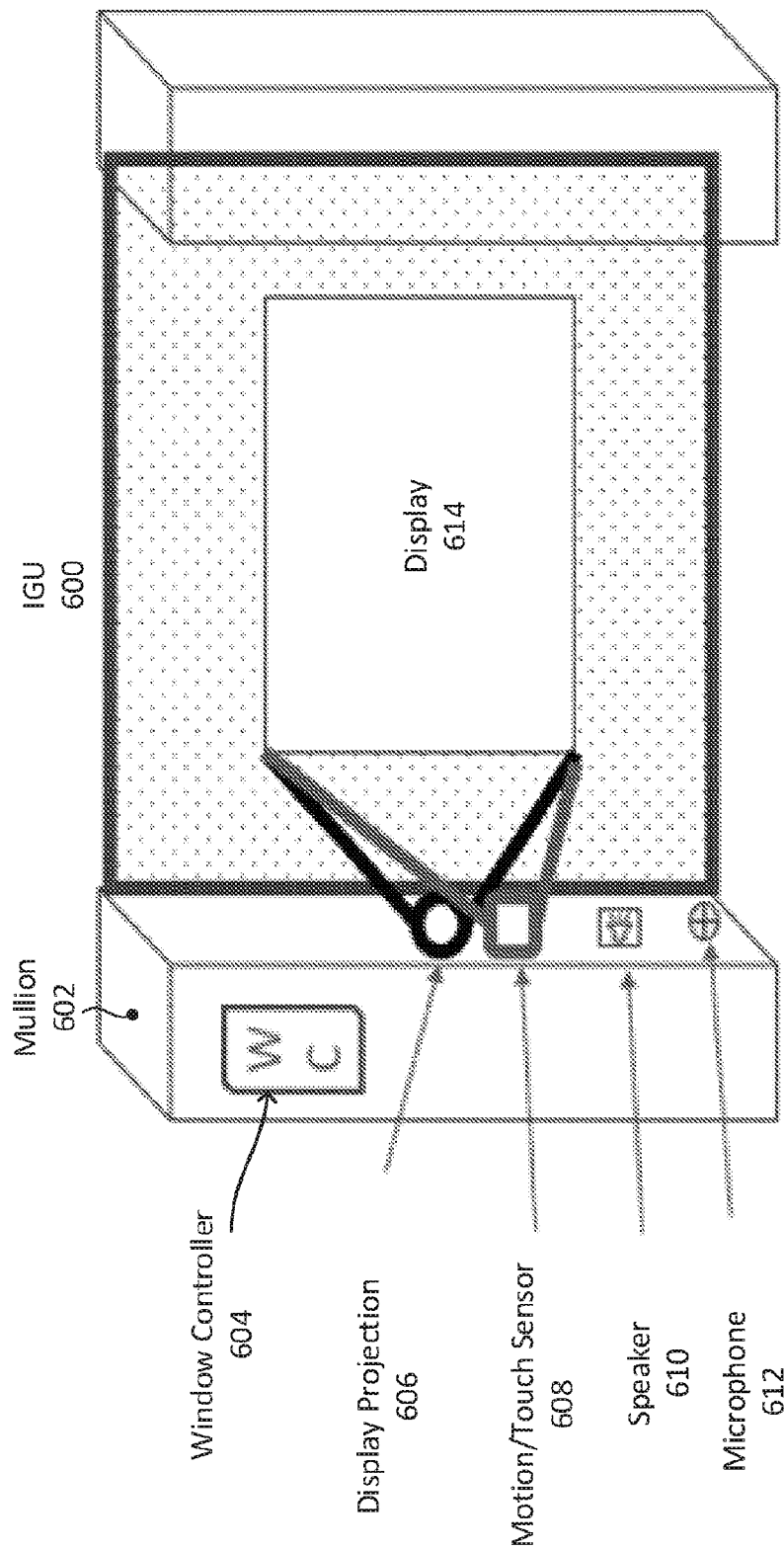
FIG. 6 depicts an optically switchable window configured with a projector for displaying an image on the surface of the optically switchable window.

In certain embodiments, rather than a transparent display registered with an EC device, e.g., in an IGU form factor, an interactive projector is used to both display information onto an EC window and also allow the user to access and input information using the interactive display technology portion of the assembly. FIG. 6 depicts an example of an optically switchable window 600 configured with a projector 606 that displays an image 614 on the surface of the optically switchable window. To improve the visibility of a projected image 614, a window may be configured with a pixelated or monolithic passive coating that is substantially transparent to an observer, but aids in the reflection of the image provided by the projector. In some cases, the level of tinting may be adjusted to improve the visibility of a projected image. In this regard, to ensure that the window tint state is appropriate for projecting, the window controller 604 and projector/display controller 606 may be coupled or in communication. The projector may be located in a mullion 602 (as depicted), a transom, or at a remote location such as a nearby ceiling or a wall. The projector 606 may receive information to display from a window controller 604, which may also be located in a mullion or a transom. In some cases, a projector in a mullion, transom, or similar location is used to project an image through free space and onto a glass surface or a passive coating of the IGU. In some cases, a projector is located within the mullion and projects light onto the display via a light guide that is embedded in, formed by, or attached to a glass substrate of a display lite. The projector may in some embodiments be configured so that the end user does not see the projector mechanism, i.e. it is hidden from view. Light may be projected from the edge of the glass into the light guide, e.g., by using a mirror or by orienting the projector. In this configuration, the projector can be concealed from view so as not to create a visual distraction. In some cases, a light guide plate is used which runs parallel to a lite which has a monolithic passive coating for displaying an image. Examples of light guide plates used for a user wearable display device which can be adapted for use for transparent displays on optically switchable windows are found in U.S. Pat. No. 9,791,701B2 titled "Display device," and filed on Oct. 17, 2017, which is incorporated in its entirety.

To receive user input corresponding to user motion, the window depicted FIG. 6 may be equipped with motion sensors 608 located on or within mullions and/or transoms. The motion sensors may include one or more cameras to detect user motion (e.g., the motion of a user's hand) and image analysis logic may determine a user's interaction with a displayed smart object based on the detected motion. For example, image analysis logic may determine whether a user's motion corresponds to a gesture used to provide a specific input. In some cases, one or more cameras may be inferred cameras. In some cases, the motion sensors may include ultrasonic transducers and ultrasonic sensors to determine user motion. In some cases, a window may be equipped with a capacitive touch sensor (e.g., on S1 or S4) that at least partially covers the visible portion of the window and receives user input when a user touches the surface of the window. For example, a capacitive touch sensor may be similar to that found in touchscreens such as the Apple iPad. In addition to motion sensors, an optically switchable window may also be equipped with a microphone 612 located in a mullion or transom for receiving audible user input. In some cases, a microphone 612 may be located on a remote device and voice recognition logic may be used to determine user input from received audio. In some cases, audio is recorded on a remote device and transmitted wirelessly to a window controller. Examples of systems that provide a voice-controlled interface for controlling optically switchable windows are provided in PCT Patent Application PCT/US17/29476, filed on Apr. 25, 2017, which is herein incorporated by reference in its entirety. When a window may be configured to receive audible user input, a window may also be configured with one or more speakers 610 for providing information to a user. For example, a speaker 610 may be used respond to a user inquiry or to provide various features that may be controlled by the user. In some cases, a projector such as an Xperia Touch™, manufactured by Sony Corporation, is attached to or near the IGU, e.g., in a mullion or on a wall or ceiling nearby, in order to project onto an IGU to display information to the user and provide an on-glass control function.

In one embodiment, the window assembly includes a motion sensor, a camera, a transparent capacitive touchscreen, and/or a microphone for voice activation. When a user interacts with the window, the projector (or transparent display) activates to show a control GUI for controlling the window, other windows in the building, and/or other building systems. The user interaction may be, e.g., movement detected near the window, video or image identification of the user, an appropriate touch command, and/or an appropriate voice command. The user can then carry out desired work, programming, data retrieval and the like. After a period, or by the appropriate command input provided by the user, the control GUI on the glass (projected or transparent display) disappears or ceases, leaving the (entire) unobstructed view of the window.

In certain embodiments, a window may use an electrowetting transparent display technology. An electrowetting display is a pixelated display where each pixel has one or more cells. Each cell can oscillate between substantially transparent and substantially opaque optical states. Cells make use of surface tensions and electrostatic forces to control the movement of a hydrophobic solution and a hydrophilic solution within the cell. Cells can be, e.g., white, black, cyan, magenta, yellow, red, green, blue, or some other color in their opaque state (determined by either the hydrophobic solution or the hydrophilic solution within the cell). A colored pixel may have, e.g., a cyan, magenta, yellow cells in a stacked arrangement. Perceived colors can are generated by oscillating the cells of a pixel (each cell having a different color) at specific frequencies. Such displays may have many thousands or millions of individually addressable cells which can produce high-resolution images.

The display may be permanently or reversibly attached to the electrochromic window. The electrochromic window may include an electrochromic lite, an electrochromic IGU, and/or a laminate including an electrochromic lite, for instance. In some cases, it may be advantageous to include a reversible and/or accessible connection between the display and the window such that the display can be upgraded or replaced, as needed. A display lite can be either inboard or outboard of the electrochromic device. It is noted that any of the embodiments herein can be modified to switch the relative positions of the display lite and the electrochromic EC device. Moreover, while certain figures show an electrochromic window that includes a particular number of lites, any of these embodiments can be modified such that the electrochromic window includes any number of lites (e.g., an EC IGU may be replaced with an EC lite or EC laminate, and vice versa).

Example solid-state electrochromic devices, methods, and apparatus for making them and methods of making electrochromic windows with such devices are described in U.S. patent application Ser. No. 12/645,111, entitled "Fabrication of Low Defectivity Electrochromic Devices," by Kozlowski et al., and U.S. patent application Ser. No. 12/645,159, entitled "Electrochromic Devices," by Wang et al., both of which are incorporated by reference herein in their entireties. In various embodiments, a solid-state electrochromic device is used in conjunction with a transparent display, which may be pixelated and which may include one or more organic or non-solid components. Examples of such displays include OLEDs, electrophoretic displays, LCDs, and electrowetting displays. As described, the display may be fully or partially coextensive with an electrochromic device on a lite. Further, the display may be provided in direct on contact with an electrochromic device, on the same lite as the electrochromic device but on a different surface, or on a different lite of an IGU. In some embodiments, the display lite may reversibly and accessibly attach to a dock that secures the display lite. The dock may be configured to safely receive the display lite and support it at one or more edges. Examples of docks and other framing are described in U.S. patent application Ser. No. 14/951,410, titled "SELF-CONTAINED EC IGU" and filed on Nov. 24, 2015, which is herein incorporated in its entirety.

In various examples, a framing system that secures a display lite includes a structure for securing the display lite proximate an EC window, and wiring for providing power to the display lite. The framing system may further include wiring for providing communication to the display lite, wiring for providing power to an EC window and/or window controller, and wiring for providing communication to the EC window and/or window controller. In these or other embodiments, the framing system may include wireless transmitters and/or receivers for transmitting and/or receiving wireless control information that may be communicated to the display lite and/or the electrochromic window/window controller. The framing system may also include a number of other components useful for an electrochromic window such as various sensors, cameras, etc.

In some embodiments, a framing system supporting a display lite is configured to be installed proximate existing framing that already secures an electrochromic window. The electrochromic window is essentially being retrofitted to include the display lite in this example. In some such cases, the framing may include control hardware to interface with the existing EC window. Such control hardware may use wireless communication to control the EC window in some cases.

Generally speaking, the framing system/dock/similar hardware may be referred to as an apparatus for mounting an electronic device onto an optically switchable window. The electronic device is a display in many cases (e.g., a display lite or other display), and may or may not be transparent. The electronic device may also be any number of other devices, including but not limited to a window controller, user input device, etc. In some cases, the apparatus may mount more than one electronic device onto the optically switchable window.

In some cases, the display and the EC window may be controlled in tandem to enhance user experience. For instance, the display may be controlled in a way that takes into account the optical state of the EC window. Similarly, the optical state of the EC window may be controlled in a way that takes into account the state of the display. In one example, the EC window and display may be controlled together in order to optimize the appearance of the display (e.g., such that the display is easy to see, bright, readable, etc.). In some cases, the display is easiest to see when the EC window is in a darkened tint state. As such, in some cases, the EC window and display may be controlled together such that the EC window goes to a relatively dark tint state when the display is used, or when the display is used and certain conditions are met (e.g., with respect to timing, weather, light conditions, etc.).

In some embodiments, a first controller may be used to control the optical state of the EC window, and a second controller may be used to control the display. In another embodiment, a single controller may be used to control both the optical state of the EC window and the display. The logic/hardware for such control may be provided in a single controller or multiple controllers, as desired for a particular application.

Figure 7:
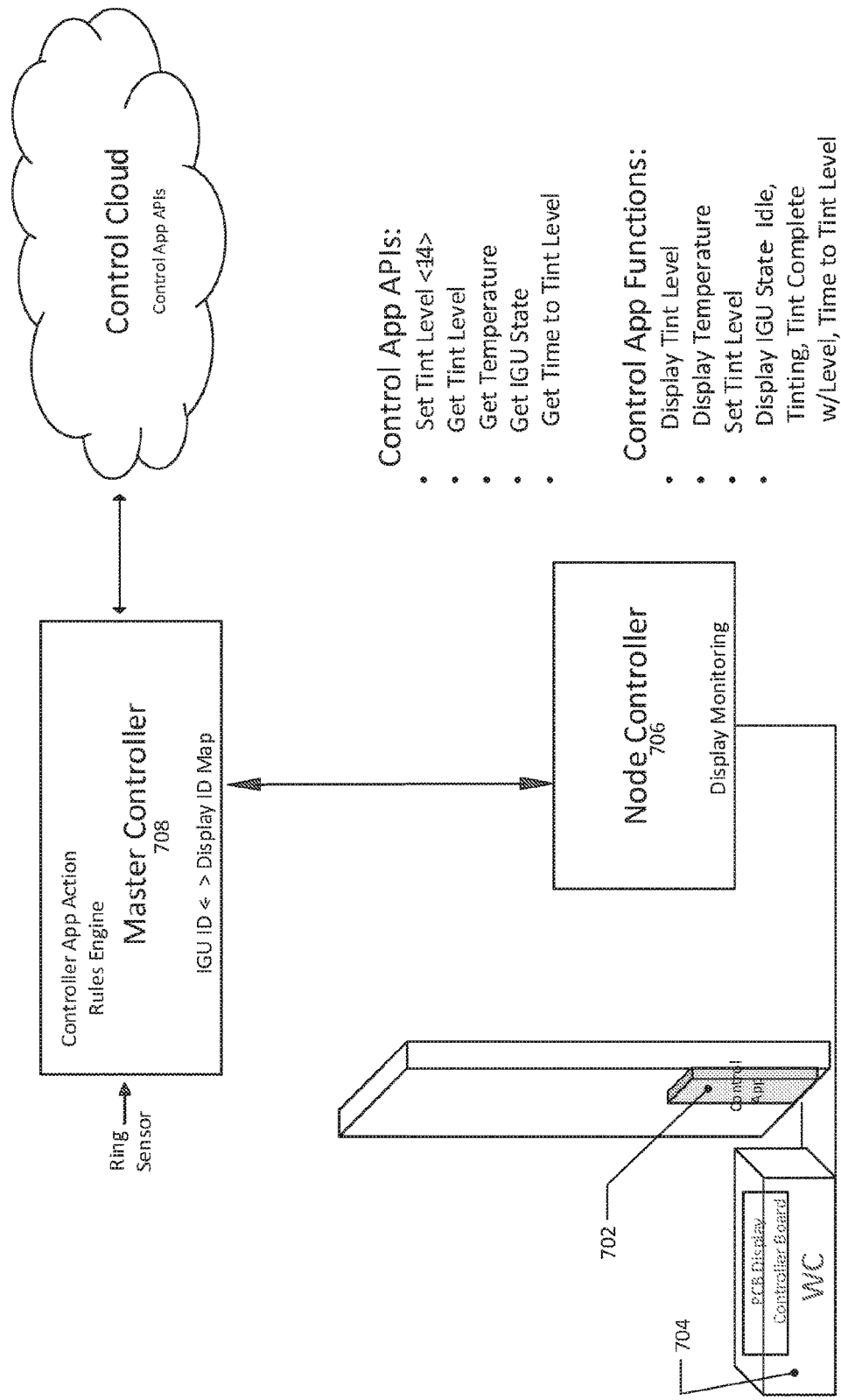
FIG. 7 illustrates one configuration of how the architecture of how an on-glass transparent controller can be implemented.

FIG. 7 illustrates one configuration of how the architecture of how an on-glass transparent controller can be implemented. The on-glass controller transparent display 702 is used to display control applications in a graphical user interface (GUI) format. The transparent display is in communication with the window controller 704, either onboard or offboard as depicted below. A node controller 706 is used for display monitoring and function. The node controller communicates with a master controller 708 for controlling the EC functions, etc., which in turn communicates via the cloud with APIs. The window controller may include RF radio, temperature sensors and control and Bluetooth capability. Transparent on-glass controller displays can be, e.g., as commercially available Lumineq® transparent displays from Beneq Oy, of Finland, as described on their commercial website (http://beneq.com/en/displays/products/custom). When a window controller is connected to a local area network (e.g., a local network provided via windows) or connected to the internet, the transparent display and other glass functions can be controlled in some cases, through a web-based application or another application configured to communicate with the window control network. Such applications can be run on, e.g., phones, tablets, or desktop computers.

Applicant's previously described window control technology architecture can, in some cases, include a daughter card containing I/O for driving a transparent display (whether on-glass controller and/or if a full window size display/controller). Embodiments may also include an onboard antenna. The antenna may be an on-glass antenna, e.g., fractal and/or antenna suites scribed into a transparent conductive oxide layer on a lite of an IGU. Antennas are used for various functions, including RF transmission/reception. Various EMI blocking coatings may also be included in embodiments.

Figure 8A:
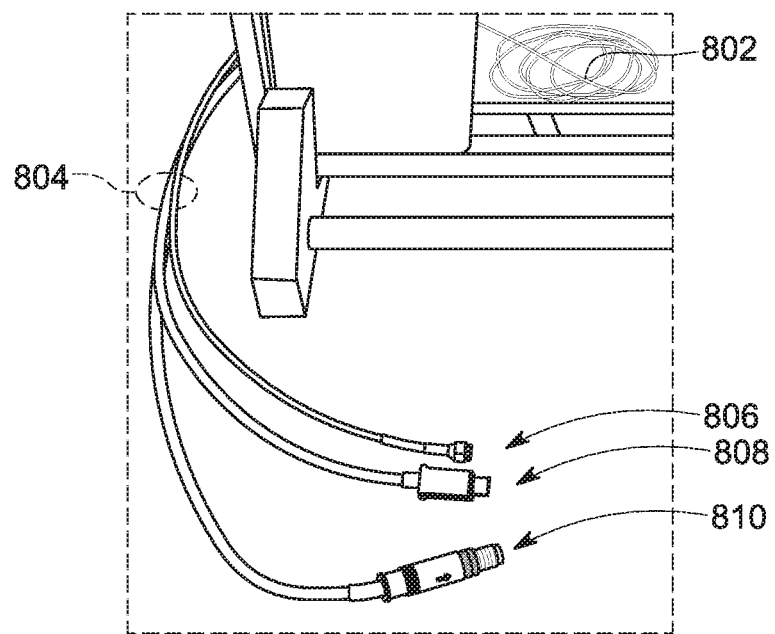
FIGS. 8a and 8b depict an EC IGU 802 with an IGU connector for EC, antenna, and video applications.
Figure 8B:
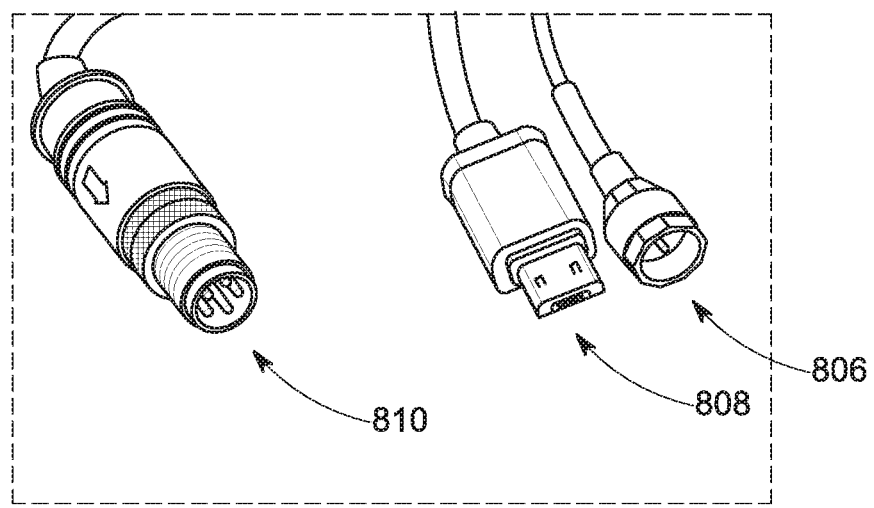

FIGS. 8a and 8b depict an EC IGU 802 with an IGU connector 804 for EC, antenna, and video applications. An IGU connector may include a single cable that supports each of these applications, or in some cases (such as depicted in FIGS. 8a and 8b) an IGU connector may include more than one connector, each connector being used to support a different application of the EC IGU. For example, a 5-pin connector 810 may be used to support EC functionality while a coax cable 808 may support wireless communications (e.g., via window antennas) and an MHL connector 808 (or I2C) may provide a video signal for the transparent display. Some embodiments include wireless power and control, which may, in some cases, obviate the need for one or more wired connectors.

Certain embodiments described herein combine the strength of an existing building operating system (BOS) infrastructure with antennas and display technology for additional functionality. One example of such functionality is providing power for window system components such as window controllers, radio, and display drivers. In some cases available power is provided at about 2-3 W per IGU. In some implementations, EC control communication can be delivered over, e.g., standard 5 wire cable with CANbus and power. For example, a CANBus may be operated at 100 kbps or higher, e.g., up to about 1 Mbps if needed. In some embodiments, an ARCnet network is employed, operating at up to about, e.g., 2.5 Mbps. It may do this in various network topologies including a linear control network. Delivering content for wireless and video requires relatively high bandwidth communication interfaces, which can be made available with window systems that employ wireless transmission, UWB, or the like, each of which can be provide 500 Mbps or higher data rates. Often window system installations have many windows, thereby allowing high data rates, particularly compared to sparse systems with an occasional transceiver as with current Wi-Fi technology.

The aspect of adding a display device to an EC window drives a need for greater communication bandwidth, at least if the display content changes frequently. Bandwidth requirements may be branched into two different products, one for real-time display (e.g., a projector screen replacement) with higher bandwidth, and one for lower bandwidth applications (e.g., signage applications).

Frequently changing content like h.264 video conferencing requires 10 Mbps (Ethernet) data rates for HD quality at 30 frames a second. More static data, like a static advertisement can use the existing data path (CANbus) and available bandwidth (around what's required for glass control) to load the content. The content can be cached, so data could trickle in over an hour, and then the display updates when the frame is complete. Other more slowly changing data like weather feeds, or sales metrics also don't require high-speed data. Table 1 illustrates data communication bandwidths and associated applications.

For signage applications, a transparent display integrated with an EC IGU offers a number of benefits. In some cases, windows may display a "follow me" guidance system to get you to your connecting flight in the most efficient way. This guidance system may be combined with a high accuracy location awareness system that provides personalized services on a display based on the location of a traveler's mobile phone and the traveler's boarding pass for the next flight. For example, the transparent display may indicate: "this way to your next flight, Chuck" on panes of glass as you move along the corridor in the terminal. In another example, personalized displays on glass doors in a grocery store may display what is on special within a buyers preference category. In an emergency, the display windows may indicate safe exit routes, where fire extinguishing equipment resides, provide emergency lighting, and the like.

For real-time displays utilizing higher bandwidth data communication, the following examples are provided. In some cases, a video projector can be replaced with an OLED display and an EC IGU. The EC IGU can then darken the room and/or provide the dark background necessary for good contrast on the display. In another example, windows with transparent displays can replace TVs in commercial and residential applications. In another example, a window having a real-time display can provide real-time health statistics for a patient as one looks through the outside window. In this example, the patient retains the health benefits of natural lighting while a doctor reviews patient's chart. In yet another example, a real-time display can be used outside of a conference room wall to, e.g., display scenery to people passing by as a privacy enhancement mechanism. Privacy provided by the display can augment the privacy provided EC glass may darken over a period. In yet another example, transparent displays can provide augmented heads-up displays in cars or other forms of transportation.

OLED displays or similar (TFT, etc.) components of the EC IGU may have other applications besides providing dynamic graphical content. For example, OLED displays can provide general illumination. A dark window on a winter night simply looks black or reflects the interior light, but by using an OLED display, the surface can match the color of your wall. In some cases, the transparent display can display a scene that is pleasant to a building occupant and provides privacy. For example, a window can display a screenshot of a sunny day from that exact window from a camera integrated into the on glass or onboard window controller. In another scenario, a transparent display can be used to modify the perceived color of light transmitted through the EC lite portion of the IGU. For example, a transparent display may

TABLE 1

Data communication Bandwidths.

| Quality | Resolution | Video Bitrate | Audio Bitrate | Frames Per second | Video codec | h.263 Profile |
| --- | --- | --- | --- | --- | --- | --- |
| Low | 480 × 270 | 400 kbps | 64 kbps | 15/30 | h.264 | Baseline |
| Med | 640 × 360 | 800-1200 kbps | 96 kbps | 30 | h.264 | Main |
| High | 960 × 540 | 800-1500 kbps | 96 kbps | 30 | h.264 | Main |
| HD 720 | 1280 × 720 | 1,200-4,000 kbps | 128 kbps | 30 | h.264 | Main |
| HD 1080 | 1920 × 1080 | 4,000-8,000 kbps | 192 kbps | 30* | h.264 | Main or High | add a tinge of blue to a clear EC IGU, or a little color to a tinted IGU to make it more gray or neutral in tint. Light provided by the display can alter the color and spectrum of the incoming daylight into the room and consequentially the comfort, visual perception, mood, and well-being of the occupant. In some cases, the window control system and be configured to illuminate the room and/or control other light sources (e.g., LED lighting) in a room to alter the color or spectrum of light observed by an occupant. For example, a tintable window may, in some configurations, impart an unwanted blue hue to the occupant's space. In such cases, light emitted from a transparent display and/or another light source can be used to emit specific wavelengths of light to offset the blueness or another unwanted hue in the occupant's space due to the transmitted light from tintable windows. In certain embodiments, control of tintable windows includes control over LED lighting and/or lighting provided by a transparent display to correct this perceived and rendered color to produce an ambient lighting condition that the occupant would prefer. Some techniques using lighting provided by a transparent display and/or other light sources can change the CCT (correlated color temperature) and CRI (color rendering index) of the light in a room to have incoming light-color closer to natural light. Further methods of using interior lighting to improve the perceived color and spectrum light within a building are described in U.S. patent application Ser. No. 15/762,077, filed Mar. 21, 2018, and titled "METHODS OF CONTROLLING MULTI-ZONE TINTABLE WINDOWS," which is herein incorporated by reference in its entirety.

In another scenario, a transparent display can also be used to change the reflected color of light on the walls of the occupant's interior space. For example, instead of looking at various hues of blue on a white wall, the display can be tuned to make that color more uniform using feedback from an inward facing camera of an onboard window controller.

In certain embodiments, the transparent display component of the IGU is used to augment or replace conventional lighting in interior spaces (or exterior spaces if the display is bi-directional). For example, OLED displays can be quite bright, and therefore can be used to light up a room (at least to some degree) as an occupant walks into the space at night (with occupancy sensing). In another embodiment, the transparent display component is used to provide a color controlled light for an art gallery at a museum, e.g., a length of EC glass on one side of a wall used to illuminate artwork on the opposite wall.

Figure 9:
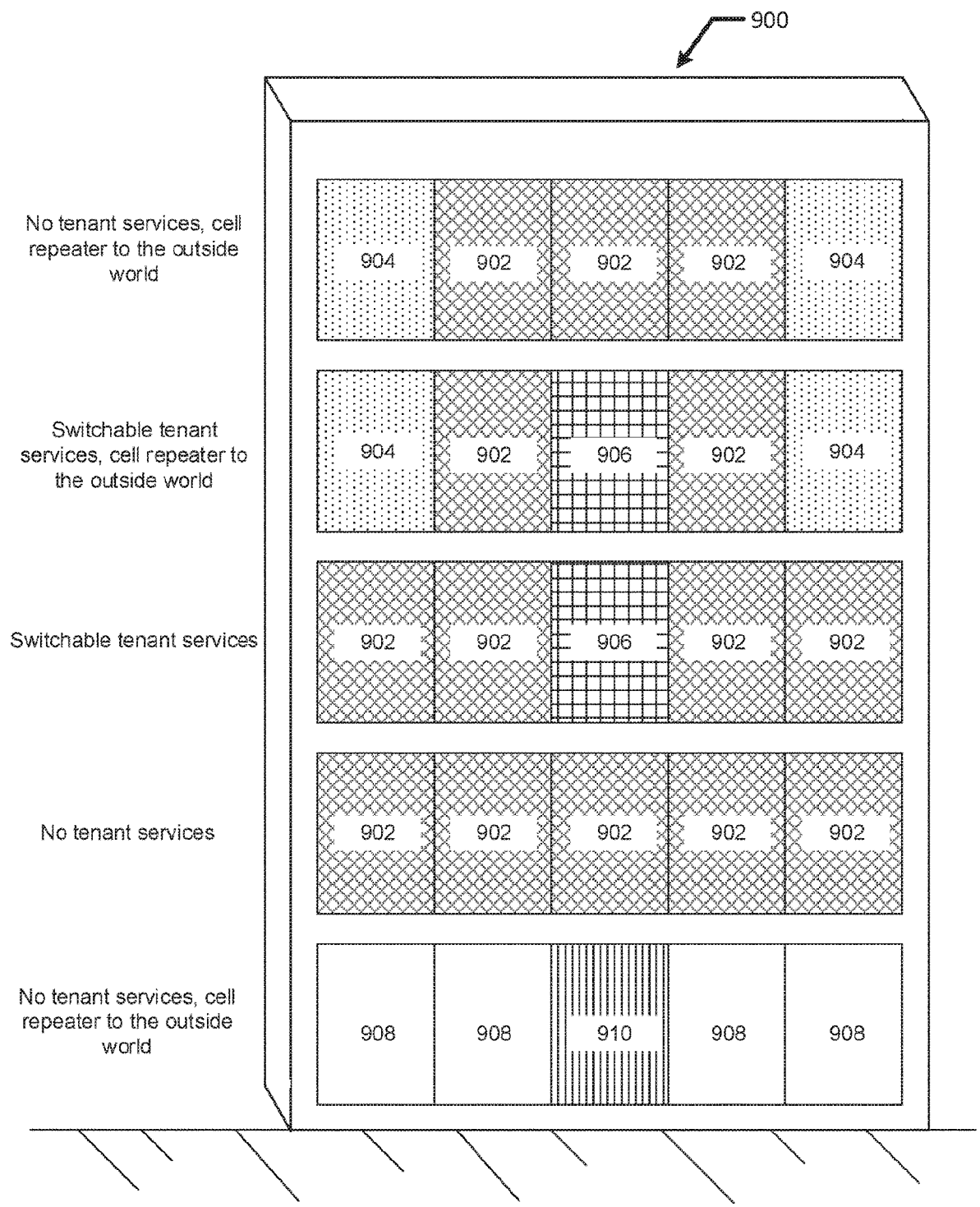
FIG. 9 depicts a façade of a building 900 having IGUs with various capabilities

A curtain wall of IGUs may all have transparent display technology or may be a mixture of IGUs, some with and some without transparent display technology. FIG. 9 depicts a façade of a building 900 having IGUs with various capabilities. IGUs labeled 902, 904 and 906 are for EMI blocking. IGUs labeled 904 and 910 are configured to provide cellular communications to the outside world, and IGUs labeled 906 and 910 are configured to offer WiFi and/or cellular services to occupants within the building. IGUs labeled 908 only are configured for EC tinting and do not block wireless communications.

In the example depicted in FIG. 9, the top floor tenant either wants to be isolated from the outside world or will provide their own communications (a cable modem for example). The building owner may, e.g., lease the outward facing antennas (904) to the local cellular company as repeater towers. The fourth-floor tenant may want cellular services in the building and control when they are available. The inward facing antenna (906) emanate signals into the building on demand, but blocks exterior signals. The source of the signals may be the two outward facing cellular antennas (904). The third-floor tenant wants to block all outside signals, but offer WiFi and cellular services to occupants (906). The second-floor tenant wants complete isolation, they may have their own hardline (e.g., cable modem) connections, but otherwise are isolated. The ground floor is a lobby, EC glass (908) allows exterior signals to pass through the glass, as well as offering a cellular repeater (910) to boost the available signals in the common area of the building.

Environmental Sensors:

In some embodiments, an IGU may be equipped with environmental sensors for air quality monitoring. For example, an IGU may have one or more electrochemical gas sensors that transduce a gas concentration into a current flow through oxidation and reduction reactions between the sensor and the sensed gas. In some embodiments, metal oxide gas sensors may be used. Metal oxide sensors monitor a sensed gas concentration as function of electronic conductivity at the sensor. In some cases, an IGU may be able to sense one or more of the six criteria pollutants (carbon monoxide, lead, ground-level ozone, particulate matter, nitrogen dioxide, and sulfur dioxide) that are monitored by the US national ambient air quality standards (NAAQS). In some cases, IGUs may be equipped with sensors for detecting less common pollutants if there is a specific safety concern at an installation site. For example, in a facility for semiconductor processing, sensors may be used to monitor for fluorocarbons or to detect chlorine gas. In some cases, a sensor may detect carbon dioxide levels as a form of occupancy sensor, e.g., to aid window control logic to determine heating and cooling needs of the interior environment.

Figure 10:
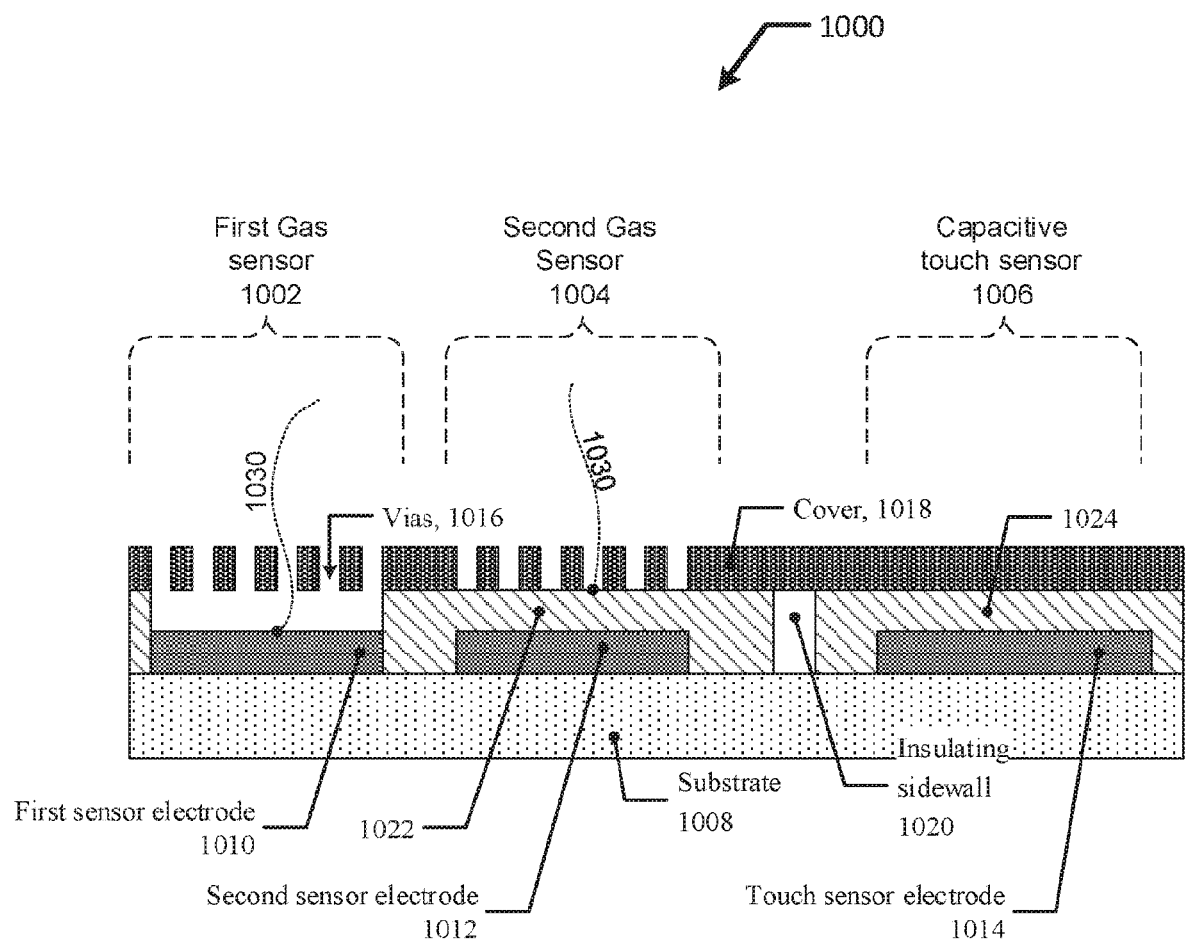
FIG. 10 depicts an atmospheric gas sensor that may be located on or associated with an IGU

FIG. 10 depicts a cross-sectional view of an example atmospheric gas sensor that may be located on an IGU. The environmental sensor 1000 includes one or more first sensing units 1002 and one or more second sensing 1004 units disposed on a substrate 1008. A cover 1018 may be disposed over the first and second sensing units to protect sensing units from large particles. Vias 1016 in the cover allow chemical particles 1030 to pass and be detected by the sensing units. The first sensing unit 1002 senses chemical particles when particles pass through the vias 1016 and adhere to the first sensor electrode 1010, changing the electrode's resistance. The second sensing unit 1012 has an insulating layer 1022 between the second sensor electrode 1012 and the cover 1018 and senses a capacitance change when chemical particles pass through the vias and adhere to the insulating layer 1022. In some embodiments, the environmental sensor is also integrated with a capacitive touch sensor 1006, where the insulating layer 1024 between the touch sensor electrode 1014 may be the same material as the insulating material used for the second electrode 1022. In some cases, insulating layers used for a capacitive touch sensor and a second sensor unit 1022 and 1024 are deposited during the same operation. In embodiments where a touch sensor is integrated with an environmental sensor, an insulating sidewall 1020 is used to prevent the chemical particles from diffusing into the region near the touch sensor electrode 1014. Electrodes for the first and second sensing units may be made from materials such as Graphene, Carbon Nano Tube (CNT), Silver Nano Wire (AgNW), Indium Tin Oxide (ITO), etc. In some cases, the same material used for a transparent conductive layer in an electrochromic device can be used as for an electrode of the sensing unit or the touch sensor.

In some embodiments, an environmental sensor may be located on an interior surface or an exterior surface of an IGU. The sensor units may be very small such that even if they are made with opaque materials they can still be inconspicuous. For example, the area of the first sensor electrodes and/or the second sensor electrodes may be between about 1 µm and about 10 µm, or in some cases between about 10 µm and about 100 µm. In some cases, the substrate of an environmental sensor may be located on or embedded in a lite of an IGU. In some embodiments, the sensor is fabricated directly on top of an electrochromic device, and in some cases, an environmental sensor may be integrated into a transparent display (e.g., an OLED display) as described herein where capacitive touch sensors provide a means accepting for user input of a GUI provided by the transparent display. In some embodiments, an environmental sensor may be fabricated separately from an IGU and then may be bonded or attached to the interior surface, the exterior surface, or the frame of an IGU. The sensor may be part of the window controller architecture; e.g., a window controller may be part of the window assembly. In some cases, sensors are located on or associated with on glass controllers which are described in U.S. patent application Ser. No. 14/951,410, titled "SELF-CONTAINED EC IGU" and filed on Nov. 24, 2015, which was previously incorporated in its entirety. In some cases, a sensor is located on a frame, mullion, or adjacent wall surface. In certain embodiments, sensors in mobile smart devices may be used to aid in window control, e.g., as inputs to window control algorithms when sensors are available in smart devices also having window control software installed.

When installed, an environmental sensor is electrically connected to a window controller or another controller having logic for collecting and processing data from the first sensing unit(s), the second sensing unit(s), and/or capacitive sensor(s). When located on an IGU, an environmental sensor may be electrically coupled to a controller via conductive lines on the surface of a lite that connect to a pigtail connector. As described elsewhere, pigtail connectors provide a plug interface for electrically connecting a window controller to an electrochromic device, window antennas, and/or other sensors and electrical components of an IGU.

An environmental sensor may have a high sensing performance and be able to discriminate between various gas pollutants. For example, the first sensing unit may be reactive to first and second particles, while the second sensing unit may be reactive to second and third particles but not the first particles. In this example, the presence of each of the first, second and third types of chemical particles in the air can be determined by evaluating a sensed response from the first sensing unit(s) in combination with the second sensing unit(s). In another example, if a gas sensor has cross-sensitivity to a plurality of gasses, it may be difficult to determine what gas is being detected from a single type of sensing unit. For example, if the first sensing unit has a strong sensitivity to chemical A but is less sensitive to chemical B, the sensing logic may be unable to determine whether chemical A is present in a low concentration or chemical B is present in a high concentration. When a second sensing unit is also used and has a different sensitivity to chemicals A and B (e.g., being more sensitive to chemical B than to chemical A), then gas sensing logic may be able to discriminate between the gasses. If the second sensing unit is located adjacent to the first sensing unit, it may be assumed that the concentration of a sensed gas is similar at both units, and then the sensitivity difference of the two units may be used to discriminate between the two or more chemicals. In some cases, there may be three or more types of sensing units on an IGU which may be used by sensing logic to discriminate between air pollutants. In some cases, an IGU may have multiple gas sensors to compensate for sensor drift or instabilities.

Advanced Network Architectures:

FIG. 11a depicts the network architecture of current and commercially available window control systems. Each EC window has a window controller (WC), which in turn communicates with a network controller (NC), which in turn communicates with a master controller (MC). Communication and control can be done wirelessly, via a mobile app and/or via the cloud. Power is provided to windows through a trunk line cabling system, which is modular and has a plug-n-play interface. In some cases, EC windows are controlled based on sensor readings, e.g., based on the measured light intensities or based on measured temperatures. In some cases, windows are controlled via user input provided using the control application. In other cases, windows can be controlled based on the logic that considers the context, intensity, and angle of incident light. Once the desired tint level is determined, the drive commands tint the EC glass accordingly. In addition to automatic control based on local sensors an manual control provided through the control application, Applicant's operating system can take into account information provided by weather services, an occupant's physical location, and/or an occupant's schedule when determining the appropriate tint level for the window. Tint level adjustment may be performed in conjunction with indoor LED light luminosity & color adjustments and temperature control.

FIG. 11b depicts an embodiment having a proprietary cloud-based software that supports a window control network. The cloud-based software can store, manage, and/or process basic functions such as sensing light, sensing air, sensing water, applying proximity context, executing tasks, controlling peripherals and providing an open interface for other applications. Transparent displays on the electrochromic windows enhance the user experience by allowing users to interact directly with the glass, rather than using a mobile device or wall unit. By including atmospheric sensors (not depicted) controllers may analyze air, water, light along with the occupant's context and/or personal data to create a personalized user experience. Glass controllers can create mesh networks with other digital systems in the building including LED lights, HVAC, and air filters. The glass controllers can work in conjunction with these systems to keep an optimal ambient environment within the building and act as 'data wall' between indoor and outdoor environments. Proximity detection and user recognition that is sensed or provided by user input can trigger glass personalization. The glass network specific internet-hosted software interacts via the cloud with, e.g., commercially available IoT digital systems, such as Nest, FB, Predix, IBM Watson++, etc. to augment and create integrated glass functions, including end-to-end data security and an IoT LTE network. Further embodiments include, partner eco-system powered glass functions within their application like building automation apps (e.g., Honeywell, J&J controls), workplace apps (e.g., iOffice), service and ticketing apps (e.g., Service Now, personalization apps (e.g., IFTTT), IoT ecosystem—asset tracking (e.g., Oracle IoT cloud), Smart Lighting (e.g., Bosch, Philips, GE), Digital Ceiling (e.g., Cisco) and the like.

Figure 11F:
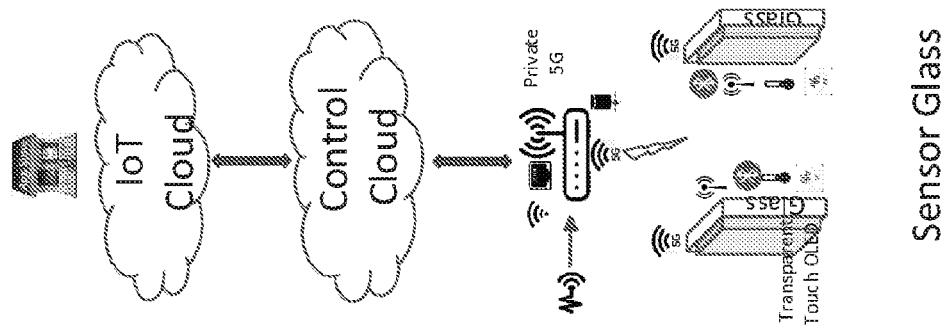
Figure 11E:
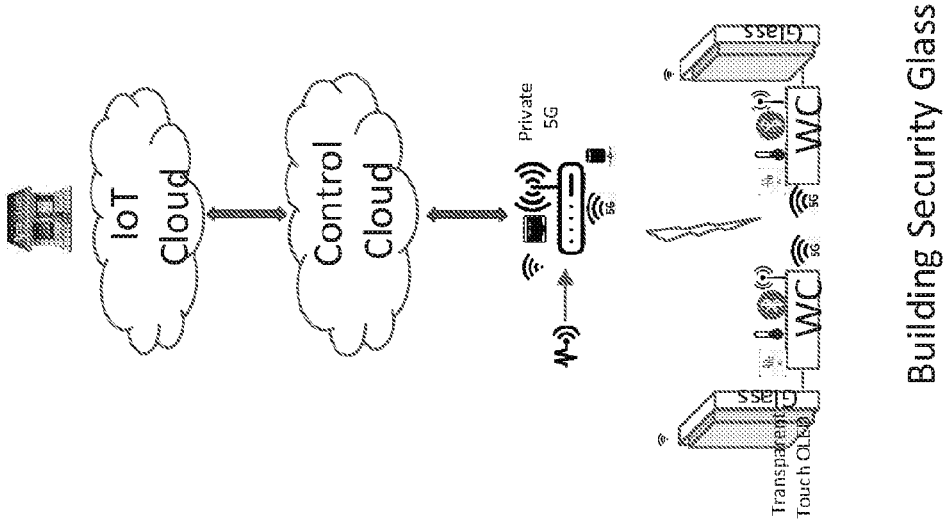
Figure 11D:
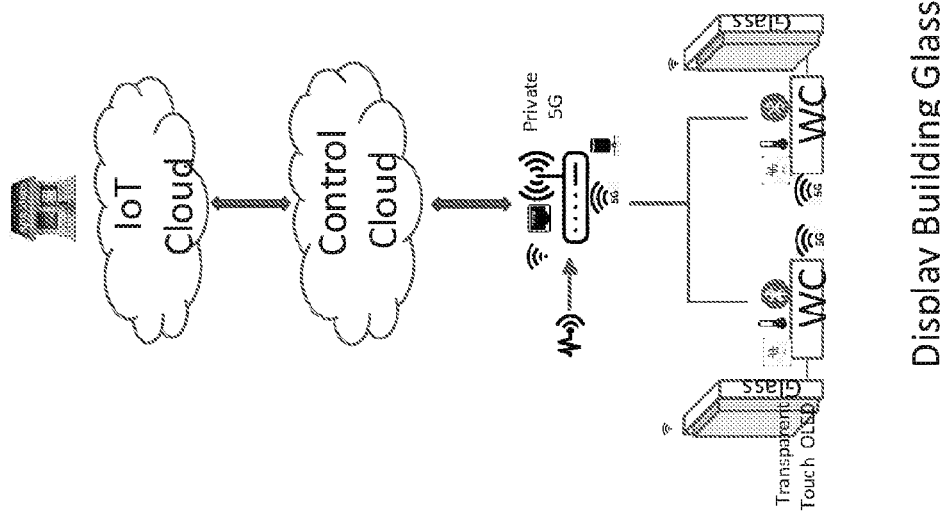

FIG. 11c depicts a network architecture where the electrochromic glass is 5G enabled. As in FIG. 11b, the EC glass includes on-glass control, e.g., transparent display controller on surface 4 (occupant side of the window) as depicted. FIG. 11d depicts the same architecture as in FIG. 11c, but in this case, the transparent display is large, substantially covering the viewable portion of the window on surface S4. This architecture may include, as in previous embodiments, auto personalization of glass upon proximity detection of the occupant, asset location tracking near the glass, etc. using, e.g., proximity and motion sensors. Having 5G network speed from glass to the cloud enables high bandwidth applications like full-HD display technology.

A full HD Display on (or as) the inner glass surface allows for various digital content to be displayed. Displayed digital content may include, e.g., signage, communication, a work collaboration space connected to a personal computer, or graphical user interfaces (GUIs) for controlling windows, sensors, or HVAC systems. In certain embodiments, e.g., in signage applications, there is a transparent LED Mesh on surface S1 (not depicted) displaying signage to those outside the building, while still allowing for occupants to simultaneously see out of the building. Adjusting the EC glass component of the system allows for contrast control for inward and/or outward projecting transparent display technology. In one embodiment, a two-way transparent display on, or as S4, is used both for inside occupant display as well as signage for those outside the building. In one example, office buildings windows are used for occupant needs (e.g., providing a display, providing control functions, and communication), during business hours, but used for external signage during non-business hours.

Having such capabilities greatly expands the utility and value of building windows/facades. In another example, some of the windows or areas of individual windows are used for signage, and simultaneously other windows or areas of individual windows are used for occupant display, communication and control functions.

In some embodiments, a controller such as a master controller in the network may include a CDN proxy for signage content for local playback. Any controllers of the window control system (e.g., a master controller, network controllers, and/or leaf controllers) may contain a 5G LTE network controller.

In some embodiments, the IGU is configured with an RF modulator module for Wi-Fi, GSM blocking/allowing. As depicted in FIG. 11e, this enables drone-safe buildings. As in previous embodiments, this architecture can include embedded sensors (BLE, RF, proximity, light, temperature, moisture, 5G) on, in, or around the IGU, as depicted in FIG. 11f. The IGU's window controller (e.g., an onboard controller) may be wirelessly powered (as illustrated by the lightning bolt in the figure). This enables plug & play intelligent glass powered over a 5G network.

In some embodiments, the transparent display and/or another transparent layer, includes photon cells (a type of photonic memory cell), which are capable of storing not only power (photovoltaic function) but also information. A network of photon cells can enable onboard control where the window controller logic circuit is configured as a transparent grid, thus allowing for "sensor glass." The transparent grid window controller can be self-powered and mesh with other windows in the network as a true plug and play system. The transparent window controller may or may not be integrated or part of the transparent display component. One embodiment is an electrochromic IGU with a transparent on pane window controller which receives power through photovoltaic cells.

Figure 11G:
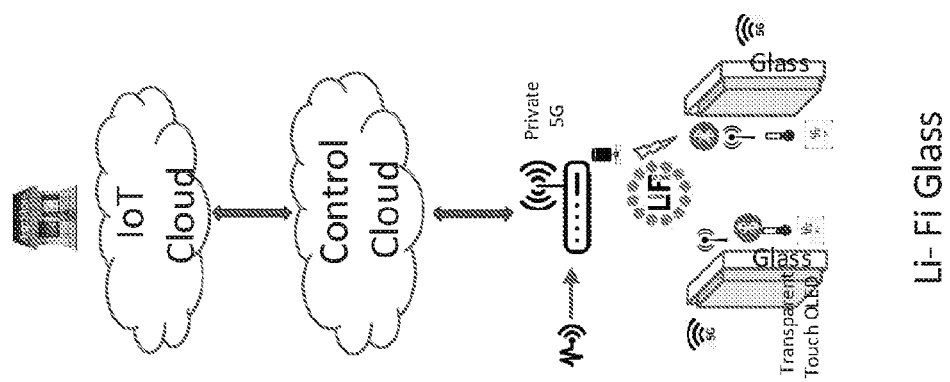

In some embodiments, the IGU is configured with Light-Fidelity (Li-Fi) wireless communication technology, as depicted in FIG. 11g. Light Fidelity is a bi-directional, high-speed and fully networked wireless communication technology similar to Wi-Fi. It is a form of visible light communication and a subset of optical wireless communications (OWC). In certain embodiments, Li-Fi is used as a complement to RF communication (Wi-Fi or cellular networks), while in some embodiments Li-Fi is used as the sole means of data broadcasting to and from the IGU. As Li-Fi carries much more information than Wi-Fi, it allows for virtually unlimited bandwidth for communication between the IGU(s) and the control system.

Using Li-Fi enables radio free buildings, e.g., to obviate occupant exposure to RF radiation. A Li-Fi powered glass network provides ultra HD to devices inside the building (including the transparent display component(s) of the IGUs described herein) paired with high-speed external radio networks.

Use Cases:

The following description illustrates use cases associated with embodiments described herein. The description below may also include further embodiments. The architectures, configurations, hardware, software, etc. described herein allow for greatly expanded capabilities of building glass which therefore makes the building façade far more useful and valuable, e.g., not only to save energy, but also to increase productivity, promote commercial markets, and enhance occupant comfort and well-being. In the description below the term "the glass" may be used to mean the control network, the system architecture, the window controller, interchangeably, to simplify the description. One of ordinary skill in the art would recognize that, along with the hardware, software, network and associated embodiments described herein, that "the glass" means the appropriate systems needed to perform whatever function is described in the particular use case.

Proximity & Personalization:

The IGUs and glass control architectures described herein detect the proximity of the occupant near the glass (e.g., via a proximity sensor on the window controller) and control the ambient environment (e.g., window tint, lighting, HVAC of the area where the user currently is) to the occupant's preferences. For example, occupant preferences provided by the occupant or learned from previous encounters with the occupant can be stored by the window control system. The glass network can integrate with the BMS as well as the occupant sensor networks (e.g., Nest, Hue, SmartThings, as well as activity networks, e.g., IFTTT) and has a cloud-based intelligent rule engine (e.g., a glass IFTTT rule engine) for determining the right ambience parameters as well as actions and timing based on the occupant's activity.

Figure 12A:
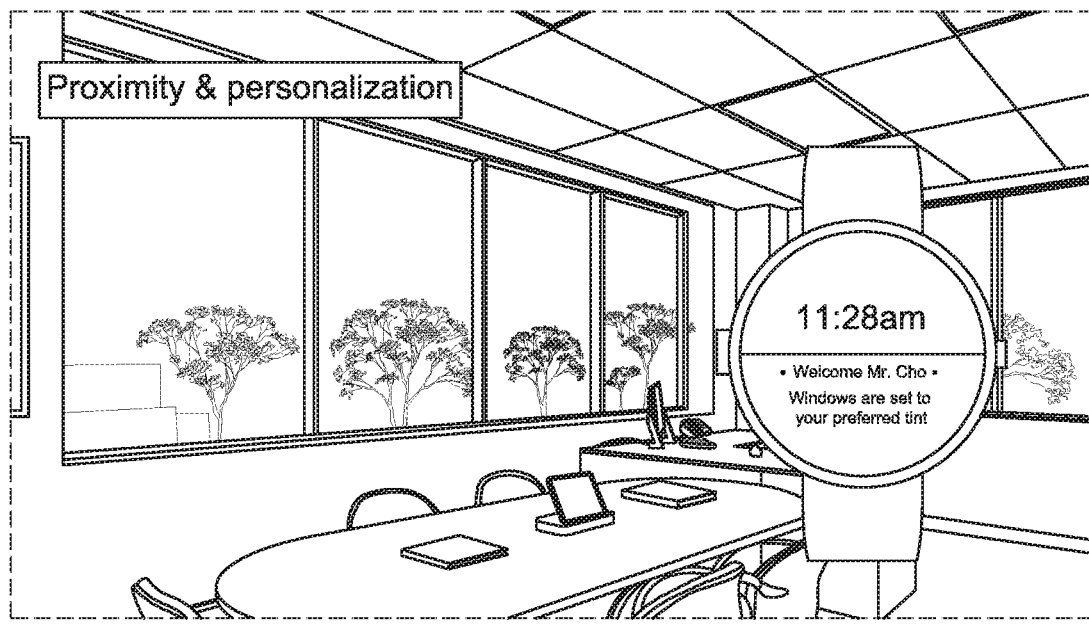
FIGS. 12a-12c illustrate example graphical user interfaces used in conjunction with proximity and personalization services implements on optically switchable windows.
Figure 12B:
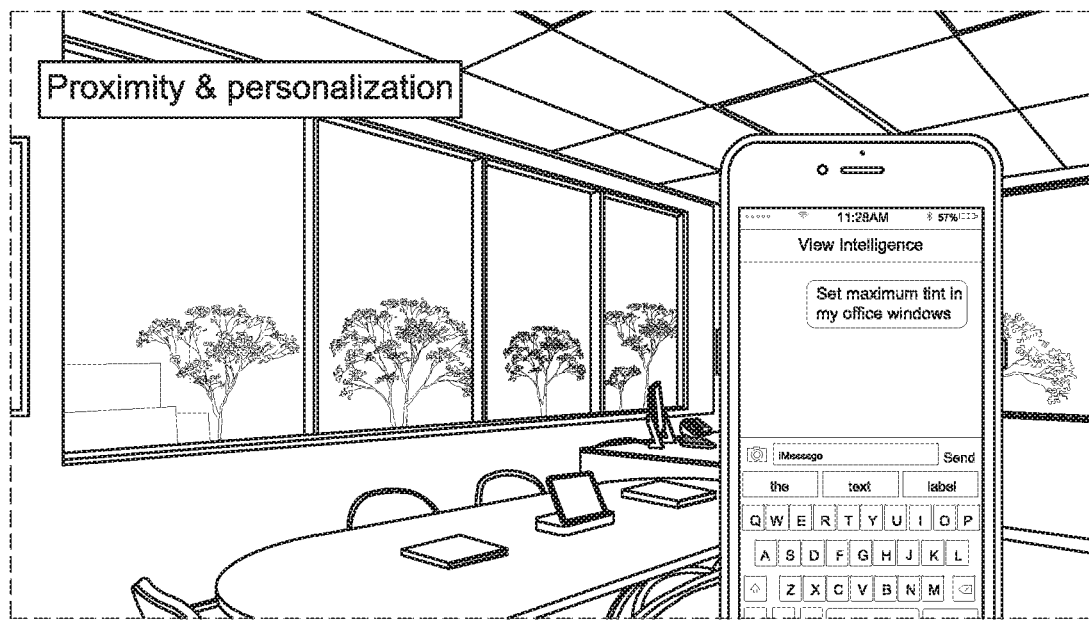
Figure 12C:
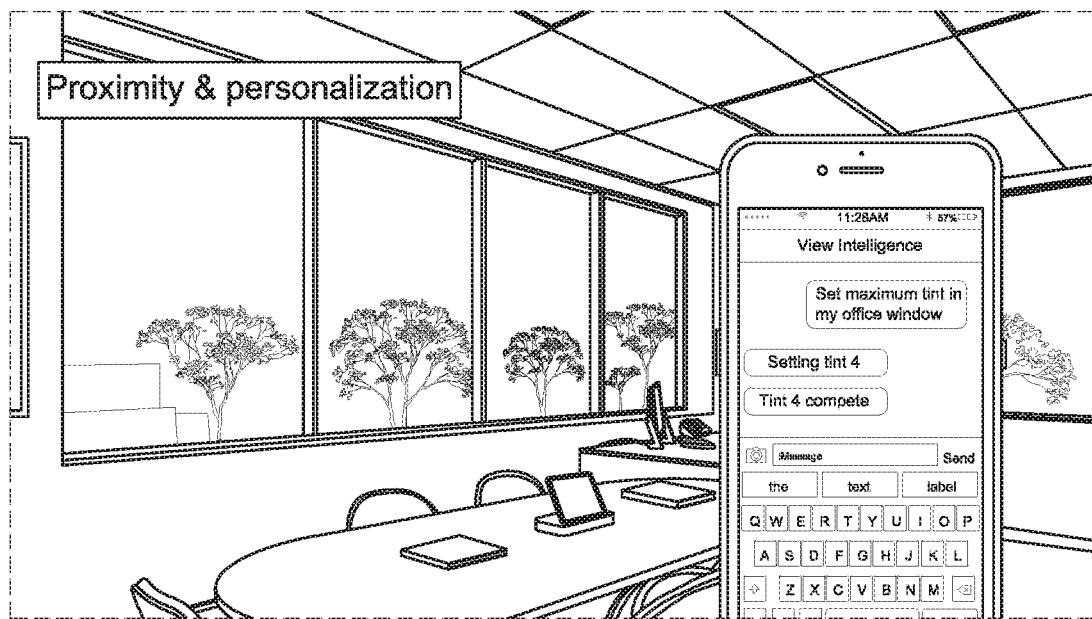

The glass provides a personalized communication channel across natural language voice commands and messaging bots (e.g., text messages, instant messaging, chat, email and the like) to get information about the ambient environment as well as set the ambient environment to the occupant's preferred settings. Full HD displays integrated into the IGUs enable these personalization channels to drive specific content on glass panel for enabling collaboration as well as communication. The glass is mapped to a building network, personal area network and IT-app context network cloud to drive seamless proximity and personalization to users. Some examples of proximity-based communication channels are illustrated in FIGS. 12a-12b.

Figure 13:
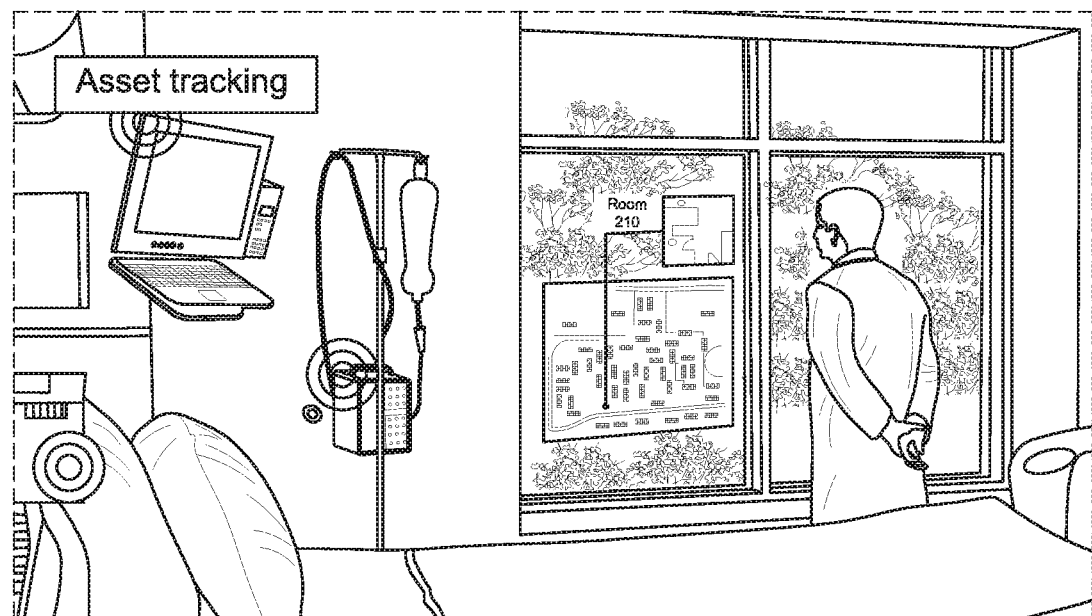
FIG. 13 illustrates a window with a transparent display configured for asset tracking.
Figure 14A:
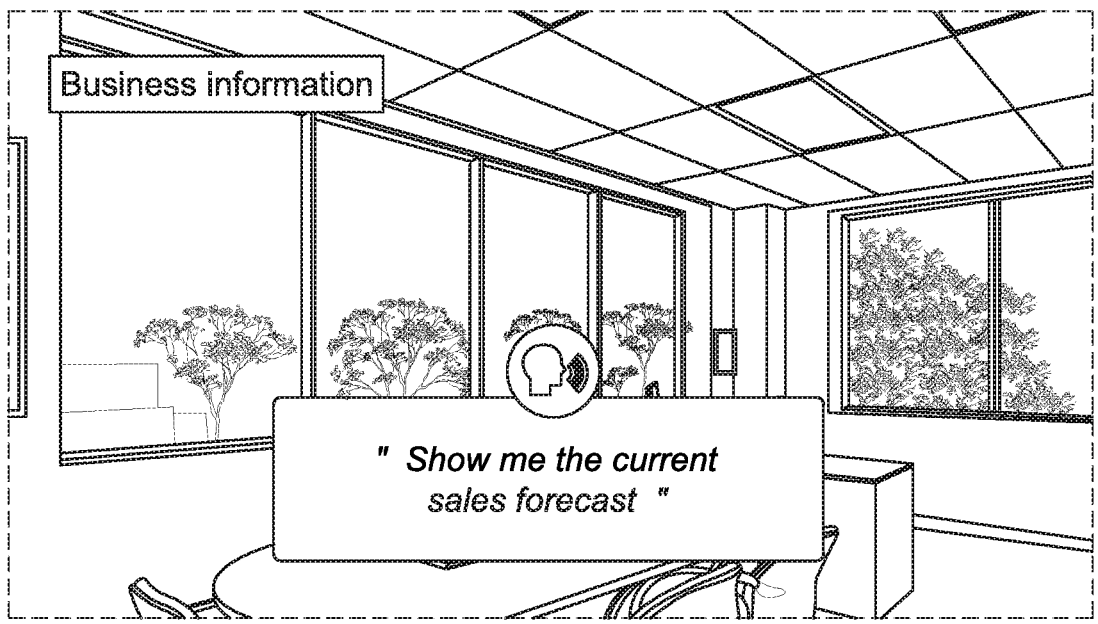
FIGS. 14a-14e depict windows with transparent displays used for business, collaboration, video conferencing, and entertainment purposes.
Figure 14B:
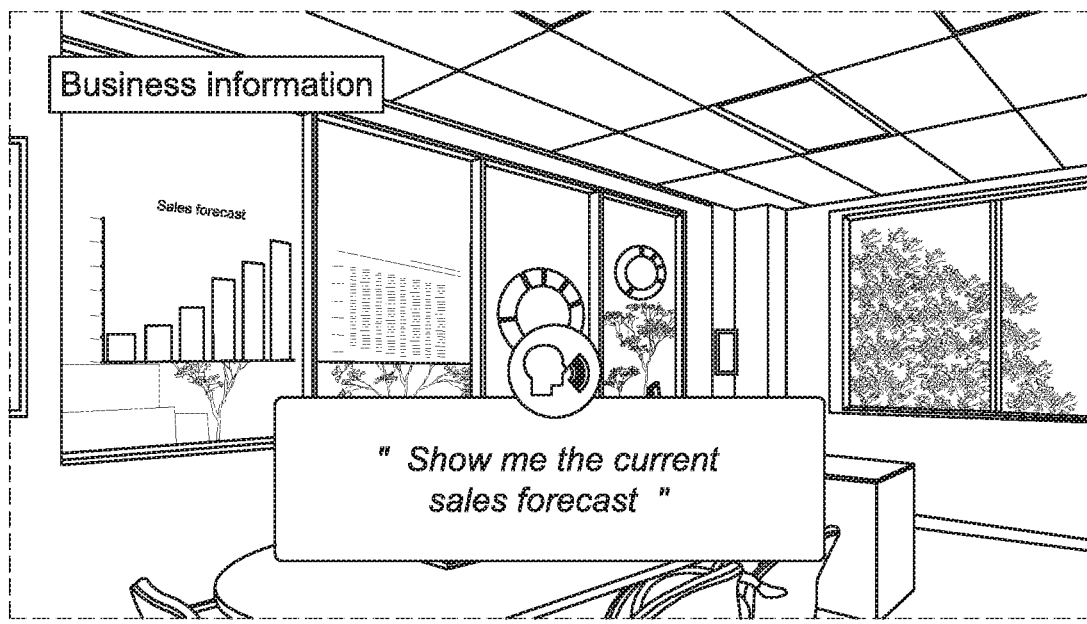
Figure 14C:
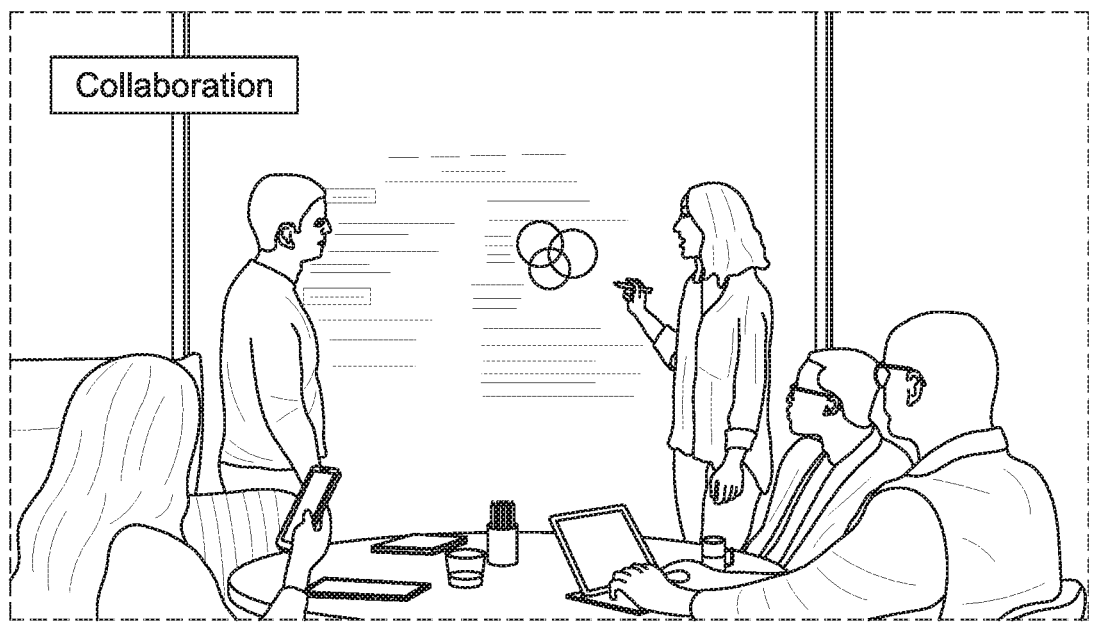
Figure 14D:
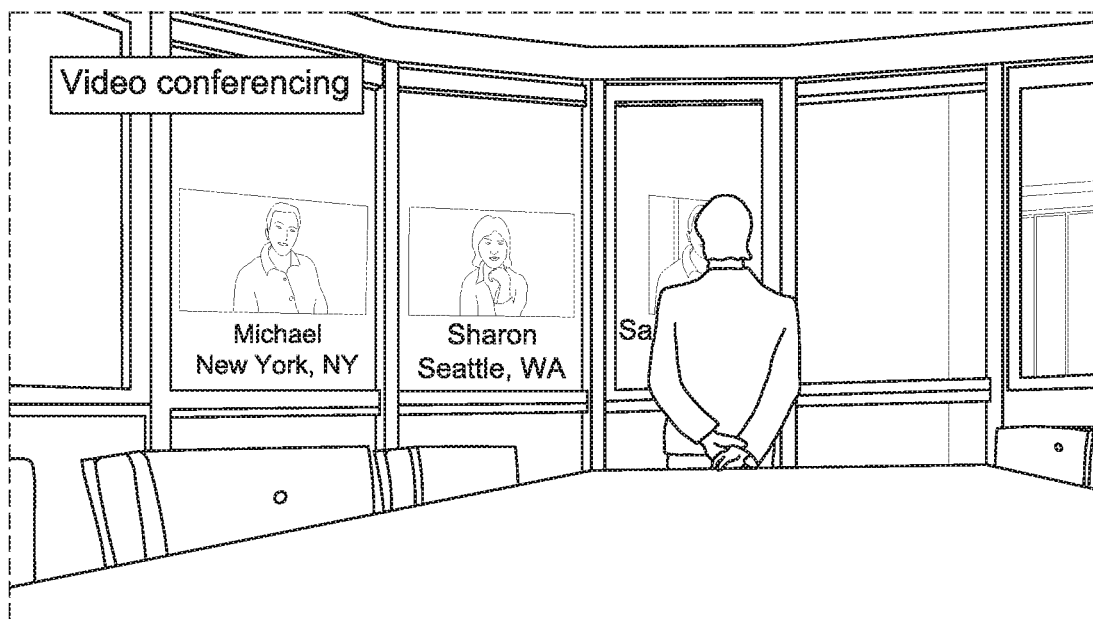
Figure 14E:
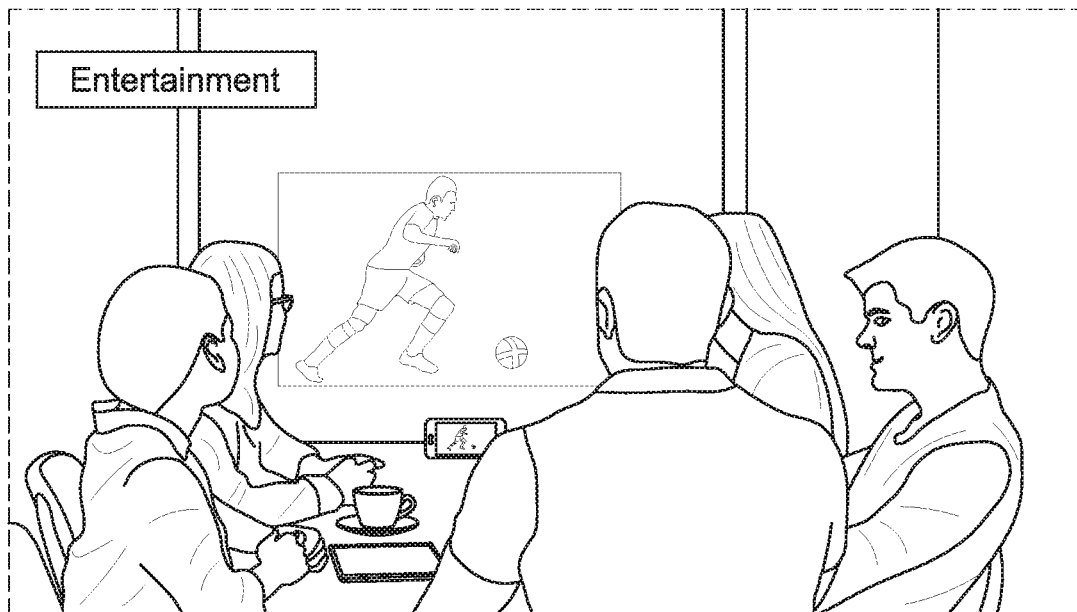

In another case, in a hospital setting, the glass can be programmed with a patient's care plan data. This is illustrated in FIG. 13. That along with sunlight information allows the glass to set the appropriate tint level of the glass, with or without augmentation by the transparent display component and/or interior lighting and HVAC, to create an ambient environment that is best suited for the patient's recovery. Moreover, the glass can change the ambient environment based on the visiting doctor's preferences, or a balance between what the doctor prefers and the patient needs. The doctor's visit may be scheduled, and thus the glass can make changes in anticipation of the doctor's visit or nurse's visit. The transparent display can be used by the medical practitioner to bring up the patient's medical records, order a prescription medication, confer with a colleague via video conference, display x-rays, play a prerecorded presentation or tutorial for the patient, etc. The doctor may also use the glass to find and/or track assets, such as a crash cart or other medical supplies needed for the patient. The doctor may also use the glass to find a colleague, set up a meeting with the colleague or call the colleague to the patient's room for a consultation. In another example, the doctor may arrive at the patient's intended room before the patent and use the glass to identify where the patient is. For example, it may be the case that the patient has not left surgery, has been taken to the x-ray facility or for physical therapy, is in the lobby with family, or is in the nursery visiting their newborn baby. The doctor may use the glass to call the patient back to the room, or simply wish them well.

In another example, in an office setting, a meeting schedule may allow the glass to control the ambient in a meeting room, including appropriate light and heat levels, considering occupant's personal preferences as well as taking into account how many occupants will attend the meeting, if there will be a presentation, etc. The glass may automatically order lunch for the attendees based on their preferences (e.g., based on other apps that the glass interacts within the cloud) such as favorite foods, local restaurants, known food allergies, etc. Moreover, the glass may also automatically block telecommunications into and from the meeting room if the meeting is about highly sensitive matters. The glass can obviate the need for projectors and screens in the meeting room. The glass itself can be used as the presentation medium for displaying slide presentations, video conferencing, whiteboard functions having read/write capabilities and the like. In this latter function, using HD displays and high-speed communication protocols, the notes written on the glass can be simultaneously transferred to attendees personal computing devices, whether in the meeting room or remotely situated. The transparent display may, e.g., be enabled for a wide spectrum of colors for such note-taking. As seen from these examples, the glass becomes a "digital skin" of a building, serving as an environmental shield, a telecommunications hub, a productivity enhancement, etc. Some examples of transparent displays being used for business, collaboration, video conferencing, and entertainment are shown in FIGS. 14a-14e

In another example, the glass can interact with other systems such as IBM Watson. In some cases, the window control system can use sensors for monitoring real-time building temperature or moisture data to create localized weather pattern data that can be pushed to the cloud. In some cases, this data can also aide in weather prediction, e.g., in collaboration with other buildings equipped with the glass. As illustrated in, e.g., FIGS. 14a and 14b, the glass may include a natural language translation system. Also, the glass has a cloud-to-cloud integration. This allows the transparent display to interact with an occupant's other apps, enabling collaboration and communication using a programmable rules engine. In this example, ambient light and temperature control are coordinated with the building's BMS, and buildings can interact with each other. For example, if a building on the west side of town encounters a rainstorm or cold front, this information can be communicated to a building on the east side of town, which can then adjust the HVAC and/or glass in anticipation of the storm or cold front.

Service Optimization:

Glass with transparent displays are listed as a digital asset in service management systems providing full-service lifecycle management during deployment and operations phase for seamless integration of the glass' operational management. This is achieved by integrating the glass' location and identification hierarchy into existing service lifecycle management clouds like ServiceNow.

Industrial Automation:

Glass equipped with a transparent display can be integrated into an industrial workflow automation cloud as an ambient control digital asset. The glass provides an interface for control and feedback into business operation workflow systems providing best ambient conditions for that workflow. For example, a tint level for an eye specialist's windows may be different than the tint level for a patient room and tint setting for an unoccupied patient room. In another example, an industrial process requires low lighting during a particular chemical processing phase due to the sensitivity of the reactants to light or heat. The tint level and/or UV blocking of the glass is adjusted to account for the sensitivity during that process flow or, e.g., in that part of the building where the flow is happening. During periods when the flow is not happening, the glass changes the ambient conditions for improved lighting or other desired conditions. In another example, the glass is typically in a dark tint in a computer server facility to reduce the heat load on the servers. If a server malfunctions, the occupant can be notified by the transparent display on the glass. The glass can display the location of the malfunctioning server to the service technician, and the system may clear the glass near the malfunctioning server to provide lighting for the technician during repairs or replacement of the server. Once the server is back online, the glass may adjust the proximate windows back to their tinted state to once again protect the servers from heat load.

Efficient Workplace:

The glass in a building (e.g., in conference rooms, cafeterias, common areas, executive suites, etc.) provides a distributed network digital nodes integrated into workflow applications like email, calendaring, messaging (IM, email, text, providing policy driven ambient control for workforce as part of their workday. When an occupant moves from a first room to a second room, items displayed via a transparent display to a user on in the first room may then be displayed to the user via the glass in the second room after authenticating the user. This allows users to easily access their own digital content while moving around the building.

Figure 15A:
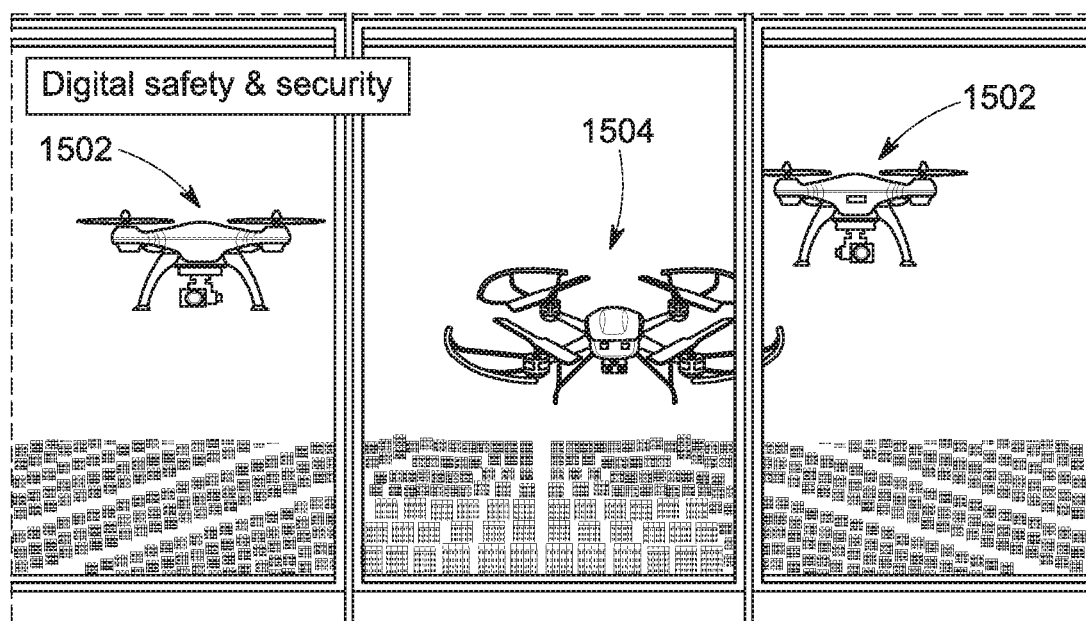
FIGS. 15a-15c illustrate a window network configured to selectively deter unauthorized drones from flying around a building via window tinting and wireless communication jamming.
Figure 15B:
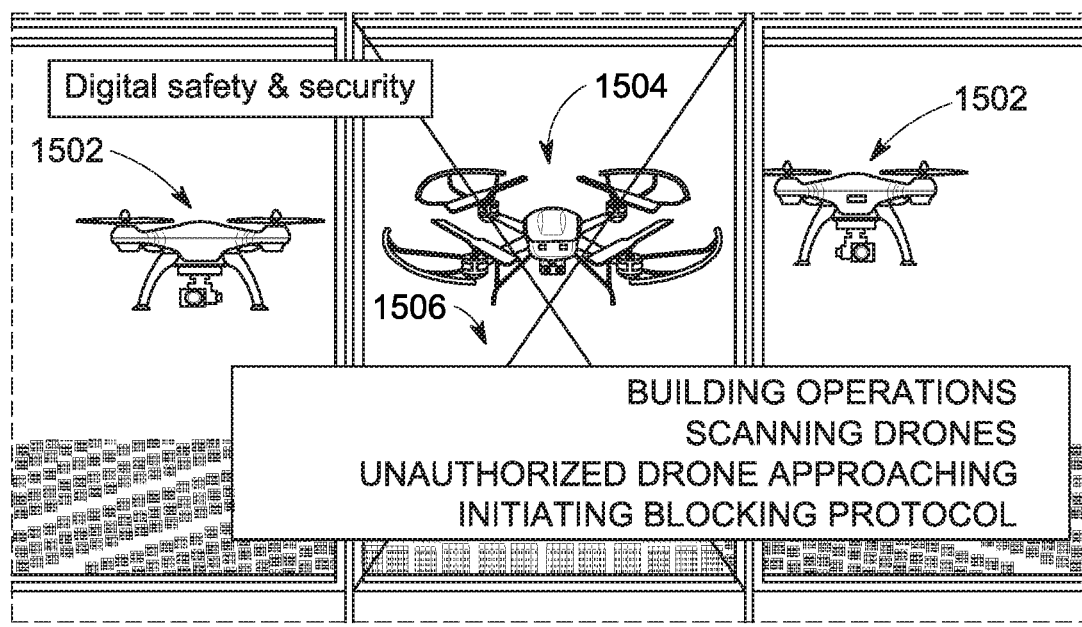
Figure 15C:
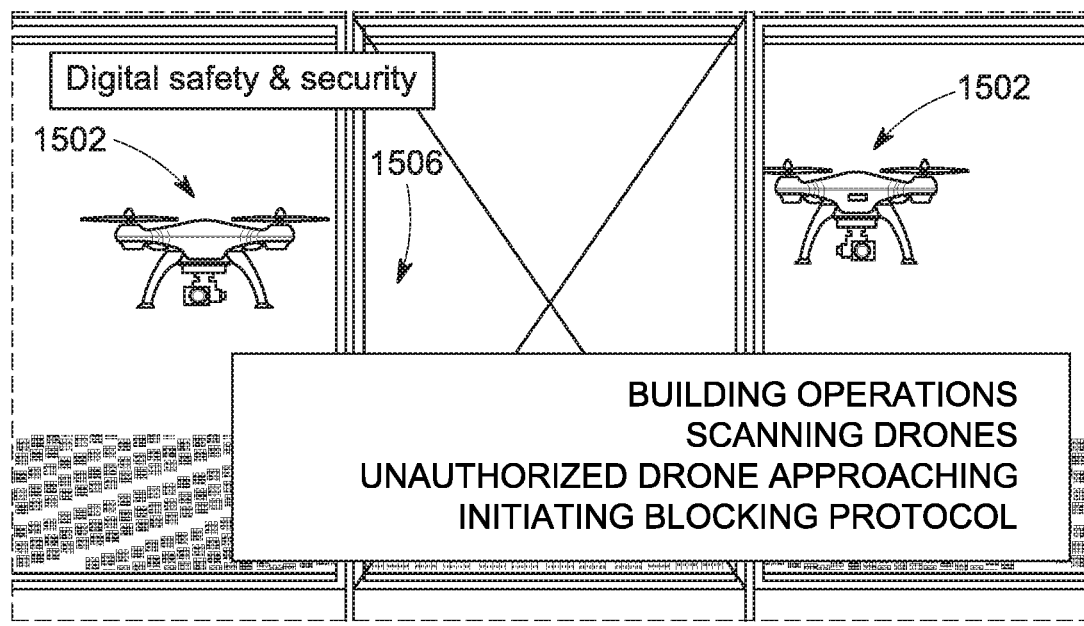

Glass Mesh Network:

The glass surface will serve multiple functions. In one embodiment the glass acts as a power generating membrane, e.g., transparent solar cells and/or photovoltaic cells convert sunlight into electricity for powering the glass. In another example, the glass serves as an RF grid, capable of receiving and transmitting omnidirectional RF signals based on configured policies. If photon cells are used, they can store information and/or power enabling a number of embodiments (e.g., self-powered windows, and wireless communication and power distribution networks). In some cases, digital security can be enabled via transmission of high-frequency RF waves around the building skin to protect against unwanted RF signals leaving the building (and hence data leakage) to any receiver outside building as well as seizing RF communication for external RF communication driven by drones and other UAVs. The glass can also trigger the blocking action via an automated drone gun integrated into the glass or, e.g. in a rooftop sensor of the building. FIGS. 15a-15c depict an interaction between glass and friendly drones 1502 and a non-friendly drone 1504. In FIG. 15a drones 1502 and 1504 approach the glass and drone 1504 is identified as hostile. This could be, e.g., because the drone is trying to transmit signals into the building and/or take pictures of the interior of the building. As depicted in FIG. 15b, the glass 1506 can darken to block visual penetration into the building and/or it can transmit RF signals to jam the drone's operation and knock it out of the sky. This drone defeating mechanism can be done selectively, as each window may have this capability. The glass can thus remove the offending drone while leaving the friendly drones to go about their work as shown in FIG. 15c.

Figure 16A:
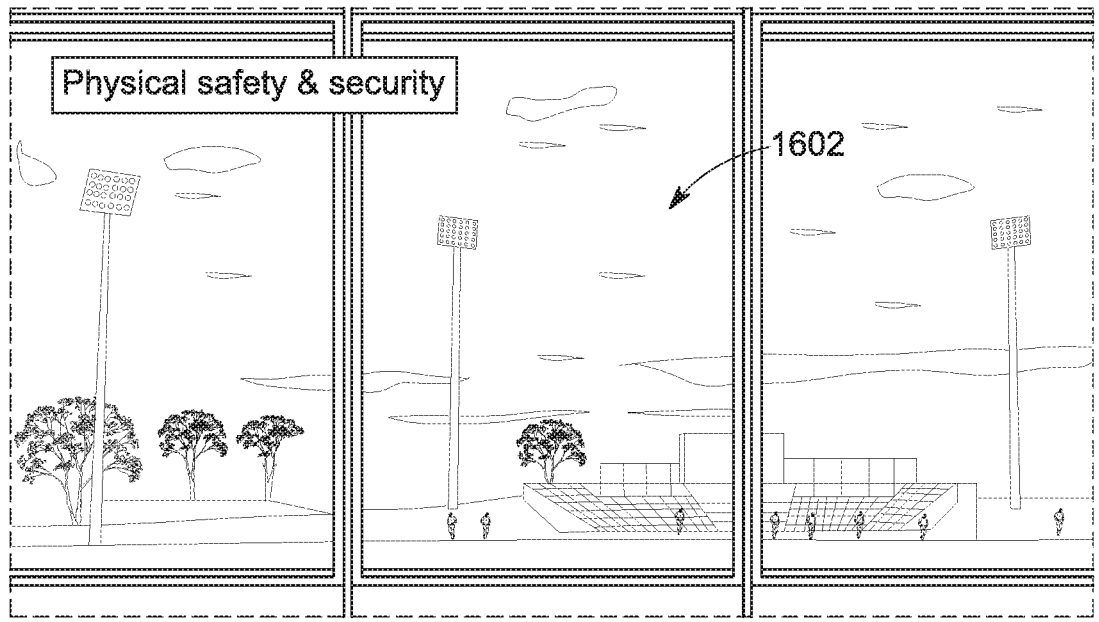
FIGS. 16a and 16b depict windows configured to detect security and/or safety threats.
Figure 16B:
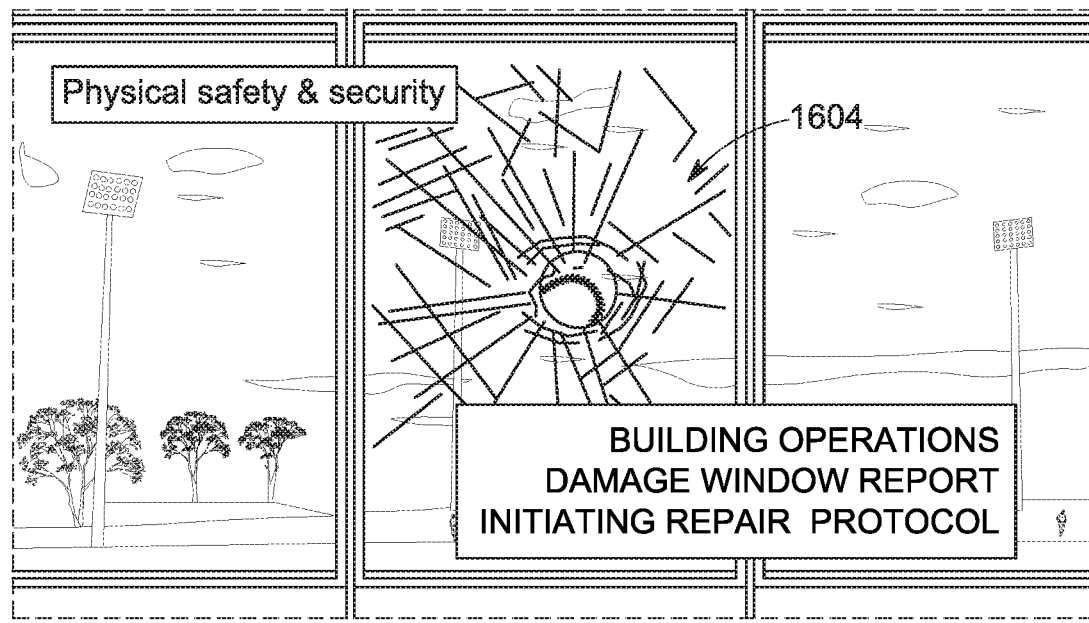

In some embodiments, the glass can also detect potential intruders outside the building. For example, at 3 am a sensor may detect one or more individuals outside a first-floor glass façade and alerts security personnel as to their presence, potentially averting an intrusion into the building. In another example, the glass automatically senses breakage and alerts a service technician that repairs are needed. This is illustrated in FIGS. 16a and 16b. In FIG. 16a an unbroken window 1602 monitors for a security or safety threat. In FIG. 16b, the now broken window 1604 is detected, and appropriate action is taken—in this case, a notification may be sent to a repair technician. Breakage may be detected by changes in current or voltage profiles of the electrochromic lite and/or the transparent display lite.

Figure 17:
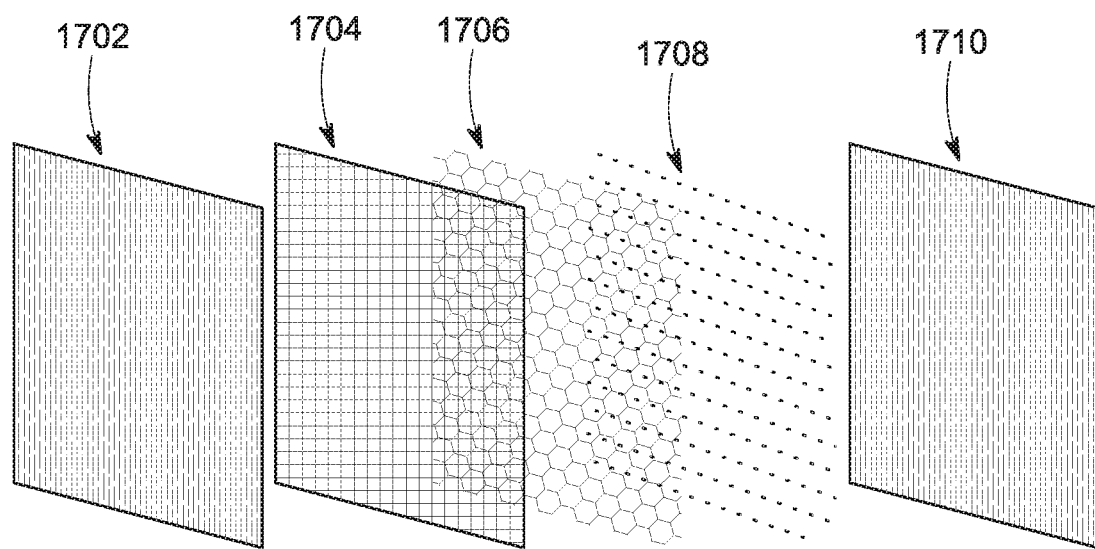
FIG. 17 depicts an exploded view of a window configured for RF communication and receiving solar power.

As described, the glass surface may serve multiple functions. In some embodiments, the glass acts as a mesh network that may be self-powered. In certain embodiments, a network of IGUs (windows) are powered by conventional wired power. In other embodiments, a network of IGUs is powered wirelessly, e.g., using RF powering. In yet other embodiments, a network of IGUs is self-powered, using PV and/or photon cells. FIG. 17 depicts an exploded view of an IGU having a first lite 1702 (e.g., having an EC device coating), a solar panel grid (PV) 1704, an RF antenna grid 1706, a grid or layer of photon cells 1708, and second lite 1710 (e.g., having a transparent display thereon). Some embodiments may not include transparent display technology. Layers 1704, 1706, and 1708 can be located on separate substrates within an IGU, or can be deposited on the interior or exterior surface of lite 1702 or lite 1710. A photon cell array or grid is used as a memory device. A network of photon cells can enable onboard control where the window controller logic circuit is configured as a transparent grid, thus allowing for "sensor glass." Thus with photon cells, a transparent grid window controller is realized. In this embodiment, the transparent grid window controller is self-powered and meshes with other windows in the network of IGUs. A transparent window controller may or may not be integrated or part of a transparent display component. In some embodiments, the photon cell grid supplies sufficient power for the control functions of the electrochromic glass, but in other embodiments, as depicted, a PV array augments the photon cell grid. The RF antenna grid, capable of receiving and transmitting omnidirectional RF signals based on configured policies, allows for communication between IGUs and meshing functions.

Figure 18A:
FIGS. 18a and 18b illustrate how windows can be configured to provide or block RF communication.
Figure 18B:
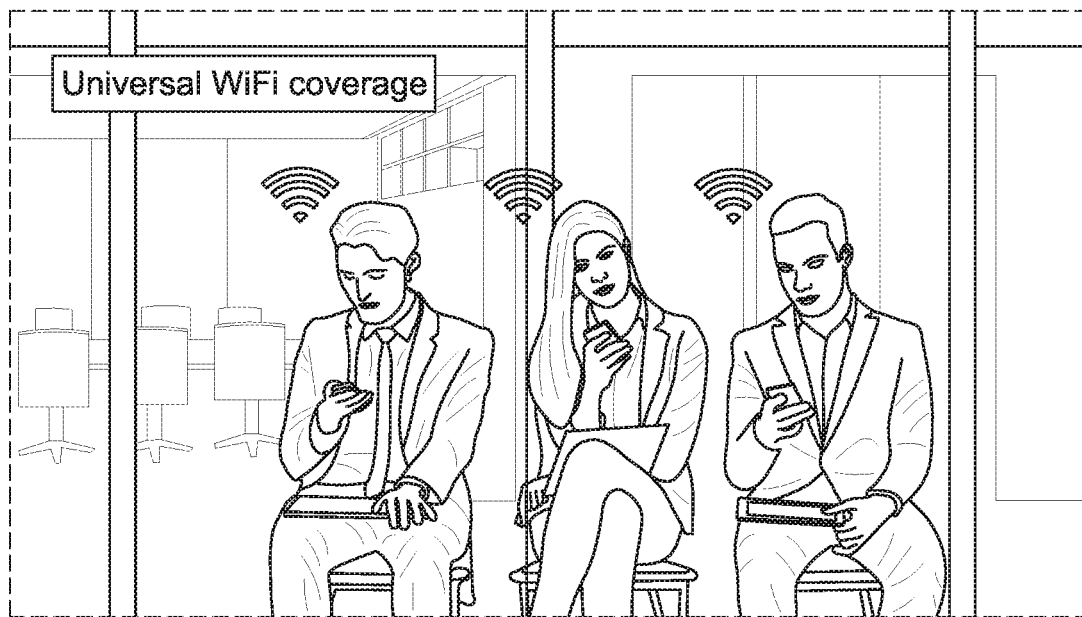

Radio Transmission & Receiver:

Policy and event-driven firewalling allowing and blocking of RF signals between exterior and internal building environments. For example, the glass can provide a full GSM, Wi-Fi spectrum coverage for building occupants. Blocking internal Wi-Fi network coverage outside the building. This is illustrated in FIGS. 18a and 18b. In FIG. 18a the windows of a building are used to block devices located outside the building from being able to connect to the buildings Wi-Fi network. In FIG. 18b, the glass of a building is used to provide a wireless network within a building.

The table provided in FIG. 19 shows a number of configurations where an electrochromic window, with or without transparent display technology, can serve as a signal blocking device and/or transmitter, e.g., a wireless communication repeater that optionally can also block signals from entering the interior of a building with IGUs so configured. The asterisk in the table indicates alternative positions for a ground plane.

Figure 20:
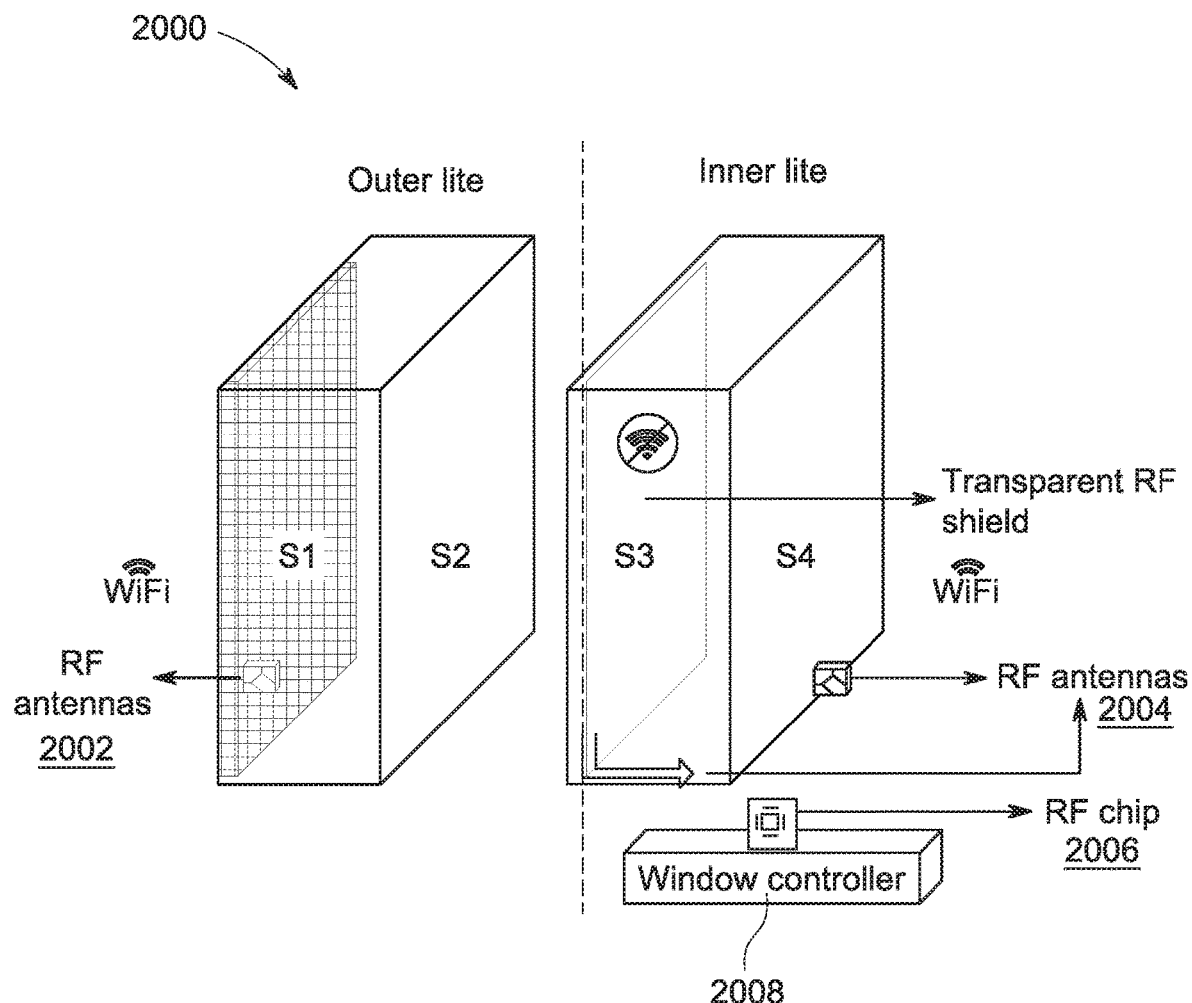
FIG. 20 illustrates a window that acts as Wi-Fi passive signal blocking apparatus as well as a Wi-Fi repeater.

FIG. 20 depicts an electrochromic IGU 2000 (or laminate) that may act as a Wi-Fi passive signal blocking apparatus as well as a repeater Surface 2 of the IGU 2000 has an EC device coating thereon (not shown). Selective exterior and interior radiating antennas (2002 and 2004) are patterned on S1 and S4, with a Wi-Fi signal processing RF chip 2006 as part of the window controller 2008. Surface 3 has a transparent RF shield (e.g., a ground plane that can be selectively grounded by the window controller). Therefore, this configuration can transmit and receive Wi-Fi communications and block incoming communications if desired.

In certain embodiments, the EC window controller also serves as an RF spectrum master configurator, i.e., controlling incoming and outgoing RF communications as well as meshing functions with other IGU controllers and/or network and master controllers. Antennas may be etched on transparent conductive coatings on one or more of the IGU's glass surfaces. For example, omnidirectional antenna(s) etched on S1 for exterior network coverage to transmit internally into a building, omnidirectional antenna(s) etched on S4 for internal network coverage transmitted to the external environment, and/or antenna(s) in and/or on mullions (window framing) providing full 360-degree coverage around glass of 'configured' spectrum & RF networks. Monopole or other RF antenna(s) can also be used in one or more of the aforementioned configurations. Such configurations provide blocking and repeater functions and optionally for selected spectrum channels. Window antennas are further described in PCT patent application PCT/US17/31106, filed May 4, 2017, and titled "WINDOW ANTENNAS," which is herein incorporated in its entirety.

Power Transmissions to Devices:

The glass' RF transmitter transmits high power beacon frames to authorized receivers providing continuous power over RF radio spectrum.

Asset Tracking:

The glass' sensors detect movement of radio powered devices within the vicinity of the skin of the building providing real-time location tracking mapped to access control or location policies ensuring un-authorized detection triggers an alert for remediation. As illustrated in FIG. 13, asset tracking can be useful in situations such as helping a doctor locate a patient or medical equipment. In some cases, on-demand asset location mapping clouds, such as the Oracle IoT asset tracking cloud, will now have enhanced visibility of asset movements with-in the perimeter of the building, because the skin of the building is now digitized with the glass. Additional method and examples of asset tracking are described in PCT patent application PCT/US17/

31106, filed May 4, 2017, and titled "WINDOW ANTENNAS," which has previously been incorporated by reference.

Transparent Display on Glass:

A transparent light emitting diode screen can be etched on the exterior and/or interior surface of the glass powered by a remote display bus illuminating diodes for content getting served from cloud stored locally at CDN controller for smooth rendering and also providing local grid control for glass mesh network. This enables a number of capabilities for windows described herein. In some cases, transparent displays can provide on-glass tint control for the window as well as nearby zone panels, as well as ambient environment sensor readings and status of glass panel tint or other functions.

Figure 21:
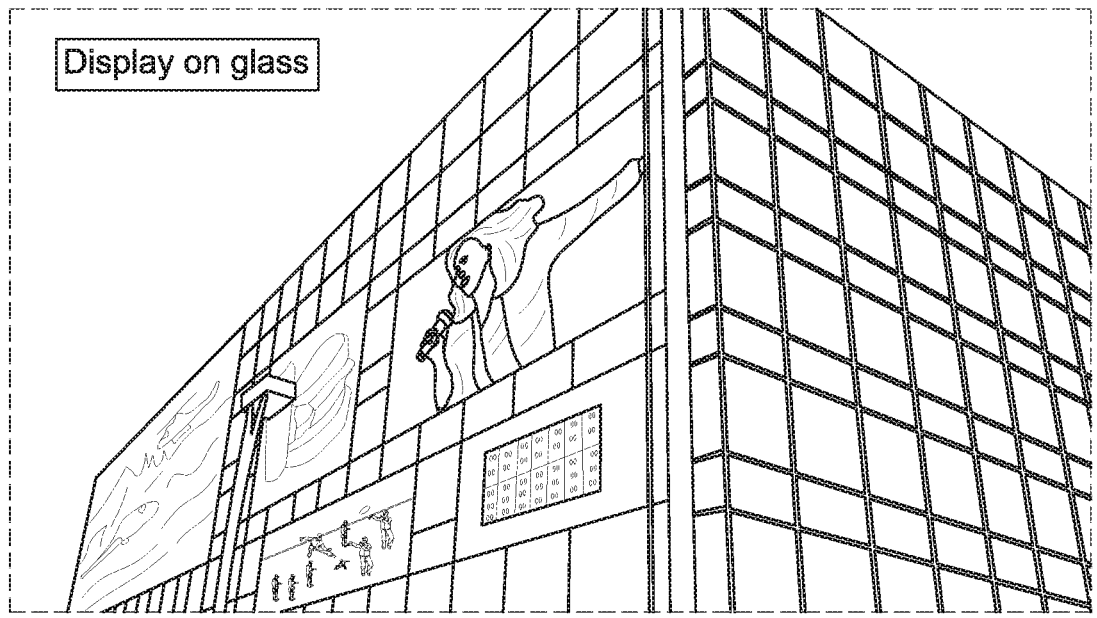
FIG. 21 depicts a building having windows with exterior facing transparent displays.

In some embodiments, external facing transparent displays, enable the exterior of the building to be converted into a building-size digital canvas. The exterior digital canvas can be used for displaying advertisements and other digital content as depicted in FIG. 21. In certain embodiments, the occupant's view of the outside is maintained even when the outside of the glass is used as a display. The occupant may also use the inside surface of the glass as a display. In some embodiments, an HD transparent display on or as the inboard lite is equipped with touch and gesture sensors or microphones for receiving user inputs—converting the surface of the glass into a digital whiteboard for impromptu ideation sessions, meetings, and other collaborative efforts. In some cases, a transparent display may be used a video conference pane, may display information from connected applications, or may provide entertainment (e.g., by pairing with and providing information from a user's personal device enabling over-the-air casting to the glass surface).

Glass Digital Twin:

Programmatic representation of the glass for applications to utilize the glass as a programmable surface allows various automated workflows. In some cases, content may be auto-scaled for best rendering on the glass based on the window's tint level. For example, a dynamic content management system can determine the best pixel transparency, depth, and color contrast for the content based on the ambiance surroundings of the glass panel. If, e.g., a car is parked outside the panel and reflects sunlight on the panel, the panel will need darker tinting to provide sufficient contrast to the transparent display. In some cases, standard programming constructs can be used for modeling glass into digital systems. This may be, e.g., based on the availability of standard models within application transport protocol headers. For example, HTTP/S allows for auto-detection of glass as the edge of the digital network thereby mapping the edge to standard templated operations allowed on the glass. An example is listed below.

```
<viewglass>
    <type:standard-panel>
        <function: tint>
        <level: 1-4>
        <default-state: 1>
    <type:display-panel>
        <function: external-led>
        <content-src: URL>
        <display-resolution: UHD>
        <tint-level: 1-4>
        <brightness: 0-100>
        <transparency: 0-100>
        <default-state: display-logo>
        <surface: 1 or 4>
```

-continued

```
        <gesture: yes | no>
        <gesture-type: touch | motion>
    <sensors: yes | no>
        <type: temp | proximity | light | RF>
        <per-sensor-data-values>
</viewglass>
```

Figure 22A:
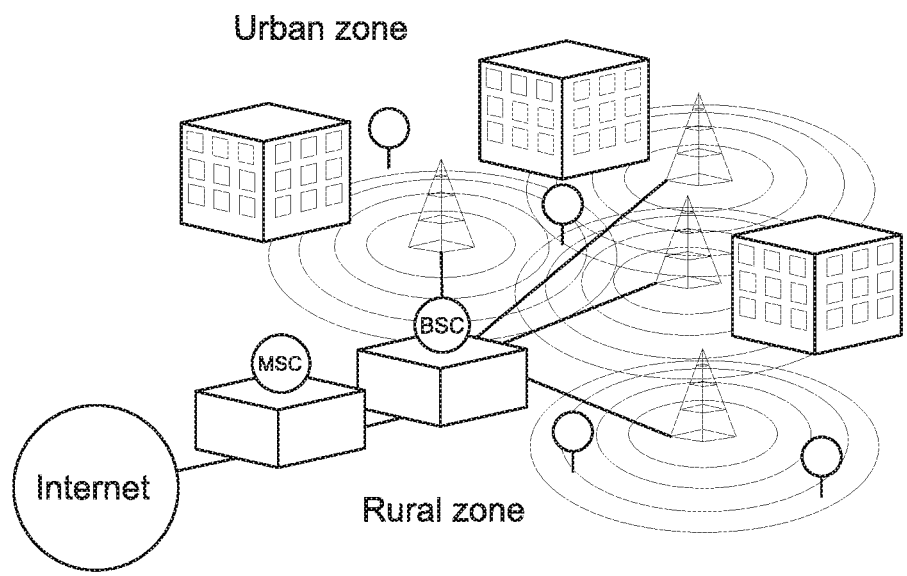
FIGS. 22a and 22b cellular infrastructures without and with the use of buildings equipped with windows for cellular communication.
Figure 22B:
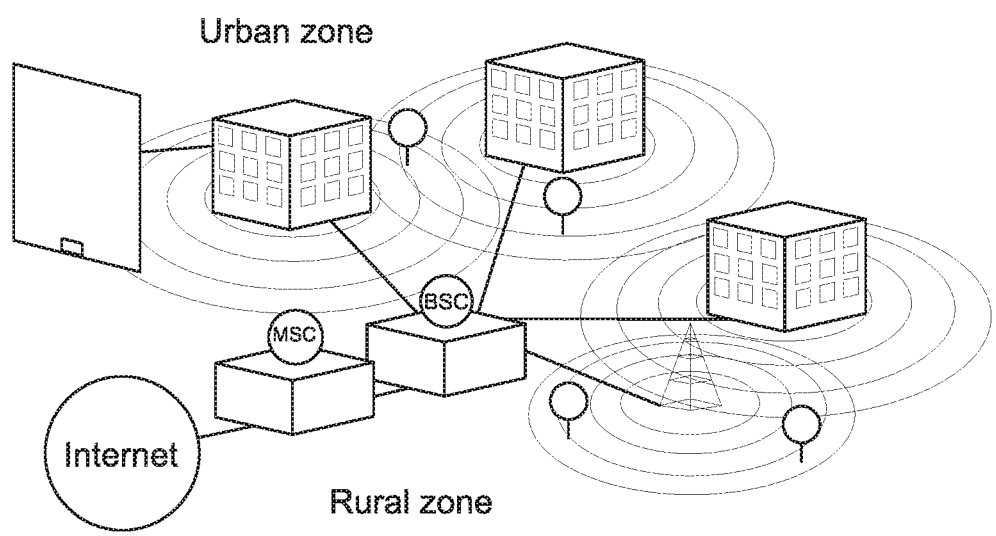

Cellular Communications:

As discussed, antennas with windows allow the glass to be used as a cell repeater, making buildings into cell towers (as well as boosters for cell traffic internal to the building). This, along with 5G capabilities as described, obviates the need for obtrusive cell towers, especially in urban areas. FIG. 22a depicts current cellular infrastructure. FIG. 22b depicts an improved cellular infrastructure that makes use of buildings having windows with antennas that can replace or work in conjunction with existing cell towers. Buildings equipped with such windows have the potential to greatly expand the coverage of cellular network in dense urban areas.

Glass Cleaning and Maintenance:

Sensors in or on the glass can, in some cases, detect dust level on glass and/or graffiti. In some cases, a window control system can inform a cleaning scheduling system to schedule cleaning once dust level has reached a threshold value, or when graffiti is detected. Windows described herein may have self-cleaning type coatings on the outboard lite to aid in maintaining clear views, such as titanium dioxide coatings that catalyze breakdown of organic contaminants and allow the rain to remove debris.

Figure 23:
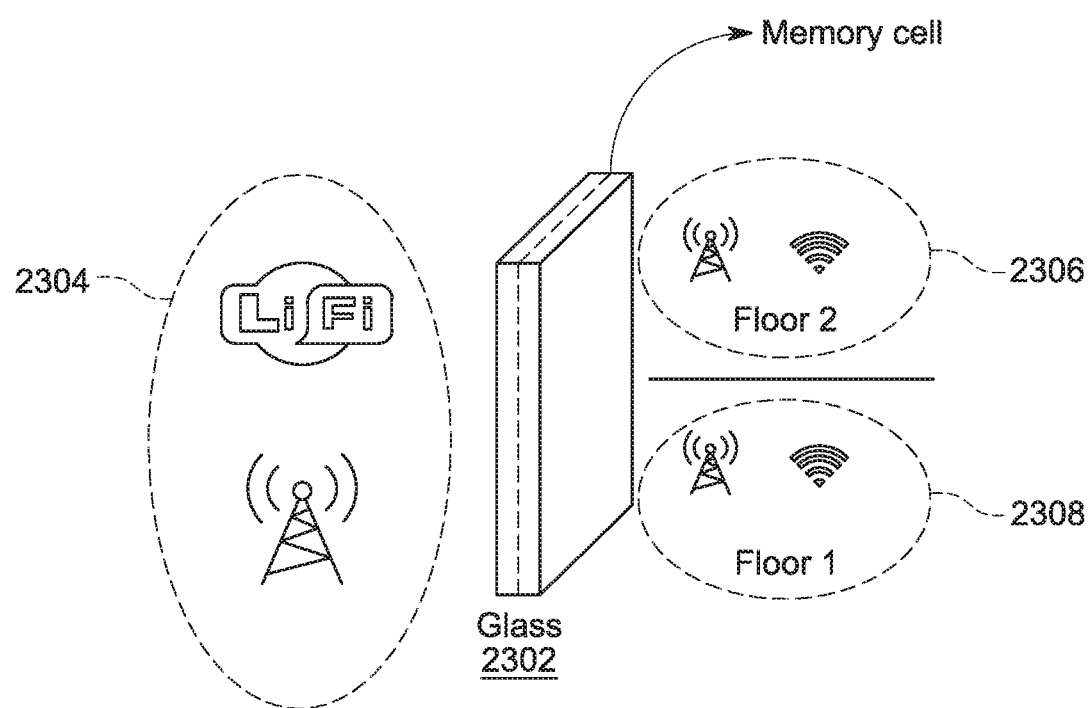
FIG. 23 depicts an optically switchable window configured as a bridge between one or more networks exterior to a building and one or more networks within a building.

Glass Façade for Data Storage (Memory) and Networks:

Since photon cells (sometimes called photon sensors) can store energy and data, and onboard window controllers or associated network or master controllers may have significant storage and computing horsepower, the building skin, the glass itself in the former example, can be used as data storage cells. Since large buildings may have tens or hundreds of thousands of square feet of glass on the façade, this can account for significant storage and/or computational power that can be used for purposes other than tinting the windows and displaying information. For example, besides data storage for a building occupant, the glass can be used as an external network providing connectivity to the internet or forming in-building intranets (e.g., on the side of the building, floor of the building, rooms in the building, etc.). This is illustrated in FIG. 23. The glass, 2302 can act as a bridge between an ultra-high speed external network 2304 to many intra-building high-speed networks 2306 and 2308 for voice, video and data communication. Moreover, by virtue of piezoelectric elements and/or PV cells, the glass can generate energy from the wind and or solar energy and supply power to the memory and/or network transmission infrastructure. In some cases, a window controller may have a battery for storing generated energy.

Personal Computing Via a Window Network

In certain embodiments, components of a building's window system are used as a personal computing system, providing a building occupant with functions commonly found in a personal computer such as a desktop computer, a laptop computer, a tablet computer, and/or a smart phone. Personal computing units implemented as described herein may have various benefits. For example, they may allow sharing window system resources among multiple computing platforms (e.g., windows/displays) in a building, and they may allow using spare window system resources in the form of processing power and/or storage. Personal computing units also allow users to access the personal computing functions while untethered to computing device.

Examples of features of conventional personal computing devices that can be replaced by one or more components of a window system include the following: (a) user interface components such as a display screen, touch sensor, speaker, and/or microphone, (b) one or more processors such as microprocessors configured to execute instructions that facilitate personal computing, (c) memory or storage for permanently or temporarily storing data useful to occupants and/or instructions/data for executing on the processor(s), (d) data transfer components that provide communications and/or power conduits between (i) the user interface components and (ii) the processor(s) and/or the memory/storage, and optionally (e) computer network components for communicating between personal computing units in a LAN or WAN and/or with an external network such as the Internet.

Terminology

As used for personal computing embodiments discussed herein, a "personal computing unit" is a group of window system resources that collectively provide a user such as a building occupant with the functionality of a personal computing device such as a personal computer, a tablet, and/or a smart phone. The required window system resources may be arranged for this purpose temporarily (e.g., when needed by a building occupant) or permanently.

As used for personal computing embodiments discussed herein, a "window system resource" is a component of a window system that can be used for a personal computing unit. In many instances, a window system resource serves other functions as well. For example, window system resources typically support window system operations such as controlling the building environment by varying window tint states. As indicated, examples of window system resources include display screens, processors, memory or storage, data transfer components, and computer network components. In certain embodiments, window system resources are found on window controllers, network controllers, master controllers, sensors, the windows themselves, and/or network media links between two or more of these components. In certain embodiments, window system resources include one or more components of an optically switchable window power distribution network. Examples of such components include control panels, trunk lines, drop lines, and connectors.

Window system resources available for personal computing units may be a fraction of or all of the window system resources in a building. In some cases, the available window system resources include window system resources available in two or more buildings, which may be, for example, on a campus or a housing group (e.g., a retirement community).

A user of a personal computing unit may be a building occupant such as a full-time occupant (e.g., a tenant or owner), a part-time occupant such as a client of a shared workspace, or a visitor. Essentially, anyone who can access some or all of the window system resources can be a user of a personal computing unit. Of course, the window system may be configured so that only authorized individuals are permitted to use window system resources in a personal computing unit. In some embodiments, personal computing units are made available as a service by a building owner or other administrator of window system resources. For example, building occupants or visitors are given access to personal computing units by subscription, lease, or as needed (ad hoc) upon appropriate arrangement with the building/administrator.

Window System Resources for Personal Computing Units
  User Interface

A user interface for a personal computing unit may include any one or more of the following personal computing output components, any one or more of which may be part of a window system: a display screen, a speaker, and a vibration generator or other tactile interface. Any one or more of these may be integrated with a window or window component such as an optically switchable window lite, a frame, an IGU spacer, a mullion, a transom, a window controller, etc.

A user interface for a personal computing unit may include any one or more of the following personal computing user input components, any one or more of which may be part of a window system: a touch interface on a window or a display screen associated with an optically switchable window, a keyboard (optionally displayed on a display screen associated with an optically switchable window), a computer mouse, a microphone, and a pressure transducer that senses how much pressure a user applies to an input component such as a touch screen or mouse.

A user interface for a personal computing unit may include associated software or other logic for interpreting user inputs and controlling outputs presented to the user. Such logic may implement a full range of UI decision making, as appropriate for particular applications, found in user interfaces employed in conventional personal computing. Examples of user interface logic functions include identifying user inputs that trigger defined user interface outputs such as moving icons, launching specific applications, and displaying UI features such as menus, popup windows, etc. In certain embodiments, the user interface employs ancillary logic such as voice recognition algorithms, drivers for input devices such as touch sensitive screens, etc., and content rendering tools.

While the user interface may be wholly or partially implemented using hardware of a window system (e.g., displays), in some embodiments, the user interface is provided using components outside the window system. For example, the window system may lend processors, memory, and/or network infrastructure, but not a user interface, to the personal computing unit.

Processors

A personal computing unit employs one or more processors for executing instructions necessary to implement an operating system, a user interface, one more software applications, etc. In certain embodiments, the processors are installed on a window network, in some cases primarily for window-related purposes such as controlling tint states on optically switchable windows. Such processors may have extra processing capabilities that can be harnessed by personal computing units for personal computation.

Various types of processor may be used for personal computing units. In certain embodiments, the processors are integrated circuits, typically electrically connected to other components such as memory or storage, peripherals, and sometimes to other computer chips controlling ancillary functions such as wireless communications, wireless power delivery, etc. In certain embodiments, the processors are microprocessors or microcontrollers, used alone or as part of a more complete processing system such as a system on a chip.

As is known to those of skill in the art, a microprocessor is a computer processor that incorporates functions of a central processing unit (CPU) on a single integrated circuit or at most a few integrated circuits. A microprocessor may contain one or more CPUs, sometimes referred to processor cores. A microprocessor is typically a multipurpose, clock-driven, register-based, digital-integrated circuit that accepts binary data as input, processes it according to instructions stored in its memory, and provides results as output. Microprocessors may contain both combinatorial logic and sequential digital logic.

Microcontrollers are designed for embedded applications in contrast to microprocessors used in general purpose applications. However, like a microprocessor, a microcontroller contains one or more CPUs along with memory. A microcontroller may also include programmable input/output peripherals and may include program memory in the form of, e.g., ferroelectric RAM, NOR flash, or OTP ROM, as well as a small amount of RAM.

As explained, the processors are configured to execute instructions for a personal computing unit's operating system, user interface, software applications, etc. As is known to those of skill in the art, an operating system (OS) is system software that manages computer hardware as well as software resources and provides common services for computer programs. For hardware functions such as input and output and memory allocation, the operating system acts as an intermediary between programs and the computer hardware, although the application code is usually executed directly by the hardware and frequently makes systems calls to an OS function or is interrupted by it. An OS may also schedule tasks for managing processor time, mass storage, and the like. The operating system for a personal computing unit may be different from the operating system used by the window system for its own purposes such as reporting Processors used in personal computing units described herein may be provided on any of various window system resources, or they may be dedicated for the personal computing unit but are configured to connect with other window system components such as displays and/or memory. In various embodiments, the processors are provided on window system controllers such as window controllers, network controllers, or master controllers.

Multiple processors, sometimes contained on two or more window system controllers, may operate in concert to implement the processing requirements of a personal computing unit. In such cases, a distributed processing control mechanism may be necessary to coordinate the operation of the multiple processors. In certain embodiments, distributed processing for a personal computing unit is implemented in a peer-to-peer or a master-slave configuration. In certain embodiments, the distributed processing system employs a block chain technology such as Bitcoin or the open source program Gridcoin that uses the Berkeley Open Infrastructure for Network Computing. To implement distributed processing, software for interfacing with the processors may have a container architecture. In some embodiments, the container architecture is implemented via a container management layer in a network protocol. One example of resource for implementing distributed processing via a container architecture is Docker for the Linux Containers (LXC) format. Docker provides namespaces to isolate an application's view of the operating system, including process trees, network resources, user IDs, and file systems. The distributed processing may allow load balancing by using a product such as, for example, IBM's Cloud Orchestrator™.

The computing power of a personal computing unit is a function of (i) the power of individual processors and (ii) the number of such processors working in concert. In some cases, many processors throughout a building or even throughout multiple buildings are used by a personal computing unit or are at least available to the personal computing unit during its operating session. Because the processing power grows with the number of available processors, a personal computing unit may in some cases attain much greater processing power than is conventionally available with a personal computing device.

The processing resources for a personal computing unit can be chosen based on various criteria. The current and/or projected availability of spare processing power when a personal computing unit is established may be one criterion. The physical location of processors may be another criterion. The ability of processors to participate in a multi-processor computing environment may be still another criterion. In one example, multiple processors are selected for inclusion in a personal computing unit and configured in a manner that allows them to conduct fog computing. Fog computing also known as fog networking or fogging, is a decentralized computing infrastructure in which data, computing/processing power, storage, and applications are distributed in the most logical, efficient place between a data source and a user. If an external network (e.g., the internet or a cloud computing resource) are involved, the computing infrastructure is chosen taking into consideration the location of relevant cloud or internet resources.

In certain embodiments, mobile devices and/or other computing devices that are not physically part of the window system may be temporarily connected to the window system and thereby become available as a window system resource for a personal computing unit. In a sense, such external devices may serve as part of virtual window resource and provide its untapped processing power for an occupant/computational user of a personal computing unit.

Memory/Storage

A personal computing unit employs memory to provide instructions and data used by the processor(s) to run the operating system, user interface, applications, etc. A personal computing unit may also employ the memory and possibly larger capacity storage devices to save results output by the processor(s). Suitable memory and optionally storage may be provided by window system resources such as window controllers, network controllers, master controllers, and/or window or displays that have spare memory not currently used by the window system.

As understood by those of skill in the art, memory refers to computer hardware that, e.g., stores information for immediate use in the personal computing unit. The term "primary storage" is sometimes used to describe memory configured for this purpose. This form of computer memory is frequently implemented using RAM, which operates at relatively high speed compared to "storage" that provides slow-to-access information but offers higher capacities.

In certain embodiments, the memory is addressable semiconductor memory, i.e. integrated circuits containing transistors or other switches for accessing storage units. Memory may be volatile or non-volatile. Examples of non-volatile memory include flash memory (sometimes used as secondary memory) and ROM, PROM, EPROM, EEPROM (sometimes used for storing firmware such as BIOS). Examples of volatile memory include dynamic random-access memory (DRAM), which is often used for primary memory, and static random-access memory (SRAM), which is often used for CPU cache memory.

Most memory is organized into memory cells or bistable flip-flops, each storing one bit (0 or 1). Flash memory organization may provide for storage of one bit per memory cell or of multiple bits per cell (called MLC, Multiple Level Cell). Memory cells are grouped into words of fixed word length, for example 1, 2, 4, 8, 16, 32, 64 or 128 bits. Each word can be accessed by a binary address of N bit, making it possible to store $2^N$ words in the memory. Processor registers normally are not considered as memory, since they only store one word and do not include an addressing mechanism. Typical storage devices include hard disk drives and solid-state drives.

Memory as described above may be provided on window system controllers and/or sensors in a conventional architecture or environment for interacting with the controller's processor and providing optical switching functionality to optically switchable windows of the window system. Examples of suitable architectures are described in PCT Published Patent Application No. PCT/US16/58872, filed Oct. 26, 2016, previously incorporated by reference, and PCT Published Patent Application No. PCT/US16/55709, filed Oct. 6, 2016, which is now incorporated herein by reference in its entireties. Alternative or ancillary memory sources may be employed. For example, photon cells as described above, which may have a photovoltaic function and a memory storage function that can provide memory or storage for personal computing units. Still further, as mentioned above in the context of processors, mobile devices and/or other computing devices that are not physically part of the window system may be temporarily connected to the window system and thereby become available as a window system resource for a personal computing unit. Such external devices may provide untapped memory/storage for a personal computing unit. In some embodiments, memory resources from multiple buildings (e.g., memory on window controllers of multiple buildings) are made available for a personal computing unit.

Software useful for implementing a personal computing unit may be stored on one or more storage devices provided on the window system. Such software may include operating system software, applications software, user interface software, compilers, and the like.

In certain embodiments, a personal computing unit uses memory or storage from multiple window system resources. In such cases, the memory may be virtualized with a given personal computing unit employing memory from one or more virtual drives, with each such virtual drive mapping to physical memory spread across multiple physical devices such as multiple window controllers or other window system resources. Examples of approaches to sharing memory across multiple physical devices include Network Attached Storage (NAS), Network File System (NFS), or Storage Area Network (SAN).

While the memory and storage of a personal computing unit may be wholly or partially implemented using hardware of a window system (e.g., on window controllers, network controllers, or master controllers), in some embodiments, memory or storage is provided via components outside the window system. For example, the window system may provide processors, user interface components, and/or network infrastructure, but not memory and/or storage required by a personal computing unit.

Buses or Data Transfer Components

To permit direct communication between its processor(s), memory, peripherals, etc., a personal computing unit employs one or more data and power links, sometimes called buses. In some cases, these links or buses are supplied together with the processors used by the personal computing unit. In other cases, these are provided separately. When separate bus functionality is needed, the window system may provide it via many different forms such as USB, expansion ports, SATA ports, etc. In some cases, the necessary links are provided via a computer network.

Generally, a bus is a communication system that transfers data between components inside a computer or between computers. The expression covers all related hardware components (wire, optical fiber, etc.) and software, including communication protocols. Suitable buses for personal computing units can use parallel and/or bit serial connections, and can be wired in either a multidrop (electrical parallel) or daisy chain topology, or connected by switched hubs, as in the case of the Universal Serial Bus (USB).

In many embodiments, the processor and main memory of a window controller or other window system component are tightly coupled. A microprocessor conventionally has a number of electrical connections on its pins that can be used to select an "address" in the main memory and another set of pins to read and write the data stored at that location. In most cases, the processor and memory share signaling characteristics and operate in synchrony. The bus connecting the processor and memory is often referred to simply as the system bus.

Peripherals such as displays on windows may communicate with memory in the same fashion by attaching adaptors in the form of, e.g., expansion cards directly to the system bus. This may be accomplished through some sort of standardized electrical connector, with multiple of these forming an "expansion bus" or "local bus." Some processors have a second set of pins similar to those for communicating with memory, but able to operate at very different speeds and using different protocols. Others use smart controllers to place the data directly in memory, a concept known as direct memory access (DMA).

Certain bus systems are designed to support multiple peripherals. Common examples are the Serial AT Attachment (SATA) ports, which allow a number of hard drives to be connected without the need for a card, and the standardized USB.

In some cases, high-speed memory, known as a cache, is built directly into the CPU or other processor of the window system. In such systems, CPUs communicate using high-performance buses that operate at speeds much greater than memory, and communicate with memory using protocols similar to those used solely for peripherals. These system buses are also used to communicate with most (or all) other peripherals, through adaptors, which in turn talk to other peripherals and controllers. Such systems are architecturally more similar to multicomputers, but communicate over a bus rather than a network. In these cases, expansion buses are entirely separate and no longer share any architecture with their host CPU (and may in fact support many different CPUs, as is the case with the Peripheral Component Interconnect (PCI)).

Other categorizations are based on the bus's role in connecting devices internally or externally, PCI versus Small Computer System Interface (SCSI) for instance. However, many common modern bus systems can be used for both; SATA and the associated eSATA are one example of a system that would formerly be described as internal, while certain applications use the primarily external IEEE 1394 in a fashion more similar to a system bus. Other examples, like InfiniBand and $I^2C$ were designed from the start to be used both internally and externally.

In the context of a personal computing unit employing window system resources, bus components such as ports and adaptor for personal computing may be added to the existing window system resources by, for example, installing them on controllers, sensors, and the like. Alternatively, such features may be installed as separate components, in line between components such as controllers.

Computer Network Infrastructure

A personal computing unit may require computer network services or computer network infrastructure, which may be used to communicate with other computers on the network, access the internet, etc. In certain embodiments, a window network provides some or all of this service or infrastructure. The wired or wireless links between window controllers, network controllers, master controllers, and/or sensors on the window network can be used by personal computing units. Further, some or all of the controllers on the window network may serve as routers or bridges for a personal computing unit's network. In certain embodiments, the window network provides a route for communicating user input and processing results between user locations in a building and the location(s) of the processing power (possibly the cloud or other location outside the building).

Note that network connections such as Ethernet connections are not generally regarded as buses, although the difference may be considered largely conceptual. An attribute generally used to characterize a bus is that power is provided by the bus for the connected hardware.

For purposes of the personal computing units described herein, a computer network is a digital communications network that allows nodes (including personal computing units) to share resources. In computer networks, computing devices exchange data with each other using connections between nodes (referred to as data links). These data links are established over cable media such as wires or optic cables, or wireless media such as WiFi. In many cases, network communications protocols are layered over other more general communications protocols.

Users of personal computing units may communicate efficiently and easily via various network-enabled functions such as email, instant messaging, online chat, telephone, video telephone calls, and video conferencing. A network allows sharing of network and computing resources. Users may access and use resources provided by devices on the network, such as printing a document on a shared network printer or use of a shared storage device. A network allows sharing of files, data, and other types of information giving authorized users the ability to access information stored on other computers on the network. A network may also permit distributed computing, as described herein, which uses computing resources across a network to accomplish tasks.

In certain embodiments, personal computing units access software applications and/or other services via a cloud or the internet. As examples the architectures presented in FIGS. 7 and 11a-g may be employed.

In certain embodiments, antennas or other communications components are provided on optically switchable windows or associated lites or displays. Such antennas are described in PCT Patent Application No. PCT/US17/31106, filed May 4, 2017, which is incorporated herein by reference in its entirety.

While the data transmission network infrastructure of a personal computing unit may be wholly or partially implemented using hardware of a window system (e.g., on network interfaces and/or wired or wireless links between window, network, and/or master controllers), in some embodiments, the network infrastructure is provided via components outside the window system. For example, the window system may lend processors, user interface components, and/or memory/storage, but not network infrastructure, to a personal computing unit.

Configuring Logic

Software or other logic is designed or programmed to control allocation and coordination of window system resources to so that the resources serve, at least temporarily, as personal computing units. This configuring logic may be resident on a window system resource (e.g., one or more master controllers, network controllers, or window controllers) and/or it may be provided outside the window system. In various embodiments, the configuring logic performs some or all of the following functions:

1. Authenticate or authorize a user to allow the user to access a personal computing unit.

2. Identify and select window system resources available to serve as the personal computing unit for the user.

3. Allocate some or all of the selected window system resources as the personal computing unit for a defined period of time.

4. Configure as necessary the allocated window system resources to coordinate effort as the personal computing unit. This may involve running an instance of an operating system on the personal computing unit, applying a network address (e.g., an IP address) to the personal computing unit, applying a level of computer security appropriate for the user and personal computing resource, etc. As an example, a user may be given a role that defines access to particular content, ports, physical resources of the window system, etc. A network firewall may also be appropriately configured.

5. Oversee and monitor operation of the allocated window system resources during their use in the personal computing unit.

6. Upon detecting a defined event such as expiration of a timer, terminating use or deallocating the window system resources used in the personal computing unit. In this regard, the availability of the window system resources for a particular personal computing unit may be deemed a personal computing session. Users may have one or more personal computing sessions at various times and/or various locations throughout a building.

Operation and Function of Personal Computing Units

Any combination of available window resources may be configured for a given user's personal computing unit. Typically, the user interface components of the personal computing unit (e.g., the display screen, tactile interface, speaker and/or microphone) are located in close proximity to the user, e.g., sufficiently close to allow the user touch, view, speak, or otherwise interact with the user interface. As explained herein, proximity detection can be used to determine the location of particular individuals. Alternatively, the user can take action to initiate deployment of available window system resources as the user's personal computing unit. For example, the user may touch an icon on a display associated with an optically switchable window—the icon being dedicated to launching/configuring a personal computing unit—or the user may send a request from her smart phone, watch, or table.

Upon triggering a request for resources and a subsequent decision to make resources available as a personal computing unit, the responsible logic configures available window system resources as a personal computing unit for the user. Window system resources are available if they have spare computing power, transmission bandwidth, and/or storage capacity, which may be determined by current and/or projected needs of the window system, of other building systems sharing the resources (e.g., a BMS), or of other personal computing units. The projected needs may be determined based on the typical usage patterns of the window system, the other building systems, and/or the users of personal computing units.

Once the logic for configuring personal computing units determines that a particular user should be given access to window system resources for personal computing, the logic takes actions to allocate and configure those resources as a personal computing unit for the particular user. Allocation of resources may involve defining a period of time when the pertinent window system resources are available as a personal computing unit for the user and optionally preventing other users or systems from accessing those resources during the period of time. In some cases, other users or systems are permitted some, but not all, of power or capacity of the allocated resources during the period. Configuring of resources may involve taking steps to cause the resources to coordinate their operation and communicate directly with another for the purpose of personal computing with a user. Also, as mentioned, some processor and memory/storage resources are available across multiple window system components. For example, multiple window controllers may be allocated for a single personal computing unit. While allocated the personal computing unit, the processors and/or memories of these controllers may be available to both the personal computing unit and one or more building systems. The amount and timing of the processing and storage capacity available to the personal computing unit is controlled by a distributed processing and/or distributed memory tool such as the block chain, load balancing, and/or memory virtualization tools described elsewhere herein.

After a user concludes his or her use of a personal computing unit, the configuring logic may deallocate the window system resources so that they are no longer encumbered by the personal computing unit. At a later time, the user may again use a personal computing unit, and at that time the configuring logic may allocate the same or different window system resources. In various embodiments, the selection of particular physical resources for a personal computing unit is not observable by the user.

Examples of user interface arrangements and computer applications for a personal computing unit are depicted in FIGS. 14a-e.

A personal computing unit may provide the functionality of various types of personal computing devices. For example, functions of a personal computer such as a desktop computer, a laptop computer, a smart phone, a table, or a smart watch may be replaced by various combinations of window system resources. For example, a display associated with an optically switchable window may serve as a computer monitor (and hence part of a user interface) and one or more processors of one or more window controllers may provide computing power.

In some cases, a personal computing unit employs certain resources from within the window system and other resources from outside the window system. In one example, a display associated with an optically switchable window is a computer monitor (and hence part of the personal computing unit's user interface), and a window network, or components thereof, provides a communications path between the display associated with an optically switchable window. However, the processing power is not provided by the window system (e.g., processors used by the personal computing unit are not in any of the controllers of the window network).

In other examples, a window network provides capability for delivering processing power for the personal computing unit, but the processing power is supplied by processors outside the window system. In some such examples, the user interface is supplied by the window system, but it may be viewed as a "dumb" device analogous to a computer terminal. In other examples, user devices such as phones with limited computing power receive external processing power via the window network. In some cases, user mobile devices or local desktop devices provide the user interface and the window network provides processing, either directly or indirectly.

In certain embodiments, the personal computing unit employs the following window system resources that go beyond the functionality provided in conventional personal computing devices. In one example, the personal computing unit employs a projector associated with an optically switchable window. Such personal computing unit optionally uses a window network infrastructure and/or processors and memory of window controllers. In another example, the personal computing unit employs a smart whiteboard provided with the window system.

In certain embodiments, window system resources for a personal computing unit are provided from multiple buildings sharing a window platform and associated computing resources, e.g., an academic or business campus that has many buildings. If all buildings have optically switchable windows and associated window resources, they can be made available to work in a coordinated fashion for computing, e.g., providing a supercomputing platform. In some cases, the computing power being utilized in a personal computing unit may move from one building to another, without necessarily interrupting the computations. For example, a user may be start conducting a computing session in one building and then walk to a different building without interrupting the operation of the personal computing unit.

User identification, authentication, and/or authorization to access the window system resources configured as a personal computing unit may be performed in various ways, such as by mechanisms that are conventionally used in other computing contexts; e.g., password entry, biometric identification, multi-factor authentication, etc.

User proximity and personalization may trigger user authentication and concomitant configuring of window system resources near the user as a personal computing unit for the user. In some cases, users may have been previously authenticated or otherwise approved for accessing certain window system resources. Then, when the user's presence is detected, the available resources are configured as a personal computing unit for the user. In some cases, the user is invited via a display message and/or an audible communication to use the personal computing unit or to interact with the user interface of the personal computing unit.

In certain embodiments, the user interface of the personal computing unit is implemented in a way that provides privacy. For example, a display screen or projector may be implemented in a manner that displays content to only the user. This may be accomplished by, for example, providing an opaque tint state to an optically switchable window that overlays the display screen. In another approach the display screen is movable (e.g., via a pivot or swing arm) to a position that does not face through the window. Thus, content is not visible to individuals located on a side of the window that is opposite from the side where the user of the personal computing unit is located.

As indicated, virtualization services allow functionally discrete memory, processing power, and personal computing units that are not fixed to particular physical components of a window system. Such virtualization allows the logic for configuring personal computation units to allocate computational resources in a balanced fashion that optionally applies a hierarchical priority based on quality of service. Further the logic may be configured to segregate computers or networks so that only some users or tenants can access computational resources or networks. Any of these functions may leverage existing virtual network, database partitioning, computer security mechanisms, etc.

CONCLUSION

It should be understood that the certain embodiments described herein can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code to be executed by a processor using any suitable computer language such as, for example, Java, C++ or Python using, for example, conventional or object-oriented techniques. The software code may be stored as a series of instructions, or commands on a computer-readable medium, such as a random-access memory (RAM), a read-only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

Although the foregoing disclosed embodiments have been described in some detail to facilitate understanding, the described embodiments are to be considered illustrative and not limiting. One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A system for re-allocating at least a portion of a window system, the system comprising:
    a plurality of tintable windows, the portion of the window system being configured for tinting at least one of the plurality of tintable windows and
    (A) a display associated with a tintable window of the plurality of tintable windows, which association includes the display being disposed fully or partially coextensive with the tintable window and the display and the tintable window being configured to have a symbiotic relationship; and/or
    (B) a circuitry configured to re-allocate, or direct re-allocation of, the at least a portion of the window system as a personal computing unit made available to a user to provide the user with a functionality of a personal computer, a tablet and/or a smart phone; wherein:
    the circuitry is configured to provide, or direct provision of, an operating system for running on the personal computing unit and to permit the personal computing unit to access one or more software applications.

2. The system of claim 1, wherein the display is operatively coupled to a touch sensitive interface.

3. The system of claim 1, wherein the circuitry is configured to temporarily re-allocate the at least a portion of the window system as at least the portion of the personal computing unit.

4. The system of claim 1, wherein the circuitry is configured tore-allocate, or direct re-allocation of, physical memories and/or storage devices as at least the portion of the personal computing unit, which window system includes the physical memories and/or the storage devices.

5. The system of claim 1, wherein the circuitry is configured to re-allocate, or direct re-allocation of, processors as at least the portion of the personal computing unit.

6. The system of claim 1, wherein the circuitry is configured to provide, or direct provision of, an operating system for running on the personal computing unit.

7. The system of claim 1, wherein the circuitry is configured to permit the personal computing unit to access one or more software applications.

8. The system of claim 1, wherein the circuitry is configured to permit the personal computing unit to access one or more internet sites.

9. The system of claim 1, wherein the circuitry is configured to re-allocate, or direct re-allocation of, the at least the portion of the window system as the personal computing unit made available to the user for personal computing.

10. The system of claim 9, wherein re-allocation of the at least the portion of the window system as the personal computing unit is on a temporary basis.

11. The system of claim 1, wherein the window system comprises the display associated with the tintable window, which association includes (i) the display being disposed fully or partially coextensively with the tintable window and/or (ii) the display and the tintable window being configured to have a symbiotic relationship.

12. The system of claim 11, wherein the display is a transparent display.

13. The system of claim 11, wherein the window system comprises the display associated with the tintable window, which association includes (i) the display being disposed fully or partially coextensively with the tintable window and (ii) the display and the tintable window being configured to have a symbiotic relationship.

14. The system of claim 11, wherein the window system comprises the display associated with the tintable window, which association includes the display being disposed fully or partially coextensively with the tintable window.

15. The system of claim 11, wherein the window system comprises the display associated with the tintable window, which association includes the display and the tintable window being configured to have a symbiotic relationship.

16. The system of claim 15, wherein symbiotic relationship comprises considering status of the tintable window and the display during their operation.

17. The system of claim 16, wherein considering the status of the tintable window and the display during their operation includes (a) the display being configured to be tinted in conjunction with content displayed by the display and/or (b) the display being configured to augment color, hue, transmittance, and/or switching speed of the tintable window.

18. The system of claim 1, wherein the circuitry is configured to apply, or direct application of, computer security during re-allocation of the at least a portion of the window system, wherein the computer security is optionally based at least in part on information about the user.

19. The system of claim 18, wherein the circuitry is configured to identify or direct identification of, authenticate or direct authentication of, and/or authorize or direct authorization of, the user prior to permitting the user access to the at least a portion of the window system re-allocated as the personal computing unit.

20. The system of claim 18, wherein the circuitry is configured to monitor, or direct monitoring of, operation of the at least the portion of the window system re-allocated as the personal computing unit.

21. The system of claim 18, wherein the circuitry is configured to, upon detecting a defined event, (i) terminate, or direct termination of, usage of the at least the portion of the window system used as the as the at least the portion of the personal computing unit and/or (ii) deallocate, or direct deallocation of, usage of the at least the portion of the window system used as the as the at least the portion of the personal computing unit.

22. A method of re-allocating at least a portion of a window system for personal computing, the window system comprising a plurality of tintable windows and a circuitry, the portion of the window system being configured for tinting at least one of the plurality of tintable windows, the method comprising:
  (A) re-allocating, with the circuitry, the at least a portion of the window system as a personal computing unit made available to a user to provide the user with a functionality of a computer, a tablet and/or a smart phone; the circuitry being configured to provide, or direct provision of, an operating system for running on the personal computing unit and to permit the personal computing unit to access one or more software applications; and/or
  (B) the window system comprises a display associated with a tintable window of the plurality of tintable windows, which association includes the display being disposed fully or partially coextensive with the tintable window and the display and the tintable window being configured to have a symbiotic relationship.

23. The method of claim 22, further comprising applying computer security during re-allocating and/or using of the at least the portion of the window system, which security is optionally based at least in part on information about the user.

24. The method of claim 22, further comprising identifying, authenticating, and/or authorizing the user prior to permitting the user to access the at least a portion of the window system re-allocated as the personal computing unit.

25. The method of claim 22, further comprising monitoring operation of the at least the portion of the window system re-allocated as the personal computing unit.

26. The method of claim 22, further comprising, upon detecting a defined event, terminating use or deallocating the at least the portion of the window system used as the as the at least the portion of the personal computing unit.

27. The method of claim 22, wherein the at least a portion of the window system comprises circuitry and/or memory, of one or more controllers configured to control the tintable window.

28. The method of claim 22, wherein the at least a portion of the window system comprises a touch sensitive interface operatively coupled to the display.

29. The method of claim 22, wherein re-allocating the at least the portion of the window system comprises re-allocating physical memories and/or storage devices as the at least a portion of the personal computing unit.

30. The method of claim 22, wherein re-allocating the at least the portion of the window system comprises re allocating processors as the at least the portion of the personal computing unit.

31. The method of claim 22, further comprising temporarily providing an operating system for running on the personal computing unit.

32. The method of claim 22, further comprising providing the personal computing unit with access to one or more software applications.

33. The method of claim 22, further comprising providing the personal computing unit with access to one or more internet sites.

34. The method of claim 22, wherein the method comprises re-allocating the at least the portion of the window system as the at least the portion of the personal computing unit made available to a user for personal computing.

35. The method of claim 34 wherein re-allocation of the at least the portion of the window system as the personal computing unit is on a temporary basis.

36. The method of claim 22, wherein the window system comprises a display associated with a tintable window of the window system, which association of the display with the tintable window includes (i) the display being disposed fully or partially coextensively with the tintable window and/or (ii) the display and the tintable window being configured to have a symbiotic relationship.

37. The method of claim 36, wherein the display is a transparent display.

38. The method of claim 36, wherein the window system comprises a display associated with a tintable window of the window system, which association of the display with the tintable window includes (i) the display being disposed fully or partially coextensive with the tintable window and (ii) the display and the tintable window being configured to have a symbiotic relationship.

39. The method of claim 36, wherein the window system comprises a display associated with a tintable window of the window system, which association of the display with the tintable window includes the display being disposed fully or partially coextensive with the tintable window.

40. The method of claim 36, wherein the window system comprises the display associated with the tintable window, which association of the display with the tintable window includes the display and the tintable window being configured to have a symbiotic relationship.

41. The method of claim 40, wherein the symbiotic relationship comprises considering status of the tintable window and the display during their operation.

42. The method of claim 41, wherein considering status of the tintable window and the display during their operation includes (a) tinting the tintable window in conjunction with content displayed by the display and/or (b) using the display to augment color, hue, transmittance, and/or switching speed of the tintable window.

* * * * *